(12) United States Patent
Casares et al.

(10) Patent No.: US 8,039,813 B2
(45) Date of Patent: Oct. 18, 2011

(54) CHARGED PARTICLE-OPTICAL SYSTEMS, METHODS AND COMPONENTS

(75) Inventors: Antonio Casares, Aalen (DE); Thomas Kemen, Aalen (DE); Rainer Knippelmeyer, Aalen (DE); Thomas Bayer, Herrenberg (DE); Georg Fritz, Tuebingen (DE); Johann Greschner, Pliezhausen (DE); Samuel Kalt, Reutlingen (DE)

(73) Assignees: Carl Zeiss SMT GmbH, Oberkochen (DE); Applied Materials Israel Ltd, Rehovot (IL)

( * ) Notice: Subject to any disclaimer, the term of this patent is extended or adjusted under 35 U.S.C. 154(b) by 523 days.

(21) Appl. No.: 11/991,546

(22) PCT Filed: Sep. 6, 2006

(86) PCT No.: PCT/EP2006/008693
§ 371 (c)(1),
(2), (4) Date: Mar. 4, 2008

(87) PCT Pub. No.: WO2007/028595
PCT Pub. Date: Mar. 15, 2007

(65) Prior Publication Data
US 2009/0114818 A1  May 7, 2009

Related U.S. Application Data

(60) Provisional application No. 60/714,556, filed on Sep. 6, 2005.

(51) Int. Cl.
*G21K 5/02* (2006.01)
(52) U.S. Cl. ........... 250/396 R; 250/398; 250/400; 250/306; 250/307; 250/492.1

(58) Field of Classification Search ............ 250/396 R, 250/398, 400, 306, 307, 309, 310, 311, 492.1, 250/492.22, 492.3
See application file for complete search history.

(56) References Cited

U.S. PATENT DOCUMENTS
3,800,176 A  3/1974  Gross et al.
(Continued)

FOREIGN PATENT DOCUMENTS
EP  0 658 914 A1  6/1995
(Continued)

OTHER PUBLICATIONS

I. Brodie et al., "The physics of micronano-fabrication", Chapter 2. Particle beams: Sources, Optics, and Interactions, pp. 128 to 131; 1992, Plenum Press, NY.

(Continued)

*Primary Examiner* — Robert Kim
*Assistant Examiner* — Nicole Ippolito Rausch
(74) *Attorney, Agent, or Firm* — Bruce D. Riter

(57) ABSTRACT

The present invention relates to a particle-optical component comprising a first multi-aperture plate, and a second multi-aperture plate forming a gap between them; wherein a plurality of apertures of the first multi-aperture plate is arranged such that each aperture of the plurality of apertures of the first multi-aperture plate is aligned with a corresponding aperture of a plurality of apertures of the second multi-aperture plate; and wherein the gap has a first width at a first location and a second width at a second location and wherein the second width is by at least 5% greater than the first width. In addition, the present invention pertains to charged particle systems and arrangements comprising such components and methods of manufacturing multi aperture plates having a curved surface.

57 Claims, 17 Drawing Sheets

U.S. PATENT DOCUMENTS

| | | | |
|---|---|---|---|
| 3,924,126 | A | 12/1975 | Anderson et al. |
| 4,419,581 | A | 12/1983 | Nakagawa |
| 5,369,282 | A | 11/1994 | Arai et al. |
| 5,399,872 | A | 3/1995 | Yasuda et al. |
| 5,483,074 | A | 1/1996 | True |
| 5,578,822 | A | 11/1996 | Van der Mast et al. |
| 5,604,394 | A * | 2/1997 | Saito et al. ............... 313/422 |
| 5,808,310 | A | 9/1998 | Yamashita et al. |
| 5,892,224 | A | 4/1999 | Nakasuji |
| 6,040,576 | A | 3/2000 | Benner |
| 6,252,412 | B1 | 6/2001 | Talbot et al. |
| 6,420,714 | B1 | 7/2002 | Katsap et al. |
| 2001/0052576 | A1 | 12/2001 | Shimada et al. |
| 2002/0028399 | A1 | 3/2002 | Nakasuji et al. |
| 2002/0033344 | A1 | 3/2002 | Mabuchi et al. |
| 2002/0033449 | A1 | 3/2002 | Nakasuji et al. |
| 2002/0036264 | A1 | 3/2002 | Nakasuji et al. |
| 2002/0109090 | A1 | 8/2002 | Nakasuji et al. |
| 2002/0130262 | A1 | 9/2002 | Nakasuji et al. |
| 2002/0142496 | A1 | 10/2002 | Nakasuji et al. |
| 2002/0148961 | A1 | 10/2002 | Nakasuji et al. |
| 2002/0160311 | A1 | 10/2002 | Muraki et al. |
| 2003/0066961 | A1 | 4/2003 | Kienzle et al. |
| 2003/0132382 | A1 | 7/2003 | Sogard |
| 2003/0155509 | A1 | 8/2003 | Nakasuji et al. |
| 2003/0155534 | A1 | 8/2003 | Platzgummer et al. |
| 2004/0065827 | A1 | 4/2004 | Kienzle et al. |
| 2004/0113092 | A1 | 6/2004 | Knippelmeyer |
| 2004/0232349 | A1 | 11/2004 | Kruit |
| 2005/0087701 | A1 | 4/2005 | Lammer-Pachlinger et al. |
| 2005/0161621 | A1 | 7/2005 | Wieland et al. |
| 2005/0167608 | A1 * | 8/2005 | Cattelino et al. ............. 250/400 |
| 2005/0214958 | A1 * | 9/2005 | Nakasuji et al. ............. 438/14 |
| 2006/0102838 | A1 * | 5/2006 | Nakasuji et al. ............. 250/307 |
| 2006/0255268 | A1 * | 11/2006 | Frosien ....................... 250/310 |
| 2006/0289804 | A1 | 12/2006 | Knippelmeyer et al. |
| 2007/0029491 | A1 * | 2/2007 | Olden et al. ............. 250/370.08 |
| 2009/0212240 | A1 * | 8/2009 | Platzgummer et al. .. 250/492.22 |

FOREIGN PATENT DOCUMENTS

| | | |
|---|---|---|
| EP | 1 150 327 A1 | 10/2001 |
| EP | 1505629 A2 | 2/2005 |
| GB | 2 034 516 A1 | 6/1980 |
| WO | 2004081910 A2 | 9/2004 |
| WO | WO 2004/081910 A2 | 9/2004 |
| WO | 2005024881 A2 | 3/2005 |
| WO | WO 2005/024881 A2 | 3/2005 |
| WO | WO 2007/028596 A2 | 3/2007 |

OTHER PUBLICATIONS

A. Tuantranont et al., "Self-Aligned Assembly of Microlens Arrays with Micromirrors", SPIE Conference on Miniaturized Systems with Micro-Optics and MEMS, Santa Clara, Sep. 1999, SPIE vol. 3878, pp. 90 to 100.

M.B. Cohn et al., "Microassembly Technologies for MEMS", SPIE Conference of Micromachining and Microfabrication Process Technology IV, Santa Clara, California, Sep. 1998, SPIE vol. 3511, pp. 2 to 16.

R. Fink et al., "SMART: a planned ultrahigh-resolution spectromicroscope for BESSY II", Journal of Electron Spectroscopy and Related Phenomena 84, 1997, pp. 231 to 250.

H. Mueller et al., "A beam separator with small aberrations", Journal of Electron Microscopy 48 (3), 1999, pp. 191 to 204.

G.I. Winograd, "A Multi-Blanker for Parallel Electron Beam Lithography", Ph.D. thesis, May 2001, pp. 1 to 141.

International Search Report for PCT/EP2006/008693, dated Apr. 10, 2007.

International Preliminary Report on Patentability and Written Opinion of the International Searching Authority, dated Mar. 11, 2008.

B.J.G.M. Roelofs et al., "Feasibility of multi-beam electron lithography", Microelectronics Engineering, Elsevier Publishers B.V., vol. 2, No. 4, Dec. 1, 1984, pp. 259-279.

Communication from the European Patent Office dated Dec. 27, 2010 with European Search Report in Application No. 10012274.6-2208 / 2270833.

Communication from the European Patent Office dated Dec. 7, 2010 with European Search Report in Application No. 10012273.8-2208 / 2267751.

Communication from the European Patent Office dated Dec. 28, 2010 with European Search Report in Application No. 10012275.3-2208 / 2270834.

* cited by examiner

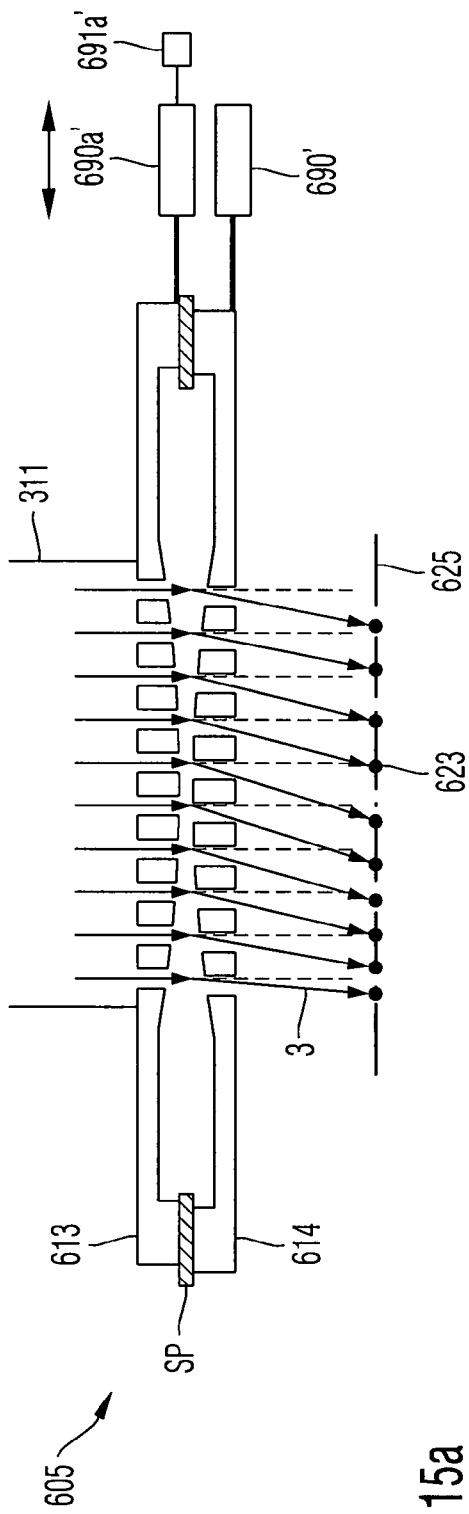
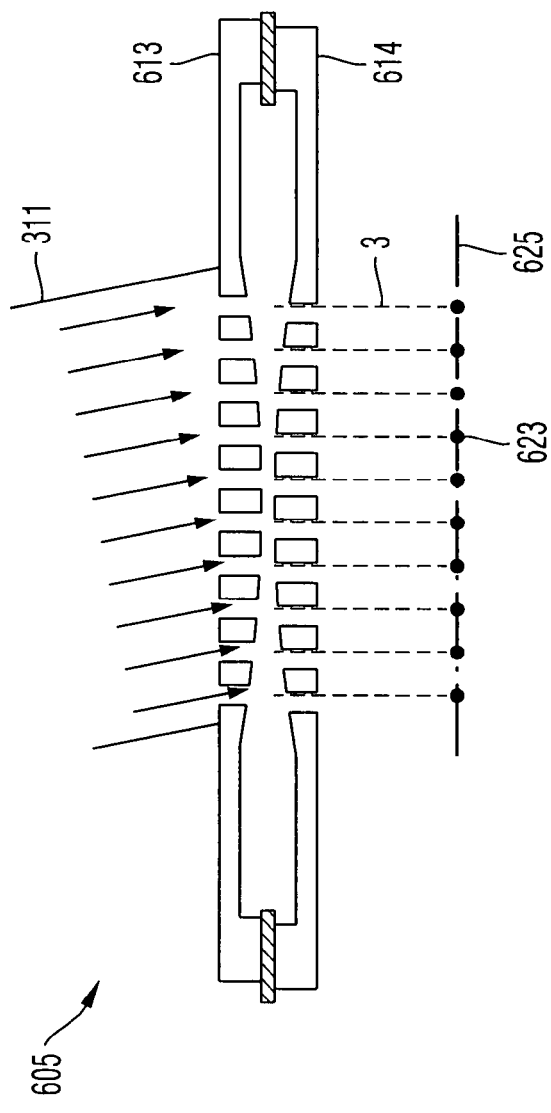
Fig. 15a
Fig. 15b

CHARGED PARTICLE-OPTICAL SYSTEMS, METHODS AND COMPONENTS

CROSS REFERENCE TO RELATED APPLICATIONS

This application is a National Stage application of International Application No. PCT/EP2006/008693, filed Sep. 6, 2006, which designates the United States and was published in English as WO 2007/028595 A2, and which claims the benefit of U.S. Provisional Application No. 60/714,556, filed Sep. 6, 2005. These applications, in their entirety, are incorporated herein by reference. U.S. Non-Provisional application Ser. No. 11/991,547, published as US 2009/0256075 A1 on Oct. 15, 2009 is a National Stage application of International Application No. PCT/EP2006/008694, published as WO 2007/028596 A1, which claims the benefit of U.S. Provisional Application No. 60/714,556, filed Sep. 6, 2005.

BACKGROUND OF THE INVENTION

1. Field of the Invention

The invention relates to particle-optical components for manipulating a plurality of beamlets and particle-optical arrangements and electron-beam inspection systems comprising such particle-optical components. Further, the invention relates to a method of manipulating charged particle beamlets, a method of focusing a plurality of charged particle beamlets and methods for manufacturing multi-aperture plates suitable for use in the particle-optical components. In addition, the invention pertains to a charged-particle multi-beamlet lithography system and a method of writing a pattern on a substrate.

The invention may be applied to charged particles of any type, such as electrons, positrons, muons, ions (charged atoms or molecules) and others.

2. Brief Description of Related Art

The increasing demand for ever smaller and more complex microstructured devices and the continuing demand for an increase of a throughput in the manufacturing and inspection processes thereof have been an incentive for the development of electron microscopy systems that use a plurality of primary electron beamlets in place of a single electron beam, thus significantly improving the throughput of such systems. However, the use of multiple beamlets brings about a whole range of new challenges to the design of electron-optical components, arrangements and inspection and processing systems such as microscopes and lithography systems. A particle-optical arrangement for forming a plurality of charged-particle beamlets wherein the beamlets are arranged in an array pattern is described in WO 2005/024881 A2 (U.S. provisional application Ser. No. 60/500,256) to the same Assignee.

In general, such particle-optical arrangements and inspection and lithography systems comprising same use a plurality of charged particle beamlets focused on a specimen to be inspected. In case of an embodiment of an inspection system using electrons as charged particles, for example, an electron source provides a single beam of primary electrons (or, alternatively, multiple beamlets from an array of particle sources), which is incident on a multi-aperture plate having a plurality of apertures formed therein for generating a plurality of beamlets from those electrons of the single beam of electrons that pass through the apertures of the multi-aperture plate. The plurality of electron beamlets is focused on the substrate generally by means of a focussing particle-optical lens downstream of the multi-aperture plate. An array of primary electron spots is thus formed on the substrate. Secondary electrons emitted as a result of impinging primary electrons follow a secondary electron beam path to a respective one of a plurality of detector pixels of a CCD electron detector, with a beam path of beamlets of the primary electrons and the beam path of the beamlets of secondary electrons being separated by means of beam separator, such as a Wien-type filter. This arrangement allows to use a single electron-optical column. Such a system is described in detail in WO 2005/024881 A2 to the same Assignee, as mentioned before.

Using such an array or pattern of beamlets of primary electrons requires the electron optical system to provide those beamlets in a reliable and accurate manner such that the beamlets show little, if any, variation in intensity, deviation from a predetermined position within the array, variation in optical properties, such as aberrations and the like. The quality of the array of beamlets and, correspondingly, the quality of the array of primary electron spots generated in an image plane will be dependent on both the properties of the multi-aperture plate used and the characteristics of other components or elements in the electron-optical arrangement. Components upstream of the multi-aperture plates will influence, amongst others, a quality of the single electron beam which will also have an impact on the beamlets generated therefrom. Components downstream of the multi-aperture plate will, amongst others, influence on how well the array of beamlets may be transferred onto the specimen to form primary electron spots. What has been described above for systems using electrons as charged particles is equally applicable to other kinds of charged particles.

Given the requirement to provide a precisely defined array of beamlets of charged particles in order to achieve a satisfactory performance of the entire system, there is a constant need to improve on a performance of such a particle-optical system.

In U.S. provisional application US 60/500,256 to the same Assignee as cited above, multi-aperture plates of different configurations are disclosed. In one aspect, multi-aperture plates having apertures that vary in size or shape depending on their position on the plate or having the apertures displaced from a respective position in a strictly regular pattern are disclosed. Those changes to aperture size/shape and position allow to correct imaging errors such as a distortion. In addition, a multi-aperture plate having a resistor-network disposed thereon is described, the resistor network being configured such that a voltage applied to the multi-aperture plate results in groups of apertures having a different potential. Since the potential applied to an aperture is related to a focusing effect provided by said aperture, the apertures can be configured to have different focussing effects such that a field curvature of the particle-optical system can be corrected.

Although good results can be achieved with the above-described multi-aperture plates, the above described approaches to correct imaging errors of the particle-optical system require multi-aperture plates having apertures that vary in at least one of shape and size and pattern, or having a resistor network, which is often associated with an increase of a complexity of the manufacturing process. In addition, the capacity for correction of imaging errors can typically not be dynamically adjusted in any suitable manner when an imaging error of a particle-optical system changes or the component would need transferring to a different system having different properties. For example, a field curvature introduced by the imaging optics may dynamically change with a change of a total beam current transmitted by the optical system due to space charge effects.

It is therefore an object of the present invention to provide particle-optical components and arrangements for manipulating beams and beamlets of charged particles that enhance an overall performance of a particle-optical system comprising said particle-optical component/arrangement.

It is a further object of the present invention to provide particle-optical components and arrangements for manipulating beams or beamlets that are configured to correct at least one imaging error of a system comprising said particle-optical component/arrangement. Preferably, the one or more imaging errors comprise in particular one or more aberrations, that are field-dependent, i.e. dependent on a position within a respective field. Examples of imaging errors are a field curvature and any other geometrical aberration, such as coma.

It is another object of the present invention to provide a particle-optical component and arrangement that is configured to correct an imaging error of the particle-optical system it is comprised in with a higher degree of flexibility.

It is also an object of the present invention to provide a particle-optical component and arrangement configured to correct an imaging error of the particle-optical system it is comprised in, wherein the extent of the correction provided may be adjusted.

It is an additional object of the present invention to provide charged particle inspection and lithography systems comprising particle-optical components and arrangements that meet any of the above objects. It is also an object to provide an improved method of writing a pattern on a substrate.

It is a further object of the present invention to provide a particle-optical component capable of providing a correction for a particle-optical aberration that is suitable for use in both electrostatic and magnetic environments.

It is a further object of the present invention to provide a method of manipulating charged particle beamlets and a method of focussing charged particle beamlets which are suited to provide particle-optical aberration correction.

Furthermore, it is an object of the present invention to provide an improved method of operating a particle-optical system and a method of manufacturing a multi-aperture plate suitable for use in the particle-optical component according to the present invention.

It is a still further object of the present invention to provide particle-optical components that allow adjusting a numerical aperture of charged particle beamlets. It is another object of the present invention to provide a particle-optical component that enables testing of a position or other properties of a multi aperture plate and/or optical properties of other optical components of a particle-optical system.

SUMMARY OF THE INVENTION

As will be described in more detail in the following, particle-optical components, particle-optical arrangements and particle optical systems are provided that are configured to provide a better quality array of beamlets of charged particles, such as primary electrons, to a specimen to be exposed/inspected. Additionally, a method for manipulating a plurality of beamlets, a method of operating a particle-optical system and a method of focussing charged particle beamlets as well as methods of manufacturing a component that is used as part of the particle-optical component according to the present invention and a method of writing a pattern on a substrate are provided by the present invention.

In addition, the particle-optical component of the present invention provides a device that allows to create and manipulate a desired geometry of an electrical or magnetic field within and/or at least in the vicinity of the device, in particular an electrical or magnetic field that is configured such as to correct for one or more imaging errors, such as aberrations.

In a first aspect, the present invention provides a particle-optical component for manipulating a plurality of beamlets of charged particles, comprising:
a first multi-aperture plate having a plurality of apertures and a second multi-aperture plate having a plurality of apertures, wherein the second multi-aperture plate is spaced apart from the first multi-aperture plate such that a gap is formed therebetween;

wherein the plurality of apertures of the first multi-aperture plate is arranged such that each aperture of the plurality of apertures of the first multi-aperture plate is aligned with a corresponding aperture of the plurality of apertures of the second multi-aperture plate;

wherein a first width of the gap at a location of a first aperture of the plurality of apertures of the first multi-aperture plate is by at least 5% greater than a second width of the gap at a location of a second aperture of the plurality of apertures of the first multi-aperture plate.

In exemplary embodiments, the first width may be at least 10% greater, or may be at least 20% greater than the second width. In further exemplary embodiments, the first width may be by at least 50%, or 100%, or 200%, or 300% or several 100% greater than the second width.

The plurality of apertures typically forms a pattern of apertures, which aperture pattern may be regular or irregular. Generally, regular aperture patterns, such as symmetric patterns are preferred. The pattern may be, for instance, a highly regular rectangular grid of apertures with a number of apertures disposed in rows and columns wherein apertures disposed adjacent to one another in a row or column are generally spaced the same distance apart, and wherein the apertures generally have the same diameter. Various examples of other suitable patterns are disclosed in WO 2005/024881 (PCT/US2004/029079) to the same Assignee.

An aperture pattern generally has a center associated therewith, which may serve as a reference point for describing properties of the pattern.

Apertures, as used herein, are perforations or through holes, i.e. they extend through the entire thickness of the plate (at the location of the aperture) and thus have openings on both a front side and a back side of the plate they are comprised in. Plate, as used herein, shall also encompass a thin foil or a plate having one or more sections that form a thin foil.

The first and second multi-aperture plates have respective pluralities of apertures formed therein having respective sizes, shapes and positions that are configured such that they can be suitably aligned or placed in registry with one another when the first and second multi-aperture plates are positioned adjacent to one another to form the gap between them. Each aperture of the plurality of apertures in the first multi-aperture plate has an aperture of the second multi-aperture plate associated therewith that it is aligned with to form a pair of associated, aligned apertures. In preferred embodiments, the apertures are aligned such that an axis extending through a centre of an aperture cross-section in the first multi-aperture plate coincides with an axis extending through a center of a cross-section of a corresponding, aligned aperture in the second multi-aperture plate, at least within a predetermined alignment precision, which may be in a range of 0.05 times a diameter of the aperture of the first multi aperture plate, for instance. In other exemplary embodiments, alignment may comprise an arrangement of the aligned apertures with respect to each other such that a charged particle beamlet passing through an aperture in the first multi aperture plate may pass through the aligned aperture in the second multi aperture plate without impinging on the second multi aperture plate. The same is valid for alignment of apertures in any further aperture plates.

In other embodiments, the apertures may be aligned such that their respective centres are slightly offset from one another. This embodiment is particularly useful for correction of a tilt of the direction of impinging beamlets/the charged particle source or the like, for instance.

In addition to providing the apertures with beam-manipulating properties, shapes of the beam-manipulating apertures may be designed such as to compensate for deviations of an electrical field generated by the multi-aperture plate from a desired electrical field. In particular, shapes of the beam-manipulating apertures may be designed such that additional shape features are added to basic shapes of the field manipulating apertures. The basic shapes are designed according to particle-optical design rules in view of providing a desired beam-manipulating effect on the beamlet passing through the aperture. For instance, the basic shape may be a circular shape for providing an effect of a round lens, or the basic shape may be an elliptical shape for providing an effect of an astigmatic lens.

The first and second widths of the gap are determined at two different locations of two different apertures in the first multi-aperture plate. Of course, the respective widths would be the same if measured at corresponding locations of the second multi-aperture plates. The width of the gap is determined at a location of an aperture, most suitably an edge of an aperture, such as a point on a periphery of a cross-section of the opening of a circular aperture on the first surface of the first multi-aperture plate. However, it is also conceivable to use a different reference point. A surface of an opening of an aperture in a plane of the first surface of the first multi-aperture plate generally will have a geometric center, which may also be used as a reference point.

In an exemplary embodiment of the present invention, the first multi-aperture plate has a plurality of apertures formed therein that are substantially identical in shape, size and relative position to respective apertures of the plurality of apertures in the second multi-aperture plate aligned therewith. In other exemplary embodiments, apertures of the first and second multi-aperture plates that are aligned with one another may have different shape and/or size and/or be arranged so as to be disposed slightly offset from one another. However, these differences should be chosen such that changes of imaging properties remain within a predetermined limit, i.e. effects on an imaging performance introduced by such an asymmetry should be kept to a minimum. The first or the second multi-aperture plates or both may comprise apertures in addition to the plurality of apertures, which have no counterpart, i.e. associated apertures in the respective other multi-aperture plate. Those additional apertures would accordingly generally be used for a purpose other than having charged particles pass through them. They may be provided to correct for so-called edge effects or the like, as described in WO 2005/024881 A2 to the same Assignee.

It has been found that a particle-optical component according to the first aspect of the present invention is particularly advantageous in correcting one or more imaging errors, such as particle-optical aberrations.

Imaging errors that the particle-optical component of the present invention is particularly suited to correct for are, for instance, a field curvature or other geometrical aberration. A variety of other imaging errors may be corrected for using the particle-optical component of the present invention, such as astigmatism, distortion and others.

The inventors of the present invention have found that use of two multi-aperture plates with a particular shape and/or orientation towards one another and having aligned apertures allows to generate an electrical or magnetic field of a particular shape in the gap between the multi-aperture plates upon application of a suitable potential to the multi-aperture plates or induction of a suitable magnetic flux in the multi-aperture plates, which electrical or magnetic field can be suitably configured to compensate for at least one imaging error.

The correcting or compensating properties of the electrical or magnetic field in the gap can be controlled, for instance, by the layout of the multi-aperture plates, in particular their shapes and symmetry, their arrangement relative to one another, the resulting width of the gap at different locations, the magnetic flux induced therein and the potential applied as well as a position of the particle-optical component within a particle-optical system.

It is to be noted that the particle-optical component of the present invention may be used as a correction device alone, or in combination with its beamlet generating and/or focussing property, depending on its position in an overall system, and the presence and form of electrical or magnetic fields upstream and downstream therefrom, etc.

It is to be noted that when no potential difference is created between the first and second multi-aperture plates or no magnetic flux induced therein, a compensating or correcting effect provided by the electrical or magnetic field, respectively, in the gap is practically switched off and the first and second multi-aperture plates may be used as a single multi-aperture plate instead, should no correction, even temporarily, be necessary.

Further more, it is possible to use one or more particle-optical components according to the present invention in a particle-optical system. If a plurality of particle-optical components is used, each particle-optical component may be configured individually so as to correct a predetermined type of imaging error, such as a predetermined type of aberration. Each particle-optical component could then be used to correct for one specific imaging error. The individual correcting effects provided by these particle-optical components would then add up and provide a total correcting effect.

In a simple exemplary embodiment, the particle-optical component may comprise two plane-parallel multi-aperture plates wherein one multi-aperture plates is tilted with respect to the other. An electrical or magnetic flux density in the gap of such an arrangement would increase steadily with decreasing width of the gap.

With the first and second multi-aperture plate being arranged to form a gap between them, the first multi-aperture plate has a first surface facing towards the second multi-aperture plate, and the second multi-aperture plate has a first surface facing towards the first multi-aperture plate.

The first surfaces of the first and second multi-aperture plates each have an area that comprises plural apertures of the respective plurality of apertures, and generally includes the first and second location (of apertures). The area may, for instance, include several, the majority or all apertures of the respective plurality of apertures.

In exemplary embodiments of the present invention, each first surface has an area comprising plural apertures of the respective plurality of apertures, wherein at least one of the first surfaces is a planar surface within the area.

Preferably, the areas of the first surfaces of the first and second multi-aperture plates correspond to each other, i.e. have corresponding, preferably the same, shape and size and encompass the same aligned apertures. In alternative exemplary embodiments, the area of the first surface of the first multi-aperture plate may have an at least partially different size and/or shape and/or position than the area of the first surface of the second multi-aperture plate.

A planar surface, as used herein, is one where slopes of tangents applied through any two neighbouring points show only gradual changes, if any, rather than large, sudden changes. For instance, the first surfaces of the first and second multi-aperture plates may be free from trenches, steps, recessions or the like. The characteristic planar refers to a scale, as seen in the direction parallel to the surface, that is in the order of more than one nanometer rather than referring to a scale which would be indicative of a level of surface smoothness, and applies to both flat and curved surfaces. A planar surface allows for good control of the electrical field generated in the gap upon application of a potential to the first and second multi-aperture plates. The same consideration applies in an analogous manner to magnetic applications. In this exemplary embodiment, the surface of the first surfaces may be planar only within the area that includes at least the locations of the apertures where the first and second width are determined, or may be planar across a larger region.

In further exemplary embodiments, the at least one first surface is a curved surface within the area. For instance, the area may comprise all apertures of the respective plurality of apertures such that all apertures are located on the curved surface. In other exemplary embodiments, the area may comprise only a portion of the plurality of apertures such that said portion of apertures is disposed on the curved surface.

For instance, the at least one first surface may be a convex surface within the area. In alternative exemplary embodiments, the at least one first surface is a concave surface within the area. For instance, the convex or concave shapes may be spherical or aspherical. Aspherical, as used herein, indicates any possible deviation from a spherical shape.

In an exemplary embodiment, the particle-optical component may comprise two plano-convex multi-aperture plates.

For example, the first surface of the first multi-aperture plate may be convex in the area whereas the first surface of the second multi-aperture plate may be concave, flat or randomly curved, resulting in an asymmetric overall arrangement of the two multi-aperture plates.

In exemplary embodiments, shapes of the first surfaces of the first and second multi-aperture plates are symmetric with respect to each other, in particular relative to a plane extending between the first and second multi-aperture plates, i.e. a plane of symmetry, at least within the area. In particular, a shape of the area of the first surface of the first multi-aperture plate may preferably be mirror-inverted with respect to the shape of the corresponding area of the first surface of the second multi-aperture plate.

In those embodiments that have an optical axis, the plane of symmetry would preferably be disposed orthogonally with respect to the optical axis.

In further exemplary embodiments, a shape of at least one of the first surfaces is symmetric relative to an axis extending transversely to the first and second multi-apertures plates, for instance an optical axis. In those embodiments, the surfaces would therefore be rotationally symmetric.

Symmetric exemplary embodiments as lined out above are particularly advantageous since imaging errors that are field-dependent generally show a radial dependency, i.e. their extent depends on a distance from a centre of a radius, with a centre of symmetry typically coinciding with an optical axis of the particle-optical component.

In preferred embodiments, both first surfaces are convex surfaces and are mirror-inverted with respect to each other. Thus, a gap is formed that has a smallest width at an apex of the convex surfaces, the width of the gap increasing with increasing distance from the apex. Most preferably, this embodiment is used in connection with an aperture pattern on both the first and second multi-aperture plates that has a center that coincides with a respective apex, and preferably also has a rotational symmetry around the center of the pattern. Preferably also, the apex and center of symmetry coincides with an optical axis. This embodiment has proven to be very advantageous for correction of a field curvature, for example.

It has been demonstrated that, from a practical point of view, use of identical first and second multi-apertures plates has substantial advantages. If a mask used in a photolithographic process for production of the multi-aperture plates, for instance, has a fault, the fault can be well compensated for if the individual multi-aperture plates resulting from the manufacturing process with the same mask being used are arranged such that a resulting fault in the first multi-aperture plate is confronted, that is aligned, with the same fault in the second multi-aperture plate, which results in substantially evening out the fault.

In exemplary embodiments of the present invention, the second width is in a range of from 100% to 1000% of a diameter of the second aperture of the plurality of apertures of the first multi-aperture plate, for instance between about 150% to about 800% or between about 200% to about 750%. In those embodiments where the second aperture does not have a circular shape, but for instance an elliptical shape or an irregular shape, an area of the aperture in a plane of the first surface is determined and a diameter is calculated therefrom by treating the area as if it was circular, for purposes of determining the width of the gap. Preferably, the second width is measured and the second aperture is located in a centre f the plurality of apertures. Preferably also, the first width is measured and the first aperture located at a periphery, preferably at a furthest distance, compared to distances of the other apertures of the plurality of apertures, from the centre of the plurality of apertures.

In further exemplary embodiments, the first width is in a range of from about 150% to about 1500% of a diameter of the first aperture, for instance between about 250% to about 1300% or between about 400% to about 1000%. If the first aperture is not circular, the method mentioned above in connection with the first aperture for deriving a diameter applies.

In further exemplary embodiments of the particle-optical component, a width w of the gap between the first and second multi-aperture plates at a location of an Nth aperture from a centre of a pattern of apertures, wherein centres of the apertures are spaced a Pitch P apart, may be described by the following relationship:

$$w = 0.08 \text{ mm} + 0.0055 \times 1/\text{mm}^2 \times (P \times |N|)^3$$

wherein

P denotes a pitch of the first multi-aperture plate in mm, i.e. a distance between centres of adjacent apertures;

N denotes a number of an aperture, with the numbering starting in the centre of the pattern of apertures and the absolute value of the numbers increasing with increasing distance from the centre, such that $(P \times |N|)$ indicates a distance of an aperture N from the centre of the pattern of apertures in mm.

In other embodiments, the constant $c = 0.08$ mm as well as constant $k = 0.055$ $1/\text{mm}^2$ may have smaller or larger values.

In preferred embodiments, a diameter of an aperture of the first multi-aperture plate is substantially equal to a diameter of a corresponding aperture of the second multi-aperture plate aligned with the aperture of the first multi-aperture plate. In further exemplary embodiments, the first multi-aperture plate has apertures formed therein that are substantially identical in at least one of shape, size and relative position to respective apertures in the second multi-aperture plate aligned therewith. These embodiments have the advantage that a beamlet exiting the apertures of the first multi-aperture plate can enter into the corresponding apertures of the second multi-aperture plate without substantial loss of charged particle intensity. Furthermore, the more symmetric the apertures of and the shapes on the first surfaces are, the easier it is to avoid any occurrence of imaging errors that my be introduced by the sequence of two aligned apertures. For instance, in a mirror-inverted symmetry of the first surfaces, a beamlet having passed through an aperture in the first multi-aperture plate is confronted with a mirror-inverted surrounding in the corresponding aperture in the second multi-aperture plate such that any influence exerted onto the beamlet by the first multi-aperture plates is practically reversed and thus nullified by the second multi-aperture plate.

In other exemplary embodiments, apertures of the first and second multi-aperture plates that are aligned with one another may have different shape or size or be disposed so as to be slightly offset from one another. However, the difference or offset should be chosen such that no inacceptably adverse effects are introduced by such an asymmetry.

The apertures of the respective plurality of apertures may all have the same diameter, or different diameters. Examples of multi-aperture plate wherein a diameter of the apertures varies across the multi-aperture plate are described in the above cited WO publication to the same Assignee. For instance, when the apertures are arranged in a pattern having a center, a diameter of the apertures formed in the multi-aperture plate may change with an increasing distance from the center of the aperture pattern. A diameter may increase or decrease with increasing distance from a center of the aperture pattern, wherein the increase or decrease may be gradual or in the form of steps or any other suitable form. The diameter of the apertures may also change from one side of the aperture plate to the other, for instance increase and then decrease, or vice versa. The diameter of the apertures may be used as a tool to compensate for imaging errors or, in addition or alternatively, to account for variations in an electron density in the charge particle beam or beamlets incident on the multi-aperture plate(s). The apertures may also have elliptical shapes. In those embodiments, a pitch of the apertures may vary, for instance with increasing distance from a center of the aperture pattern, and/or an elliptical shape may vary with respect to a direction of at least one of the axes of the corresponding ellipse.

In exemplary embodiments of the particle-optical component of the present invention, a distance between adjacent apertures of the plurality of apertures of the first multi-aperture plate, or pitch P, may be in a range of from about 5 μm to about 200 μm. Pitch refers to a distance between adjacent apertures as measured from a center of one aperture to a center of the adjacent aperture. A distance between apertures adjacent to each other in the first direction of the multi-aperture plate may be the same distance for each pair of adjacent apertures, or may be different. For instance, a distance between adjacent apertures may continuously decreases with increasing or decreasing distance from the center of the pattern of apertures.

Diameters D of apertures may be in a range of from 0.1×P to 0.5×P, a range of from 0.3×P to 0.6×P, a range of from 0.4×P to 0.7×P, a range of from 0.5×P to 0.7×P, a range of from 0.5×P to 0.6×P, a range of from 0.6×P to 0.7×P, a range of from 0.7×P to 0.8×P, and/or from 0.8×P to 0.9×P.

The apertures of the plurality of apertures may have the same shape or different shapes. A shape may be circular, for instance, or elliptical, or any other suitable shape.

At least one of the first and second multi-aperture plates may be made from silicon, for instance. Silicon offers a range of advantages in that, for instance, methods of precise processing of silicon are well established and reliable. In addition, silicon's semiconductor properties are well suited for the component of the present invention since they allow a potential suitable for the purposes of the application of the present invention to be applied.

The first or second multi-aperture plate or both may be provided with a thin film, such as a thin film of titanium, gold, platinum, or any other precious metal, preferably on a second side thereof, i.e. a side facing away from the respective other multi-aperture plate. In alternative embodiments, a homogeneous thin film of carbon may also be used on the second side of the first and/or second multi-aperture plate. In addition to the thin film, a bonding agent may be used to enhance adhesion of the thin film to the surface of the multi-aperture plate, for example a thin film of bonding agent may be used in between the plate surface and the thin metal film. As an example, Cr, W or Pt, or any suitable combination thereof, may be used as a bonding agent. These exemplary embodiments are advantageous for protecting the respective multi-aperture plate from contaminations, in particular when a potential is applied to the multi-aperture plate, and may assist in decreasing heat and/or charge accumulating on a respective surface or avoiding oxidation thereof.

The particle-optical component further comprises, in exemplary embodiments, a mounting structure for mounting the first multi-aperture plate relative to the second multi-aperture plate. In an exemplary embodiment, the mounting structure comprises a spacer arrangement that comprises one or more spacer elements that are disposed at respective edges of the multi-aperture plates. The spacer elements has dimensions suitable to fix the first and second multi-aperture plates in position whilst forming a gap of a predetermined width between them. In addition, or alternatively, the mounting structure may comprises a frame having fixing elements, with a respective fixing element holding one of the multi-aperture plates at a predetermined distance from the other multi-aperture plate held by another fixing element. It is most preferred that the first and second multi-aperture plates are mounted such that they are electrically insulated from another. In other embodiments, the multi-aperture plates may be suitably bonded together at respective peripheries thereof.

The mounting structure may, for instance, comprise at least one actuator for adjusting a position of the first multi-aperture plate relative to the second multi-aperture plate (and thus, automatically, vice versa). The position may be a horizontal or a vertical position or a rotational position, wherein an adjustment of the vertical position allows to adjust a width of the gap formed between the multi-aperture plates whereas the adjustment of the horizontal position or rotational position allows to align apertures of the first multi-aperture plate with corresponding apertures of the second multi-aperture plates.

Preferably, the alignment of the apertures of one multi-aperture plate with the corresponding apertures of the other multi-aperture plate is provided with a precision of alignment of better than about 100 nm. For instance, the precision of alignment may be in a range of from about 1000 nm to about 2 μm. It will be apparent to the person skilled in the art, that a necessary precision of alignment will strongly depend on the individual particle-optical system and particle-optical component. Likewise, it is preferred that a width of the gap between the first and second multi-aperture plates can be set at a predetermined value with a precision of about 0.5 µm, or 1 µm, for instance.

In those exemplary embodiments wherein the mounting structure provides an actuator, in particular for vertical adjustment of the multi-aperture plate(s), the actuator may be configured such that it readily allows adjustment when the operating parameters or properties of the charged optical beams or beamlets change to allow for a dynamic response to varying operating conditions or a change in environment or the like.

For example, the alignment of the multi-aperture plates relative to each other may be optically controlled by generating a Moire pattern or an interferogram from light reflected from or transmitted by components associated with the multi-aperture plates. Background information and examples of high-precision alignment are given in the articles "Self-Aligned Assembly of Microlens Arrays with Micromirrors" by A. Tuantranont et al., Part of the SPIE Conference on Miniaturized Systems with Micro-Optics and MEMS, Santa Clara, September 1999, SPIE Vol. 3878, pages 90 to 100 and "Microassembly Technologies for MEMS" by M. B. Cohn et al., Part of the SPIE Conference on Micromachining and Microfabrication Process Technology IV, Santa Clara, Calif., September 1998, SPIE Vol. 3511, pages 2 to 16, which are incorporated herein by reference.

The particle-optical component may, in exemplary embodiments, further comprise a third multi-aperture plate having a plurality of apertures formed therein and being arranged such that the first multi-aperture plate is disposed between the third multi-aperture plate and the second multi-aperture plate, and wherein the plurality of apertures of the third multi-aperture plate is arranged such that each aperture of the plurality of apertures of the third multi-aperture plate is substantially registered or aligned, respectively, with a corresponding aperture of the plurality of apertures of the first multi-aperture plate. In other exemplary embodiments, a third multi-aperture plate may be used so that the second multi-aperture plate is disposed between the first and third multi-aperture plates.

The third multi-aperture plate may advantageously be used to generate a plurality of charged particle beamlets from one or more charged particle beams incident thereon. Preferably, the plurality of apertures of the third multi-aperture plate is arranged in a pattern that corresponds at least partially to an aperture pattern of at least one of the first and second multi-aperture plates. Preferably, the first, second and third multi-aperture plates have a pattern (or subpattern) of apertures in common, i.e. the plurality of apertures is arranged in a certain aperture pattern, the apertures of which are brought in alignment with one another.

Provision of a third multi-aperture plate has the advantage that a number of charged particle beamlets may be provided such that the number of charged particles incident on the first multi-aperture plate, and in particular a second surface thereof, is decreased (as compared to a single beam of charged particles impinging upon the first multi-aperture plate) and thus heating and charging effects and damage caused by contaminations and the like minimized.

In the exemplary embodiments of the particle-optical component comprising the third multi-aperture plate, a diameter of an aperture of the third multi-aperture plate may be smaller than a diameter of a corresponding aperture of the first multi-aperture plate aligned with the aperture of the third multi-aperture plate. This may be the case for one or more, preferably for all of the plurality of apertures of the third and first multi-aperture plates that are aligned with one another. In this embodiment of the present invention, beamlets can be generated by the third multi-aperture plate that have a diameter that is smaller than a diameter/diameters of corresponding, aligned apertures in the first multi-aperture plate, preferably also than a diameter/diameters of corresponding aligned apertures of the second multi-aperture plate such that losses due to electrons impinging onto a surface adjacent to an aperture in the first and/or second multi-aperture plates and resulting heating effects, contaminations etc. can be substantially avoided or at least minimized. This embodiment of the present invention also allows changing a numerical aperture of the charged particle beamlets. For instance, a third multi aperture plate having apertures with diameters of a first size generates charged particle beamlets having a first numerical aperture and a third multi aperture plate having apertures with a second size which is smaller than the first size generates charged particle beamlets with second numerical apertures which are smaller than the first numerical apertures. In the above described exemplary embodiments, a diameter of an aperture of the third multi-aperture plate is preferably less than from about 100% to about 50%, for instance from about 99% to about 50%, or from about 99% to about 75% of a diameter of a corresponding aperture of the first multi-aperture plate aligned with the aperture of the third multi-aperture plate. If apertures of the plurality of apertures in the first (and/or second) multi-aperture plates vary in size, corresponding aligned apertures in the third multi-aperture plate may, for instance, have a size that is smaller by a predetermined percentage of the individual aperture or by a constant amount for all apertures (relative to the size of the aligned aperture in the first multi-aperture plate).

Above described embodiments of the first and second multi-aperture plates with respect to size, shape, arrangement and variations in connection with the apertures and arrays thereof equally apply to the third multi-aperture plate.

In exemplary embodiments, the third multi-aperture plate is disposed at a distance in a range of from about 0 to about a few millimeters from the second surface of the first multi-aperture plate.

The third multi-aperture plate may be spaced further apart from the first multi-aperture plate than the second multi-aperture plate, for instance a distance between the first multi-aperture plate and the third multi-aperture plate may be at least twice the first width, or three to five times the first width in the embodiments where the first multi-aperture plate is disposed between the third and second multi-aperture plate. In those embodiments where the second multi-aperture plate is disposed between the first and the third multi-aperture plate, the above considerations apply with the second multi-aperture plate taking the place of the first multi-aperture plate and vice versa.

Those exemplary embodiments that comprise the third multi-aperture plate preferably further comprise a mounting structure for mounting the third multi-aperture plate relative to the first multi-aperture plate, wherein the mounting structure preferably comprises at least one actuator for adjusting a position of the third multi-aperture plate relative to the first multi-aperture plate.

In exemplary embodiments, the third multi-aperture plate may comprise a number of different aperture arrays, which may comprise a plurality of apertures each. For instance, the third multi-aperture plate may have two arrays of apertures wherein the apertures of one array have smaller diameters than corresponding apertures of the other array. A range of aperture arrays having different properties in terms of aperture size, shape, arrangement (e.g. pitch, position), number and the like and, accordingly, different particle-optical properties, such as transmission properties, may be incorporated into one multi-aperture plate. Using a suitable mounting device, the third multi-aperture plate may then be moved such that, in accordance with specific requirements or a change of particle-optical parameters in the particle-optical system, a different aperture array may be used for a particular application, i.e. is disposed in the path of the one or more beams of charged particles which are subsequently directed onto the first and second multi-aperture plates. This allows, for instance, to change a transmission of the third multi-aperture plate which may be used advantageously with respect to an occurring Coulomb effect. In addition, in order to compensate for a distortion effect, the third multi-aperture plate may be shifted so that the respective plurality of apertures thereof are disposed to be slightly offset with respect to corresponding apertures in the first and second multi-aperture plates.

In exemplary embodiments, the third multi-aperture plate is connected to a temperature controlling device for maintaining the third multi-aperture plate at a desired temperature, for instance a heating device for heating the third multi-aperture plate to a desired temperature. Controlling the temperature of the multi-aperture plates to a certain precision, such as 1° C., is helpful in maintaining the accurate alignment of the multi-aperture plates relative to each other. Further, heating of the multi-aperture plates may help to reduce contamination thereof.

In addition or alternatively to the above described embodiments, exemplary embodiments of the particle-optical component may further comprise a fourth aperture plate having at least one aperture, the first multi-aperture plate being disposed between the fourth aperture plate and the second multi-aperture plate, and may further comprise a mounting structure comprising at least one actuator for displacing the fourth aperture plate relative to the first multi-aperture plate such that in a first position, one aperture of the at least one aperture of the fourth aperture plate is in alignment with a first aperture of the first multi-aperture plate, and in a second position, which second position is different from the first position, the one aperture is in alignment with a second aperture of the first multi-aperture plate, which second aperture is different from the first aperture.

In exemplary embodiments, the mounting structure of the fourth aperture plate is configured such that the fourth aperture plate may be displaced in a horizontal direction or may be rotated about an axis so as to bring the at least one aperture of the fourth aperture plate in alignment with different apertures of the first multi-aperture plate. The fourth aperture plate may also be displaceable in a vertical direction or be tiltable or the like. The fourth aperture plate has at least one aperture, and may have, for instance, two or more apertures. In exemplary embodiments, the fourth aperture plate may have a pattern of apertures which pattern may correspond to at least a portion of a pattern of the plurality of apertures of at least the first multi-aperture plate. For instance, the fourth aperture plate may have a pattern of three apertures which corresponds to a portion of a pattern of apertures in the first multi-aperture plate, i.e. is a sub-pattern of the pattern of the apertures of the first multi-aperture plate, such that apertures of the sub-pattern of the fourth aperture plate and the corresponding apertures of the pattern in the first multi-aperture plate can be brought in alignment with one another in a direction of a path of the one or more beams of particles.

The at least one aperture may have a diameter which is smaller than a diameter of an aperture, such as the first aperture, of the plurality of apertures of at least one of the first and second, and, if provided, third multi-aperture plates. For instance, a diameter of at least one of the at least one aperture of the fourth aperture plate has a smaller diameter than an average diameter of apertures of the plurality of apertures, or than a smallest diameter of apertures of the plurality of apertures. The fourth aperture plate may also comprise at least one of apertures of different diameters and different patterns or sub-patterns of apertures having the same or different apertures within a (sub-)pattern.

If both a third multi-aperture plate and a fourth aperture plate are provided, the fourth aperture plate may, for instance, be disposed such that the third multi-aperture plate is disposed between the fourth aperture plate and the first and second multi-aperture. In other exemplary embodiments, the third aperture plate and the fourth aperture plate may be disposed on one plate or combined to form only one plate having the characteristics of both the third and fourth aperture plate, wherein in this embodiment, preferably a mounting structure including at least one actuator is provided for positioning either the section of the one plate that holds the third or the section that holds the fourth aperture plate into the beam path of the one or more beams of charged particles.

Embodiments of the present invention comprising the fourth multi-aperture plate may be used advantageously for testing an alignment of the first and second multi-aperture plates or for testing properties of individual apertures of the first or second multi-aperture plate, for example, i.e. the fourth aperture plate may be used as a testing aperture plate. In addition, the fourth aperture plate may be used for testing optical properties of other components of a particle-optical system.

Accordingly, in a second aspect, the present invention provides a method of operating a particle-optical system, comprising:

positioning a testing aperture plate having at least one aperture in a first position relative to a multi-aperture component comprising a plurality of apertures such that in the first position, a first set of apertures of the testing aperture plate is in alignment with a first set of apertures of the multi-aperture, with the respective sets of apertures comprising at least one aperture each, transmitting a set of beamlets of charged particles through the first set of apertures of the testing aperture plate and the first set of apertures of the multi-aperture component aligned therewith, determining at least one of positions, shapes and dimensions of the transmitted beamlets in a predetermined plane and a total intensity or individual intensities of the transmitted beamlets, positioning the testing aperture plate in a second position relative to the multi-aperture component such that the first set of apertures of the testing aperture plate is in alignment with a second set of apertures of the multi-aperture component, transmitting a set of beamlets of charged particles through the first set of apertures of the testing aperture plate and the second set of apertures of the multi-aperture component aligned therewith, determining at least one of positions, shapes and dimensions of the transmitted beamlets in the predetermined plane and a total intensity or individual intensities of the transmitted beamlets.

The respective sets of apertures comprise at least one aperture each. Likewise, a set of beamlets comprises at least one beamlet. In preferred embodiments, the number of beamlets in the set of beamlets corresponds to the number of apertures in the respective set of apertures, i.e. only one beamlet is transmitted through one aperture at a time. In other embodiments, it is also conceivable that more than one beamlet may be transmitted through an aperture.

In exemplary embodiments, the testing aperture plate may be the fourth aperture plate as described above, for instance also in combination with the third multi-aperture plate, as lined out above. Embodiments described in connection with the first, second, third and fourth multi-aperture plates, for instance with regard to pattern, shape and dimension of apertures are generally also applicable to the testing aperture plate.

Determination of position, shape, dimension and intensity of one or more transmitted beamlets may be carried out by conventional methods, such as by placing a suitable detector in the predetermined plane. The predetermined plane may be, for instance, a plane vertical to an optical axis of the particle-optical system.

The multi-aperture component may be a single multi-aperture plate, a plurality of multi-aperture plates aligned with one another or, most preferably, a particle-optical component according to the present invention.

Transmitting a set of beamlets of charged particles through the first set of apertures of the testing aperture plate may comprise directing one or more beams or a set of beamlets of charged particles onto the first set of apertures of the testing aperture plate such that a set of beamlets of charged particles is formed by the set of apertures and transmitted therethrough.

In further exemplary embodiments, the method further comprises adjusting at least one of an optical property and a position of the multi-aperture component based on the at least one of positions, shapes and dimensions of the transmitted beamlets in the predetermined plane and the total intensity of individual intensities of the transmitted beamlets.

For instance, adjusting at least one optical property or position of the multi-aperture component may comprise changing a position of the multi-aperture plate in a particle-optical system, changing characteristics of one or more apertures of the multi-aperture component, adjusting a position of a first relative to a second multi-aperture plate in the particle-optical component according to the present invention, such as by rotating, tilting or shifting one multi-aperture plate relative to the other, and the like. Furthermore, in other exemplary embodiments, the method comprises adjusting at last one optical property of the particle-optical system based on the at least one of positions, shapes and dimensions of the transmitted beamlets in the predetermined plane and the total intensity of individual intensities of the transmitted beamlets, for instance by adjusting at least one of a parameter and a position and thus optical properties of other particle-optical components of the particle-optical system, such as an excitation of a deflector of the particle-optical system, by adjusting an excitation of a stigmator comprised in such a system, or by adjusting one or more other optical properties of one or more other components of the charged particle optical system, as will be apparent to those skilled in the art. In those embodiments where the multi-aperture component comprises a multi-aperture plate wherein each of a plurality of apertures has a deflecting arrangement connected thereto, deflecting arrangement for deflecting transmitted beamlets of charged particles. Deflecting arrangements, which are generally also referred to as blanking arrays are described, for instance, in U.S. Pat. No. 5,369,282 and U.S. Pat. No. 5,399,872, the entire contents of which are incorporated by reference herein. The testing may be achieved, for instance, by bringing the same aperture of the testing aperture plate sequentially in alignment with different individual apertures and associated deflecting arrangements to be tested, and transmitting particles there through and detecting at least one of an intensity and position of the transmitted beamlet of charged particles.

A deviation of detected position or detected intensity or both from a predetermined position or intensity may give an indication of an error or misalignment or the like of the tested aperture/deflecting arrangement, as will be readily apparent to the person skilled in the art.

In other exemplary embodiments, the particle-optical component may comprise a fifth aperture plate having a single aperture of a diameter configured such that only a predetermined number of apertures of the plurality of apertures of the first and/or third multi-aperture plate is irradiated with charged particles of a charged particle beam or charged particle beamlets passing through the fifth aperture plate, for instance the number may comprise half of the apertures of the plurality of apertures or any other fraction thereof. By a suitable choice of the diameter of the single aperture, a transmission of charged particle and a charged particle intensity impinging onto the first multi-aperture plate can be suitably controlled.

In a third aspect, the present invention provides a particle-optical arrangement, comprising a charged particle source for generating at least one beam of charged particles; and at least one particle-optical component as described above and arranged such that the second multi-aperture plate is disposed in a beam path of the charged particles downstream of the first multi-aperture plate. Unless otherwise indicated, in the embodiments described herein, the second multi-aperture plate is disposed downstream of the first multi-aperture plate for ease of reference.

The charged particle source may be any conventional particle source suitable for use in the present invention. In those embodiments where the charged particles are electrons, the charged particle source would be a an electron source, such as an electron source of a thermal field emission (TFE) type. In those embodiments where ions are used as charged particles, an ion gun would be a suitable charged particle source, for instance. Charged particle sources suitable for use in the present invention are well known in the art and include sources employing a tungsten (W) filament, $LaB_6$ sources and various others. It is to be noted further that the charged particle source may be a source of a single beam of charged particles, may be an array of sources of a single charged particle beam each, or a multi-beam source.

Exemplary embodiments of the particle-optical arrangement according to the present invention further comprise a voltage supply system configured to apply different electric potentials to the first and second multi-aperture plates.

The voltage supply may be any suitable voltage supply known in the art. The voltage supply may be configured to supply voltages in the range of 0 to several 100 kV. Preferably, the voltage supply is an adjustable voltage supply. Adjustment of the potential applied to the multi-aperture plates, in particular the potential difference between the potential applied of the first multi-aperture plate and the potential applied to the second multi-aperture plate, allows to adjust a focussing and/or correcting effect of the particle-optical component of the present invention.

Exemplary embodiments of the particle-optical arrangement according to the invention further comprise a controller having a first control portion configured to control the voltage supply system based upon a total beam current of a plurality of charged particle beamlets downstream of the particle-optical component. The charged particles may be primary charged particles, i.e. charged particles as generated by the charged particle source, or in embodiments where the particle-optical arrangement is part of an inspection system wherein primary particles are directed onto a specimen for inspection thereof, a current of secondary particles being emitted from the specimen being inspected may be used as a measure for the total beam current. In view of the transmission characteristics of particle-optical components in a system generally being known, an output signal of a charged particle source may also be used as a measure for the total beam current of the plurality of charged particle beamlets. Other methods of determining a total beam current directly or indirectly, such as measuring a charge building up on an particle-optical component in a system or the like, are also conceivable.

In further exemplary embodiments, the particle-optical arrangement additionally comprises a current detector for detecting the total beam current of the plurality of charged particle beamlets. The controller may also have a second control portion for adjusting beam currents of the plurality of charged particle beamlets, wherein the first control portion is responsive to a setting of the second control portion. This embodiment is particularly useful in those embodiments where at least one aperture of the first or second multi-aperture plates comprises a deflection arrangement for deflecting a charged particle beamlet being transmitted through the respective aperture. In those embodiments, the second control portion may control the deflecting arrangement, in particular a deflecting/non-deflecting position associated with the at least one respective aperture such that beam currents of beamlets passing therethrough may be controlled, and transmit a signal indicating the setting of the second control portion to the first control portion which adjusts the voltage supply in response thereto. This allows to adjust a correcting/compensating property of the particle-optical component to be adjusted to a beam current which takes into account an influence of a density of charged particles and resulting charge repulsion on those particle-optical aberrations to be compensated by the particle-optical component.

The particle-optical arrangement of the present invention may further, in addition or alternatively to the exemplary embodiments described above, comprise in another exemplary embodiment a first electrode disposed in the beam path of the charged particles upstream of the first multi-aperture plate, a second electrode disposed in the beam path of the charged particles downstream of the second multi-aperture plate, and a voltage supply system configured to apply different electric potentials to the first and second multi-aperture plates and the first and second electrodes. The arrangement of electrodes with respect to multi-aperture plates as outlined above and as further described below refers to embodiments of the present invention where the first multi-aperture plate is disposed upstream of the second multi-aperture plate, in the embodiments of the present invention where the arrangement of the multi-aperture plates is the other way round, analogous considerations apply.

In those exemplary embodiments of the particle-optical arrangement of the present invention comprising the first and second electrodes, the voltage supply system may be configured to apply voltages to the first electrode and the first multi-aperture plate such that an electrical field generated upstream of the first multi-aperture plate in a vicinity thereof is a decelerating field for the charged particles of the beam of charged particles. Alternatively, the voltage supply system may be configured to apply voltages to the first electrode and the first multi-aperture plate such that an electrical field generated upstream of the first multi-aperture plate in a vicinity thereof is an accelerating field for the charged particles of the beam of charged particles.

Alternatively or in addition thereto, in exemplary embodiments of the particle-optical arrangement according to the present invention, the voltage supply system is configured to apply voltages to the second electrode and the second multi-aperture plate such that an electrical field generated downstream of the second multi-aperture plate in a vicinity thereof is an accelerating field for the charged particles of the beam of charged particles. Alternatively, the voltage supply system may be configured to apply voltages to the second electrode and the second multi-aperture plate such that an electrical field generated downstream of the second multi-aperture plate in a vicinity thereof is a decelerating field for the charged particles of the beam of charged particles.

Potentials can be applied to at least one of the first multi-aperture plate, the second multi-aperture plate, the first, second and third electrode in various different manners. Suitable choice of applied potentials and thus electrical fields upstream and downstream and within the particle-optical component of the present invention allows, for instance, a variety of different modes of providing, for instance, a focussing effect and/or a correcting effect for the beamlets that are to be incident on the substrate. In one exemplary embodiment, for instance, the potentials may be chosen such that an electrical field providing a major part of a focussing effect is located upstream of the component of the present invention and an electrical field providing a major part of a correcting effect situated downstream of the component, or vice versa. The potentials may also be suitably chosen such that a region upstream or downstream in the vicinity of the component is substantially devoid of any electrical field, for instance. Exemplary embodiments of a variety of such modes will be described in more detail with reference to the drawings.

In further exemplary embodiments, the particle-optical further comprises, in addition to the first and second electrode, a third electrode disposed in the beam path of the charged particles between the first electrode and the first multi-aperture plate, wherein the voltage supply system is further configured to apply an electric potential to the third electrode.

In further exemplary embodiments, the particle-optical further comprises, in addition to the first and second electrodes, a fourth electrode disposed in the beam path of the charged particles between the second multi-aperture plate and the second electrode, wherein the voltage supply system is further configured to apply an electric potential to the fourth electrode.

The first to fourth electrodes may be single-aperture electrodes, for instance.

In further exemplary embodiments, the voltage supply may be configured to apply voltages to one or more of the first, second, third and fourth electrodes such that an electrical field upstream of the particle-optical component is a substantially homogeneous electrical field in the vicinity thereof and that an electrical field downstream of the particle-optical component is a substantially homogeneous electrical field in the vicinity thereof and has a field strength different from a field strength of the electrical field upstream of the particle-optical component.

The arrangement of the present invention may, for instance, further comprise at least one focussing particle-optical lens disposed in the beam path of the charged particle beam. In this embodiments of the present invention, the arrangement preferably further comprises a voltage supply system configured to apply different electric potentials to the first and second multi-aperture plates, for compensating at least one of a field curvature and a spherical aberration of the at least one focussing particle-optical lens. The at least one focussing particle-optical lens may be disposed upstream or downstream of the component of the present invention.

In those embodiments of the present invention comprising at least one focussing particle-optical lens, the voltage supply system is preferably configured to apply electric potentials to the first and second electrodes such that beamlets traversing the first and second multi-aperture plates each form a focus in a focusing region downstream of the second multi-aperture plate; further comprising at least one focussing particle-optical lens disposed downstream of the second multi-aperture plate in the beam path of the charged particles; wherein the voltage supply system is further configured to apply different electric potentials to the first and second multi-aperture plates, for compensating at least one particle-optical aberration of the at least one focussing particle-optical lens. Compensating the at least one particle-optical aberration may comprise compensating at least one of a field curvature or a spherical aberration of the at least one focussing particle-optical lens.

In a fourth aspect, the present invention provides a multi-beam electron inspection system comprising the particle optical component according to the present invention.

In exemplary embodiments of the multi-beam electron inspection system, the particle-optical component is disposed in a primary electron beam path of the system.

In a fifth aspect, a multi-beam electron inspection system is provided by the present invention, which multi-beam electron inspection system comprises:
an electron source for generating at least one beam of primary electrons; a stage for a specimen to be inspected;
a particle-optical component according to the present invention disposed in a beam path of the at least one beam of electrons downstream of the electron source; a voltage supply system for applying electric potentials to the first and second multi-aperture plates of the particle-optical component; at least one focussing particle-optical lens disposed in the beam path of the at least one electron beam downstream of the particle-optical arrangement; and a detector arrangement for detecting at least one of secondary particles and radiation emitted by the specimen as a result of being exposed to the electrons.

The exemplary embodiments, considerations and features described in connection with the individual particle-optical component and arrangements according to the present invention are, of course, equally applicable to the component or arrangement when used in a system or a method as described herein.

In a sixth aspect, the present invention provides a method of manipulating charged particle beamlets, comprising generating at least one of a charged-particle beam and a plurality of charged-particle beamlets; transmitting the at least one of the charged-particle beam and the plurality of charged-particle beamlets through a particle-optical component according to the present invention, applying a predetermined electric potential to the first and second multi-aperture plates each; and transmitting the at least one of the charged-particle beam and the plurality of charged-particle beamlets through the at least one focussing particle-optical lens.

Applying a predetermined electrical potentials to the first and second multi-aperture plates preferably involves applying a first electrical potential to the first multi-aperture plate and a second electrical potential to the second multi-aperture plate, with the first and second potentials being different. Applying an electrical potential, as used herein, is also meant to encompass those embodiments where the respective multi-aperture plate or electrode is grounded.

The at least one focussing particle-optical lens may be disposed upstream or downstream of the component according to the present invention, hence the charged particles, such as electrons, may pass through the lens before passing through the component of the present invention, or vice versa. Typically, however, the at least one lens will be disposed downstream of the component of the present invention.

In exemplary embodiments of the present invention, the component of the present invention may be used to provide both a correcting and a focussing effect or a correcting effect alone with only a very small focussing effect.

In those embodiments of the present invention wherein an additional first or second or third electrode or a third multi-aperture plate or any combination thereof are provided, the method further comprises applying a suitable potential to the respective one or ones of those electrodes and multi-aperture plates. The choice where electrodes are disposed and the choice of applied potentials allows various variants and combinations of focussing, defocusing or no electrical fields upstream and downstream of the component of the present invention such that a main focussing effect may be provided by an electrical field upstream or downstream of the component of the present invention or a combination thereof.

In the above method, the predetermined voltage or potential applied to at least one of the first and second multi-aperture plate may be, for instance, in a range of from 0 to 5000 V.

In further exemplary embodiments of the method of the present invention, the applied predetermined voltage is chosen such that at least one particle-optical aberration is compensated for, for instance a field curvature or a spherical aberration of the at least one focussing particle-optical lens may be compensated for.

In practice, the at least one focusing lens, alone or in combination with other components of a particle-optical system, generally contributes to a field curvature of the particle-optical system such that foci of beamlets, which foci are located in a flat plane of foci, are imaged into a curved plane close to a specimen surface. Therefore, the resulting curved image plane fails to coincide with the flat surface of the specimen, and the foci of the beamlets cannot be perfectly imaged onto the surface of the specimen.

The component of the present invention may be advantageously used to correct such a field curvature. In those embodiments where the at least one focusing lens is disposed downstream of the component of the present invention, the component can be suitably configured in terms of its design (shape of the first surfaces, width of the gap etc.) and a potential difference applied thereto, that the plane or region where the foci of the charged particle beamlets are generated (focus plane or region) is a curved focus region. The curvature of this curved focus region can be adjusted such that the at least one focusing particle-optical lens images the curved plane into a flat image plane such that it is possible to position a planar surface of the specimen to coincide with the flat image plane.

In electrostatic applications, in general, a focusing effect, more precisely a focal length f provided by each aperture of a single multi-aperture plate may be estimated according to the formula $$f = \frac{4}{q} \frac{E_{kin}}{\Delta E},$$

wherein
$E_{kin}$ is a kinetic energy of charged particles at the multi-aperture plate;
q is the charge of the charged particle and ΔE represents a difference in electric field strengths ($E_2-E_1$) of electrical fields provided upstream and downstream of the multi-aperture plate.

In a particle-optical component according to the present invention, the first or second multi-aperture plate, respectively, may be regarded as a multi-aperture arrangement (MAA) which may provide the main focus whereas the combination of the first and second multi-aperture plate, and, in particular, the electrical field generated in the gap between them may be regarded as an immersion MLA (multi-lens arrangement) having a weak focusing effect.

Taking the above into account, a combined focusing power would comprise a term $$\frac{1}{f_{MAA}} = \frac{q \cdot \Delta E}{4 E_{kin}}$$

for the focusing power of the MAA (multi-aperture array)-equivalent of the particle-optical component, and a term $$\frac{1}{f_{MLA}} = \frac{3 \cdot q^2}{16 w} \left(\frac{\Delta U}{E_{kin}}\right)^2$$

for the focusing power of the MLA-equivalent, wherein
ΔU is the difference of the potential applied to the first multi-aperture plate ($U_1$) and electrical potential applied to the second multi-aperture plate ($U_2$); and
w is a width of the gap between locations at respective apertures in the first and the second multi-aperture plates.

In combination, the terms would add to $$\frac{1}{f_\Sigma} = \frac{1}{f_{MAA}} + \frac{1}{f_{MLA}} \approx \frac{q \cdot \Delta E}{4 E_{kin}} + \frac{3 \cdot q^2}{16 w} \left(\frac{\Delta U}{E_{kin}}\right)^2$$

which provides an estimate of the combined focus effect.

Given that the width w varies across the gap in between the first and second multi-aperture plates in the particle-optical component of the present invention, it becomes clear that the relatively small focusing effect provided by the electrical field in the gap between the first and second multi-aperture plates varies in dependence of the width and is therefore different for apertures at locations of different gap widths, thus allowing to shape a focus region of the beamlets such that a particle-optical aberration can be compensated for.

In a seventh aspect, the present invention provides a method of focusing a plurality of charged particle beamlets, the method comprising:
transmitting at least one of a charged particle beam and a plurality of charged-particle beamlets through a first multi-aperture plate and a second multi-aperture plate, each having a plurality of apertures, with centres of the first and second multi-aperture plates being spaced a distance $w_0$ apart,
applying a first electric potential $U_1$ to the first multi-aperture plate,
applying a second electric potential $U_2$ to the second multi-aperture plate, the second electric potential being different from the first electric potential;
at least one of generating an electrical field traversed by the beam path upstream of the first multi-aperture plate and an electrical field traversed by the beam path downstream of the second multi-aperture plate, such that a first field strength $E_1$ of an electrical field upstream and in the vicinity of the first multi-aperture plate differs from a second field strength $E_2$ of an electrical field downstream and in the vicinity of the second multi-aperture plate by at least about 200 V/mm, for instance at least about 500 V/mm, in other embodiments at least 750 V/mm and in further exemplary embodiments at least 1000 V/mm, wherein for charged particles having a charge q and having a kinetic energy $E_{kin}$ upon traversing the first multi-aperture plate, the following relationship is fulfilled:

$$0.0001 \leq \frac{3}{4} \cdot \frac{q}{w_0 \cdot E_{kin}} \cdot \frac{(U_1 - U_2)^2}{E_1 - E_2} \leq 0.2.$$

In other words: electrical field strengths $E_1$ and $E_2$, potentials $U_1$ and $U_2$, a distance w ($w_0$, respectively) between the first and second multi-aperture plates and kinetic energy of the charged particles are chosen such that a multi-aperture array (MAA) as provided by the second multi-aperture plate provides a main focus in a charged-particle system whereas an immersion multi lens array as provided by the combination of the first and second multi-aperture plates only provides a relatively weak focussing effect which is superimposed onto the main focussing effect of the MAA. In those preferred embodiments of the present invention where a width of the gap between the first multi-aperture plate and the second multi-aperture plate varies, a point of focus of beamlets exiting from the second multi-aperture plate varies with a width w of the gap in a location of the aligned apertures where the respective beamlet is exiting from. In exemplary embodiments, the focal length of the main focussing of the MLA may be shortened by about 5%, or 10% or 20% by the focussing effect as provided by the MAA. Preferably, a focal length of the MLA is greater than 2 m.

In particular through the choice and adjustment of electrical potentials applied to the first and second multi-aperture plates, a level of the compensating effect provided by the component can be readily adjusted such that the component is suitable for a wide range of operating conditions and system layouts.

In the method according to this aspect, the particle-optical component of the present invention may advantageously be used, and preferably a width between the first and second multi-aperture plates increases with increasing distance from the centres thereof such that a field strength of an electrical field generated by applying the first and second electrical potentials $U_1$ and $U_2$ in between the first and second multi-aperture plates decreases with increasing distance from the centre. For instance, in those embodiments, the width $w_0$ may be the first width as referred to above.

In exemplary embodiments, a suitable lower limit in the above equation may also be 0.05 or 0.08, and an upper limit may be 0.18 or 0.15, for instance.

In an eighth aspect, the present invention a particle-optical arrangement, comprising: a charged particle source for generating at least one beam of charged particles; at least one magnetic lens configured to generate a first magnetic field in a path of the at least one beam; at least a first multi-aperture plate having a plurality of apertures, wherein the at least first multi-aperture plate is disposed to be traversed by a beam path of the at least one beam of charged particles; at least one coil arrangement configured to generate a second magnetic field such that a magnetic flux density at the at least first multi-aperture plate is substantially zero. As will be readily apparent to the person skilled in the art, substantially zero is also meant to encompass those embodiments where there is a negligibly small magnetic field present in the vicinity of the at least first multi-aperture plate as long as this magnetic field does not adversely affect imaging properties of the system, such as lead to a decrease in transmission.

In exemplary embodiments, the particle-optical arrangement further comprises a second multi-aperture plate having a plurality of apertures, wherein the second multi-aperture plate is spaced apart from the first multi-aperture plate such that a gap is formed there between; wherein the plurality of apertures of the first multi-aperture plate is arranged such that each aperture of the plurality of apertures of the first multi-aperture plate is aligned with a corresponding aperture of the plurality of the apertures of the second multi-aperture plate; wherein a first width of the gap at a location of a first aperture of the plurality of apertures of the first multi-aperture plate is by at least 5% greater, for instance at least 10% or 20% greater, and in further exemplary embodiments by at least 50%, 100%, 200%, 500%, or 700% (several 100%) greater than a second width of the gap at a location of a second aperture of the plurality of apertures of the first multi-aperture plate. In addition, in those embodiments, the first multi-aperture plate has a first surface facing towards the second multi-aperture plate, and the second multi-aperture plate has a first surface facing towards the first multi-aperture plate, wherein each first surface has an area comprising plural apertures of the respective plurality of apertures, and wherein at least one of the first surfaces is planar curved surface within the area. Preferably, the first multi-aperture plate in the arrangement according to the eight aspect of the present invention is part of the charged particle-optical component of the present invention as described before or may comprise one or more features of embodiments of the charged-particle components and arrangements of the present invention.

The present invention also provides, in a ninth aspect, a method of manipulating charged particle beamlets, the method comprising:
generating at least one of a charged-particle beam and a plurality of charged-particle beamlets;
transmitting the at least one of the charged-particle beam and the plurality of charged-particle beamlets through at least one magnetic lens generating a first magnetic field;
transmitting the at least one of the charged-particle beam and the plurality of charged-particle beamlets through at least one multi-aperture plate having a plurality of apertures; and
generating a second magnetic field by applying a predetermined electric current to a coil arrangement traversed by the plurality of charged particle beamlets such that the second magnetic field at least partially compensates the first magnetic field and a magnetic flux density at the at least one multi-aperture plate is substantially zero.

Substantially eliminating a magnetic field at a location of the at least one multi-aperture plate or particle-optical component of the present invention is beneficial in that the charged particles are then not exposed to a rotational force exerted by the magnetic field and do not change their paths. Exposure to such a rotational force could, for instance, result in individual charged particles being no longer transmitted through apertures in the second multi-aperture plate. Instead, they would impinge upon spaces in between the apertures, resulting in a loss of transmission.

In a tenth aspect of the present invention, a further particle-optical arrangement is provided which comprises:
a particle-optical component according to the present invention, with embodiments thereof as described herein, a magnetic lens arrangement comprising a first pole piece and a second pole piece and a coil for inducing magnetic flow in the first and second pole pieces, wherein the first multi-aperture plate is magnetically coupled to or integrally formed with the first pole piece of the magnetic lens arrangement and the second multi-aperture plate is magnetically coupled to or integrally formed with the second pole piece of the magnetic lens arrangement.

A varying width of the gap formed in between the first and second multi-aperture plates results in a magnetic field of varying field strength across the length of the gap. For different pairs of aligned apertures of the first and second multi-aperture plates, which multi-aperture plates act as different poles of the magnetic lens, magnetic fields are different from each other such that beamlets passing though one pair of associated apertures may be subject to a stronger or weaker magnetic field than beamlets passing through a different pair of associated apertures. In those embodiments where a width of the gap increases with increasing distance from a centre, i.e. radially outwards, a magnetic flux density of magnetic fields formed in the gap decreases as the width of the gap increases. In principle, analogous considerations as for electrostatic fields also apply here.

In an eleventh aspect, the present invention also provides a charged-particle multi-beamlet lithography system for writing a pattern on a substrate, the system comprising:
a stage for mounting the substrate,
a charged-particle source for generating at least one beam of charged particles, a particle-optical component according to the present invention, and an objective lens for focussing the charged particle beamlets on the substrate.

In a twelfth aspect of the present invention, a method of writing a pattern on a substrate is provided, the method comprising:
generating at least one beam of charged particles;
transmitting the at least one charged-particle beam through a particle-optical component according to the present invention, applying a predetermined first electric potential to the first multi-aperture plate and a predetermined second electric potential different from the predetermined first potential to second multi-aperture plate;
and focussing charged-particle beamlets exiting from the particle-optical component onto the substrate.

In a thirteenth aspect, the present invention relates to a method of manufacturing a multi-aperture plate having a curved surface, comprising:
etching a pattern of holes into a substrate from a front surface of the substrate such that a depth of a hole is smaller than a thickness of the substrate,
processing a back surface of the substrate such that at least a portion of the back side of the substrate has a curved shape, and
etching the back surface of the substrate to such an extent that at least a portion of the holes etched into the substrate from the front surface thereof extend through the entire thickness of the substrate to form apertures through the substrate.

As the thickness of the substrate may vary, etching the holes through the entire thickness of the substrate refers to the thickness of the substrate at a location of the holes to be etched through to form apertures. The term hole, as used herein, implies that the hole is open to only one side, i.e. has only one opening, the opposite side of the opening being closed.

In an exemplary embodiment, the steps of etching holes from the front side of the substrate into the substrate and the step of processing the back side of the substrate to form a curved surface may be carried out in the reverse order to the one given above such that the processing of the back surface of the substrate is carried out before the etching of the pattern of holes into the substrate from the front surface of the substrate.

In a fourteenth aspect of the present invention, a further method of manufacturing a multi-aperture plate having at least an area having a curved surface is provided, the method comprising:

etching a pattern of holes into a substrate from a front surface of the substrate, processing the front surface of the substrate such that at least a portion of the front surface of the substrate has a curved shape, and at least one of processing and etching the back surface of the substrate to such an extent that at least a portion of the holes etched into the substrate extend through the entire substrate to form apertures.

The methods according to the thirteenth and fourteenth aspect preferably further comprise filling the holes at least partially with a filler before the processing of the respective surface to form a curved surface.

In a fifteenth aspect, the present invention provides a method of manufacturing a multi-aperture plate having at least an area having a curved surface, the method comprising: etching a pattern of apertures into a substrate, and processing one surface of the substrate such that the surface has a curved surface or at least an area having a curved surface, respectively.

The method according to the fifteenth aspect preferably further comprises filling the apertures of the etched pattern of apertures at least partially with a filler before the processing of the one surface of the substrate.

Preferably, the substrate is a silicon wafer.

In exemplary embodiments of the methods for manufacturing a multi-aperture plate according to the present invention, the processing step comprises removing material from the surface of the substrate by mechanical abrasion. Suitable abrasive agents are well known in the art. Depending on the amount of material to be removed and a tolerable coarseness of the process, different abrasive or polishing materials may be used, such as mixtures of glycerine and aluminium oxide particles or silicon carbide particles, or silicon oxide particles or diamond particles in suitable solutions, in the case of silicon, for instance.

Preferably, the etching step for etching the holes or apertures into the substrate comprises dry etching, preferably reactive ion etching and most preferably deep reactive ion etching.

Generally, etching holes or apertures into a substrate involves a photolithographic technique, wherein a substrate is coated with a photoresist, the coated substrate irradiated through a mask that holds a pattern to be imprinted on the photoresist, in this case the pattern of holes/apertures, and the exposed substrate developed by contacting the exposed substrate with a developing solution. In case of a positive resist, the developer solution removes exposed material, in case of a negative resist, the developer solution removes unexposed material.

In certain photolithographic procedures, the holes/apertures may be etched into the thus prepared substrate, in other procedures, the substrate is coated with a layer of material that is subsequently etched to form a mask for the subsequent etching of the actual substrate.

In an exemplary photolithographic procedure for silicon substrates, the silicon wafer is cleaned, then oxidized to form a thin film of $SiO_2$ thereon, then coated with photoresist, the photoresist exposed and then developed to uncover the $SiO_2$-layer (in a given pattern), the $SiO_2$-layer etched, for instance by reactive ion etching, so as to produce a mask for the silicon etch, remaining photoresist removed and subsequently the silicon substrate etched, for instance by deep reactive ion etching (DRIE).

Generally, in dry etching procedures a gas is excited by a high-frequency field at a low pressure. In case of an inert gas, the gas ions generated by the field are accelerated towards the substrate and remove material by way of physical interaction. In case of a reactive gas, removal of material from the substrate is based on chemical interaction, and may additionally involve physical phenomena. Dry etching techniques generally comprise plasma etching, reactive ion etching and ion beam etching.

Reactive ion etching procedures generally make use of radio frequency radiation to ionise a gas that dissociates into a reactive species, with the substrate to be etched being biased to induce ion bombardment. Suitable gases for the reactive ion etch process include compounds containing carbon (C) and halogens such as fluorine (F), chlorine (Cl) or bromine (Br). Control of process parameters such as pressure, high frequency output, gas flow, electrode and substrate temperature as well as the choice of the particular gas used allows to control a shape of a resulting etch profile.

Anisotropy/isotropy of the etch process is generally controlled by the extent to which physical and chemical processes dominate.

Deep reactive ion etching allows manufacturing of apertures or holes having a high aspect ratio, i.e. a high ratio of depth relative to width. DRIE is often also referred to as "Bosch-process" (as Bosch held the first patent for this kind of process) and involves a plasma etch process with frequent switching between polymerising and etching chemistries. Steps of coating substrate surfaces (passivation) with polymers are alternated with isotropic etch steps, wherein polymer is removed from a bottom of an etched structure. In addition to the Bosch-process, a so-called "Cryo"-process may be used wherein (DRI)etching is carried out as a single-step process at cryogenic temperatures below −100° C. Apart from high aspect ratios, DRIE allows to etch deep structures into a substrate and also allows fast etching due to a high etch rate.

In practice, it has proven to be advantageous to use multi-aperture plates that are manufactured using the same mask and that have therefore a substantially identical aperture array. This embodiment is particularly useful if small faults are present in the mask that are transferred to aperture arrays manufactured using the respective mask. In such a case, apertures that were manufactured using the same mask position can be advantageously superimposed thus eliminating any detrimental effect of the faults in the aperture array.

Furthermore, practical experience has shown that it is beneficial for the apertures to have smooth edges at least on a surface that charged particles would impinge upon, and a smooth surface at least within a first third of an aperture volume that the particles pass first when passing the respective aperture. Smooth aperture edges and smooth inner surfaces in at least a portion of the aperture volume may be achieved by suitable selection of etching parameters during the etch step. In particular, a slower etch rate is preferred for achieving a smooth surface.

In preferred embodiments of the methods for manufacturing as described above, etching the respective side of the substrate having the curved shape (generally referred to as the backside in the methods of the present invention) comprises etching of the substrate such that an equal amount of material is removed from any location on the respective side so as to substantially maintain a shape of the respective surface provided by the processing step. Thus, the curvature of the respective surface is essentially maintained. This may be achieved by wet etching or plasma etching processes, for instance, as known in the art. In other embodiments, processing the respective surface having the curved shape may be carried out such that the respective surface has a first curvature, and subsequently the same respective surface is etched such that it has a second curvature, which is a desired final curvature. In those embodiments, the etching need not occur at the same rate over the entire surface.

In preferred embodiments, the methods further comprise at least partially filling the holes or apertures with one or more filling materials, most suitably before the respective surface is further etched or processed. Accordingly, those embodiments preferably also comprise removing the one or more filling materials from the apertures, i.e. after the etching of the respective surface.

Filling materials or fillers that may be used in the above manufacturing methods include suitable polymers, adhesives and resins, for instance, such as silicon nitride.

In a sixteenth aspect, the present invention provides a method of focusing a plurality of charged particle beamlets, the method comprising: generating an electrical field of at most 5000 V/mm between a first multi-aperture plate having a plurality of apertures and a first electrode such that the first multi-aperture plate has a first focussing power F1, wherein the first electrode is spaced a distance of at least 1 mm apart from the first multi-aperture plate; transmitting at least one of a charged particle beam and a plurality of charged-particle beamlets through the electrical field, the plurality of apertures of the first multi-aperture plate and the first electrode; transmitting the at least one of the charged particle beam and the plurality of charged-particle beamlets through apertures of a particle-optical component comprising at least a second multi-aperture plate having a plurality of apertures, the particle-optical component being configured and operated so as to provide a second focussing power F2, wherein the second focussing power F2 of the particle-optical component is at least five times smaller than the first focussing power F1.

In other exemplary embodiments, the electrical field generated between the first multi-aperture plate and the first electrode may have a field strength of at most 2500 V/mm, or at most 1000 V/mm, or at most 500 V/mm. In further exemplary embodiments, the distance between the first electrode and the first multi-aperture plate is at least 5 mm, or may be at least 10 mm, or may be at least 20 mm.

The focussing power, as used herein, refers to the inverse of the focal length: $F=1/f$. Exemplary equations giving the focussing powers of multi-aperture and multi-lens arrays have been given herein before.

Preferably, the multi-aperture component in the method according to the 16th aspect is the multi-aperture component according to the present invention, with features and embodiments thereof as described above. The first electrode may be a single-aperture plate, for instance. The first electrode may be disposed between the first multi-aperture plate and the second multi-aperture plate, for example. In other embodiments, the first electrode may be disposed on a side of the first multi-aperture plate that faces away from the second multi-aperture plate.

In a seventeenth aspect, the present invention provides a particle-optical component, which comprises a first multi-aperture plate having a plurality of apertures, a fourth aperture plate having at least one aperture, and a mounting structure comprising at least one actuator for displacing the fourth aperture plate relative to the first multi-aperture plate to a first position and to a second position different from the first position.

In exemplary embodiments, in the first position, one aperture of the at least one aperture of the fourth aperture plate is in alignment with a first aperture of the first multi-aperture plate, and in the second position, the one aperture is in alignment with a second aperture of the first multi-aperture plate, with the first and second apertures being different.

In an exemplary embodiment, the particle-optical component further comprises a second multi-aperture plate having a plurality of apertures, wherein the second multi-aperture plate is spaced apart from the first multi-aperture plate such that a gap is formed between them, wherein the plurality of apertures of the first multi-aperture plate is arranged such that each aperture of the plurality of apertures of the first multi-aperture plate is aligned with a corresponding aperture of the plurality of apertures of the second multi-aperture plate, and wherein the first multi-aperture plate is disposed between the fourth aperture plate and the second multi-aperture plate.

Exemplary embodiments, advantages and features of the particle-optical component have been described above in particular in connection with the first aspect of the present invention. The fourth aperture plate may be advantageously used as a testing aperture plate for testing a position of the first aperture plate and/or optical properties of other components of a particle-optical system.

In an eighteenth aspect, the present invention provides a particle-optical component comprising a first multi-aperture plate having a plurality of apertures, and a third multi-aperture plate having a plurality of apertures, wherein the plurality of apertures of the third multi-aperture plate is arranged such that each aperture of the plurality of apertures of the third multi-aperture plate is aligned with a corresponding aperture of the plurality of apertures of the first multi-aperture plate, and wherein a diameter of an aperture of the third multi-aperture plate is smaller than a diameter of a corresponding aperture of the first multi-aperture plate aligned with the aperture of the third multi-aperture plate.

In an exemplary embodiment, the particle-optical component further comprises a second multi-aperture plate having a plurality of apertures, wherein the second multi-aperture plate is spaced apart from the first multi-aperture plate such that a gap is formed between them; wherein the plurality of apertures of the first multi-aperture plate is arranged such that each aperture of the plurality of apertures of the first multi-aperture plate is aligned with a corresponding aperture of the plurality of apertures of the second multi-aperture plate, and wherein the first multi-aperture plate is disposed between the third aperture plate and the second multi-aperture plate.

In exemplary embodiments, the diameter of the aperture of the third multi-aperture plate is 99% or less, for instance 95% or less, of the diameter of the corresponding aperture of the first multi-aperture plate aligned with the aperture of the third multi-aperture plate. Further exemplary embodiments, features and advantages have been described above in particular in connection with the particle-optical component according to the first aspect of the invention.

Alignment, as mentioned before, may comprise an arrangement of the aligned apertures with respect to each other such that a charged particle beamlet passing through an aperture in the upstream aperture plate may pass through the aligned aperture in the downstream multi aperture plate without impinging on or touching the downstream multi aperture plate.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

FIG. 12b shows a graph indicating a magnetic flux density in a z direction during operation of the arrangement as depicted in FIG. 12a;

FIG. 13b shows a graph indicating a magnetic flux density in a z direction at locations of different apertures during operation of the arrangement as depicted in FIG. 13a;

FIG. 15a illustrates a distortion effect resulting from a misalignment of the first and second multi-aperture plates of the particle-optical component according to the present invention;

FIG. 15b illustrates an illumination mode suitable for compensating a misalignment of the first and second multi-aperture plates as shown in FIG. 15a;

FIG. 16 illustrates an elevational view of an array of primary electron beamlet spots in an image plane indicative of the distortion effect as illustrated in FIG. 15a;

DETAILED DESCRIPTION OF EXEMPLARY EMBODIMENTS

Figure 1:
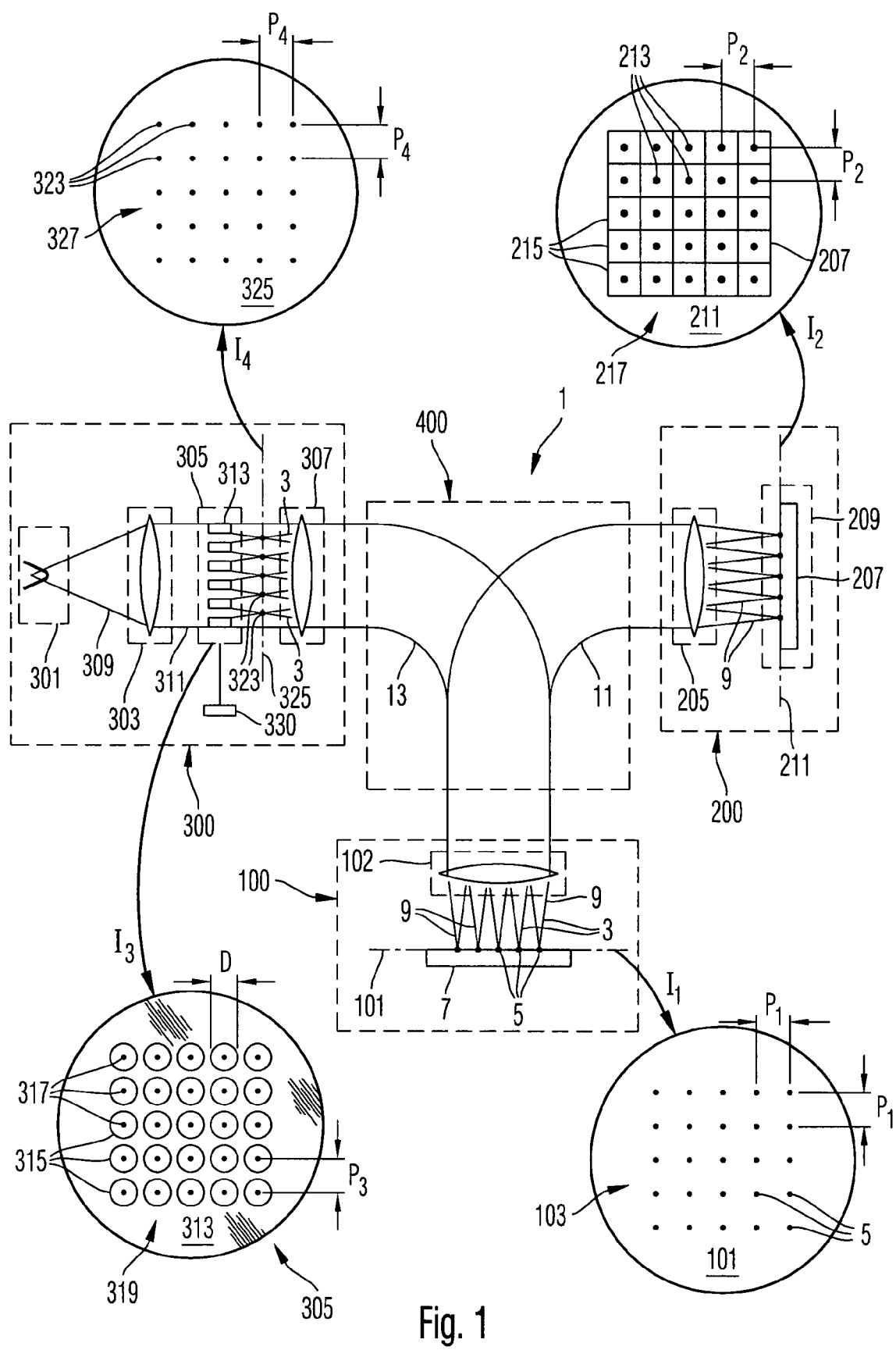
FIG. 1 schematically illustrates basic features and functions of a particle-optical inspection system according to the present invention.

FIG. 1 is a schematic diagram symbolically illustrating basic functions and features of an electron microscopy system 1 as an embodiment of a particle-optical arrangement, a particle-optical system and an electron multi-beam inspection system as well as a method of manipulating charged particle beamlets according to the present invention. The electron microscopy system 1 is of a scanning electron microscope type (SEM) using a plurality of primary electron beamlets 3 for generating primary electron beam spots 5 on a surface of a specimen 7 to be inspected which surface is arranged in an image plane 101 of an objective lens 102 of an objective arrangement 100.

Primary electron beamlets 3 are generated by a beamlet generating arrangement 300 comprising an electron source arrangement 301, a collimating lens 303, a particle-optical component 305, illustrated in a simplified form with only one of the two multi-apertures depicted, and a field lens 307.

The electron source arrangement 301 generates a diverging electron beam 309 which is collimated by collimating lens 303 to form a beam 311 for illuminating particle-optical component 305.

Insert $I_3$ of FIG. 1 shows an elevational view of the first multi-aperture plate 313 forming part of particle-optical component 305. The first multi-aperture plate 313 (and equally the second multi-aperture plate, not shown) has a plurality of apertures 315 formed therein. Centers 317 of apertures 315 are arranged in a pattern or array 319 which electron-optically corresponds to a pattern 103 of primary electron beam spots 5 formed in image plane 101.

A pitch $P_3$ of array 319 may be in a range of from about 5 μm to about 200 μm, for instance. Diameters D of apertures 315 may be in a range of from $0.1 \times P_3$ to $0.5 \times P_3$, a range of from $0.3 \times P_3$ to $0.6 \times P_3$, a range of from $0.4 \times P_3$ to $0.7 \times P_3$, a range of from $0.5 \times P_3$ to $0.7 \times P_3$, a range of from $0.5 \times P_3$ to $0.6 \times P_3$, a range of from $0.6 \times P_3$ to $0.7 \times P_3$, a range of from $0.7 \times P_3$ to $0.8 \times P_3$, and/or from $0.8 \times P_3$ to $0.9 \times P_3$, for instance.

Electrons of illuminating beam 311 pass through apertures 315 (and the corresponding aligned apertures of the second multi-aperture plate, not shown) to form primary electron beamlets 3. Electrons of illuminating beam 311 impinging on plate 313 are intercepted from a primary electron beam path 13 and do not contribute to the formation of the primary electron beamlets 3.

Figure 3:
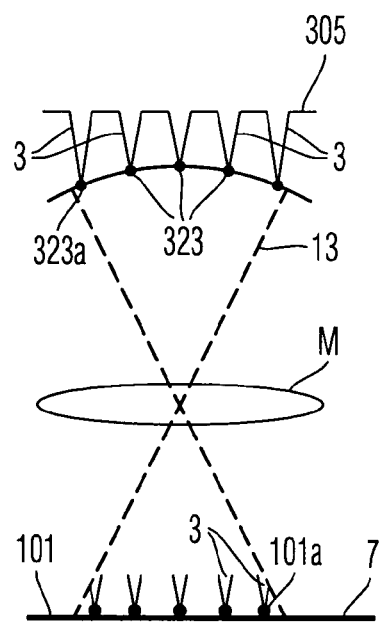
FIG. 3 illustrates a portion of an embodiment of a particle-optical component configured to compensate a field curvature as illustrated in FIG. 2.

In the embodiment depicted in FIG. 1, it is one function of the particle-optical component 305 to form the plurality of primary electron beamlets 3 from the illuminating beam 311. An additional function of the depicted particle-optical component 305 of this embodiment is to focus each primary electron beamlet 3 such that foci 323 are generated in a focus region or focus plane 325. The focus region 325 in FIG. 1 is shown as a planar surface for ease of illustration. In those embodiments of the present invention where a particle-optical aberration to be compensated for or corrected by the particle-optical component 305 is a field curvature, the focus region 325 would generally have a curved shape, as illustrated in FIG. 3. A voltage supply 330 for supplying an electrical potential to at least one of the first and second multi-aperture plates is also shown schematically in FIG. 1.

In other embodiments of the present invention, a third multi-aperture plate may be disposed upstream of the first and second multi-aperture plates in the beam path of the illuminating beam 311. In those embodiments, the third multi-aperture plate would have the function of forming the plurality of primary electron beamlets. Provided the third multi-aperture plate is suitably aligned with the first multi-aperture plate, primary electron beamlets 3 would then pass through the apertures of the first and second multi-aperture plates, which has the advantage that the first surface of the first multi-aperture plate, in particular, would not be subject to damage caused by impinging primary electrons. For instance, heating and charging effects as well as contaminations of the first multi-aperture plate, in particular, may be avoided or substantially reduced.

Insert $I_4$ of FIG. 1 shows an elevational view of focus plane 325 with foci 323 arranged in a pattern 327. A pitch $P_4$ of this pattern may be the same as or different from pitch $P_3$ of pattern 319 of the first multi-aperture plate 313 (and the second multi-aperture plate, not shown) as will be understood from the following description. A diameter of foci 323 may be in a range of from about 1 nm to about 1 μm, for instance.

Field lens 307 and objective lens 102 together perform a function of imaging focus plane or region 325 onto image plane 101 to form the array 103 of primary electron beam spots 5 having a small diameter on the specimen 7 for achieving a high resolution of secondary electron images generated by detecting intensities of secondary electron beamlets 9 by detector arrangement 209.

A beam splitter/combiner arrangement 400 is provided in the primary electron beam path 313 in between the beamlet generating arrangement 300 and objective arrangement 100 and in a secondary electron beam path 11 in between the objective arrangement 100 and the detecting arrangement 200.

Insert $I_1$ of FIG. 1 shows an elevational view on image plane 101 with a regular rectangular array 103 of primary electron beam spots 5 formed thereon. In FIG. 1, twenty-five primary electron beam spots 5 arranged in a 5×5-array 103 are shown. This relatively low number of primary electron beam spots is depicted for ease of illustration of the principles of the electron microscopy system 1. In practice, the number of primary electron beam spots may be chosen to be substantially higher, such as 30×30, 100×100 or any other number.

In the illustrated embodiment, the array 103 of primary electron beam spots 5 is a substantially regular rectangular array with a substantially constant pitch $P_1$ in a range of from about 1 μm to about 10 μm, for instance. It is, however, also possible that the array 103 may be a distorted regular array or an irregular array or an array of some other symmetry, such as a hexagonal array.

A diameter of the primary electron beam spots formed in the image plane 101 may be in a range of from about 5 nm to about 200 nm, for instance. The objective arrangement 100 focuses the primary electron beamlets 3 to form the primary electron beam spots 5.

The primary electrons incident on the specimen 7 at beam spots 5 generate secondary electrons that emanate from the surface of specimen 7. The secondary electrons form secondary electron beamlets 9 entering the objective lens 102.

The electron microscopy system 1 provides a secondary electron beam path 11 for supplying the plurality of secondary electron beamlets 9 to a detecting arrangement 200. Detecting arrangement 200 comprises a projecting lens arrangement 205 for projecting the secondary electron beamlets 9 onto a surface plane 211 of an electron sensitive detector 207 of a detector arrangement 209. The detector 207 can be one or more selected from a solid state CCD or CMOS, a scintillator arrangement, a micro channel plate, an array of PIN diodes and others.

Insert $I_2$ of FIG. 1 shows an elevational view on image plane 211 and the surface of detector 207 where secondary electron beam spots 213 are formed as an array 217. A pitch $P_2$ of array 217 may be in a range of from about 10 μm to about 200 μm, for instance. The detector 207 is a position sensitive detector having a plurality of detecting pixels 215. The pixels 215 are arranged in an array matching array 217 of the secondary electron beam spots 213 such that each pixel 215 can detect an intensity of the secondary electron beamlet 9 incident thereon.

All numerical values given for physical characteristics such as dimensions, voltages or the like in connection with the described embodiments of the present invention are for illustrative purposes only and not meant to be limiting the scope of the present invention in any way.

Electron source arrangement 301 and particle-optical component 305 together form an embodiment of a particle-optical arrangement according to the present invention.

As illustrated in FIG. 1, it is one feature of the electron microscopy system 1 that focus region 325 where foci 323 of the primary electron beamlets are generated by the particle-optical component 305 is imaged into an image plane 101 in which the surface of the specimen 7 to be inspected is positioned. Since particle-optical component 305 is capable of compensating particle-optical aberrations such as a field curvature, ideally, image plane 101 and the surface of the specimen 7 coincide.

Figure 2:
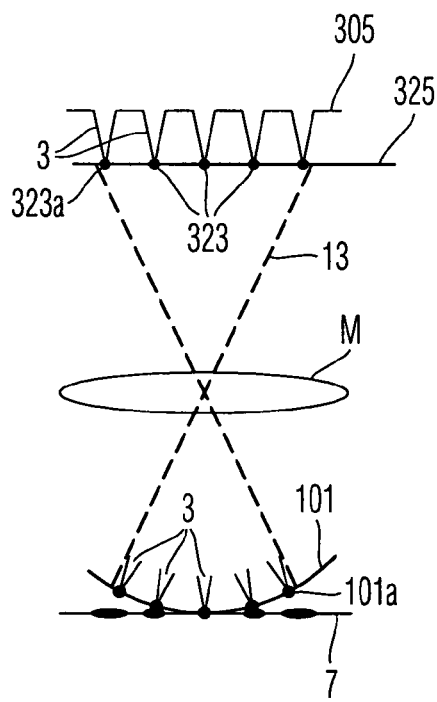
FIG. 2 illustrates an effect of a field curvature caused by particle-optical elements involved in imaging a focus plane onto a specimen.

In practice, it has been found that electron-optical elements symbolically illustrated as M in FIG. 2, typically contribute to a field curvature of an electron-optical system. This would lead to flat focus plane 325 being imaged into a curved plane 101 close to the specimen surface 7, as shown in FIG. 2. It is then not possible for the curved image plane 101 to coincide with the flat surface of specimen 7, and, consequently, the foci 323 are not perfectly imaged onto the surface of specimen 7.

FIG. 3 shows an embodiment of a particle-optical component according to the present invention, which is configured such as to provide a solution to the problem of field curvature caused by the optical elements M involved in imaging the focus region 325 onto specimen surface 7. The particle-optical component of this embodiment is designed such that the focus region 325 where the foci 323 of the primary electron beamlets 3 are generated is a curved region or plane. The curvature of the focus region is laid out such that the optical elements M image focus region 325 into a flat image plane 101. It is then possible to position the specimen's planar surface 7 so as to coincide with flat image plane 101.

In order to give an impression of an order of dimensions of such effects, as an example, a focus 323a of a primary beamlet 3 generated at a periphery of an aperture pattern formed by the plurality of apertures is imaged into a curved plane 101 close to the specimen surface such that image point 101a corresponding to focus point 323a is spaced a distance of about 12 μm from a surface of the specimen 7. The particle-optical component 305 can then be configured such that a focus region 325 is a curved focus region such that focus point 323a' of peripheral primary beamlet 3 is disposed a distance of about 5.3 mm from a flat focus plane 323 of a multi-aperture plate without field curvature correction, as depicted in FIG. 2, or, worded differently, a distance of 5.3 mm further downstream as compared to a focus 323 of a central primary electron beamlet 3. Thus, due to a predetermined demagnification in the imaging process of the focus region onto the specimen, the resulting image plane 101 will be a flat image plane 101 with primary electron beam spots or image points 101a coinciding with the specimen surface.

Figure 4:
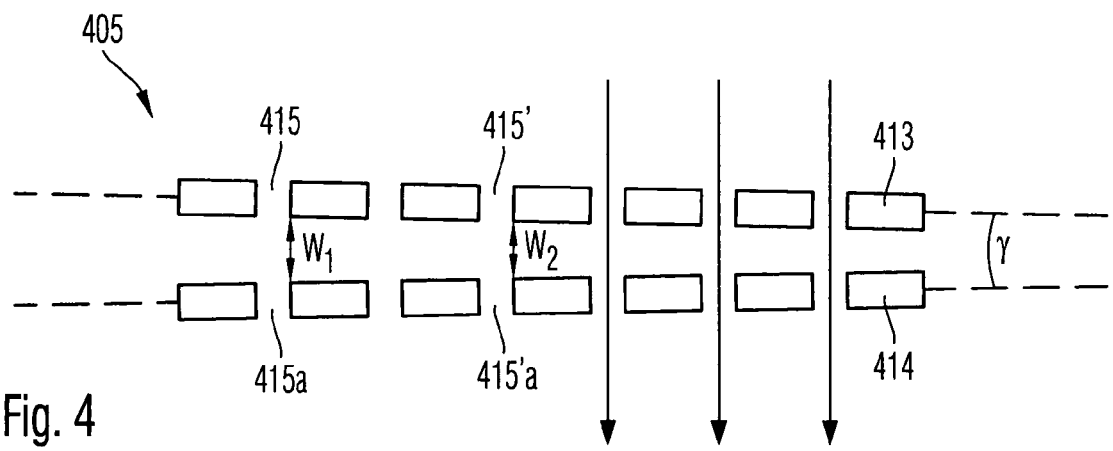
FIG. 4 illustrates an arrangement of the first multi-aperture plate with respect to the second multi-aperture plate in a first embodiment of the particle-optical component of the present invention.

In FIG. 4, one possibility of arranging the first multi-aperture plate 413 with respect to the second multi-aperture plate 414 is illustrated as a first embodiment 405 of a particle-optical component according to the present invention. Both the first and second multi-aperture plates 413, 414 are substantially plane-parallel plates having an aperture pattern formed therein by the respective pluralities of apertures. The second multi-aperture plate 414 is tilted with respect to the first multi-aperture plate 413, i.e. disposed at an angle γ with respect to the first multi-aperture plate 413, such that a gap is formed between them. The gap has a first width $w_1$ at a location of a first aperture 415 and a second width $w_2$ at a location of a second aperture 415', with $w_1 > w_2$. Each aperture of the first multi-aperture plate is aligned with a corresponding aperture of the second multi-aperture plate 414 such that pairs of associated apertures 415 & 415a and 415' & 415' a are formed. The arrows in FIG. 4 indicate a direction of the charged particle beam. The first multi-aperture plate 413 is arranged at a right angle with respect to a beam path of the charged particle beam. The arrangement of the first and second multi-aperture plates 413, 414 is symmetric with respect to one another.

Figure 5:
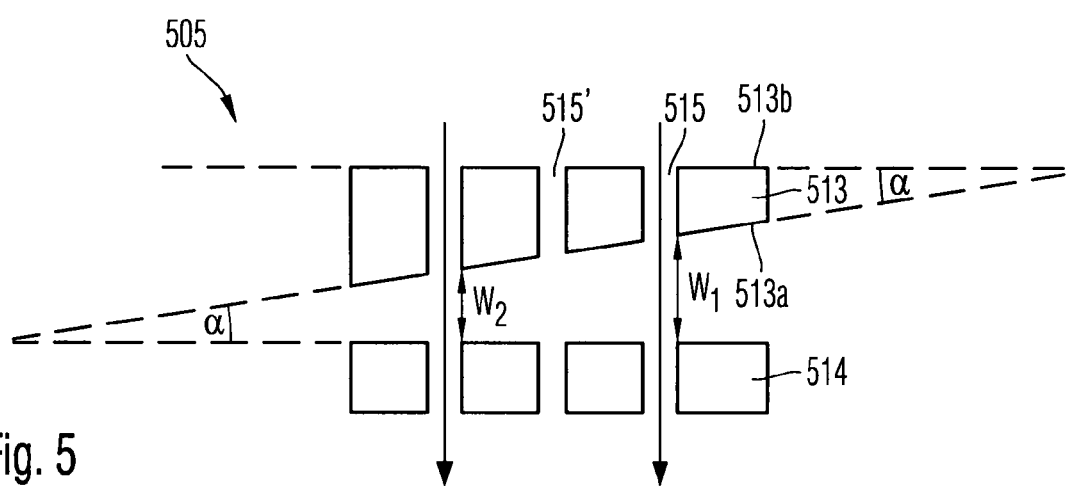
FIG. 5 illustrates an arrangement of the first multi-aperture plate with respect to the second multi-aperture plate in a second embodiment of the particle-optical component of the present invention.

In FIG. 5, a further possibility of arranging the first multi-aperture plate 513 with respect to the second multi-aperture plate 514 and of a possible design of the first multi-aperture plate 513 is illustrated as a second embodiment 505 of a particle-optical component according to the present invention. The first multi-aperture plate 513 has a varying thickness with the second surface 513a of the first multi-aperture plate being disposed at an angle α with respect to the first surface 513b thereof such that the thickness of the first multi-aperture plate 513 increases from right to left, as shown in FIG. 5. The second surface 513b of the first multi-aperture plate 513 is arranged at a right angle with respect to a beam path of an impinging charged particle beam indicated by the arrows in FIG. 5. The second multi-aperture plate 514 is a plane parallel plate with the first and second surfaces thereof being arranged in parallel to the second surface 513b of the first multi-aperture plate 513 and, accordingly, at an angle α with respect to the first surface 513a thereof. Thus, the gap formed between the first and second multi-aperture plates 513, 514 has a first width $w_1$ at a location of a first aperture 515 and a width $w_2$ at a location of a second aperture 515', with $w_1 > w_2$.

Figure 6:
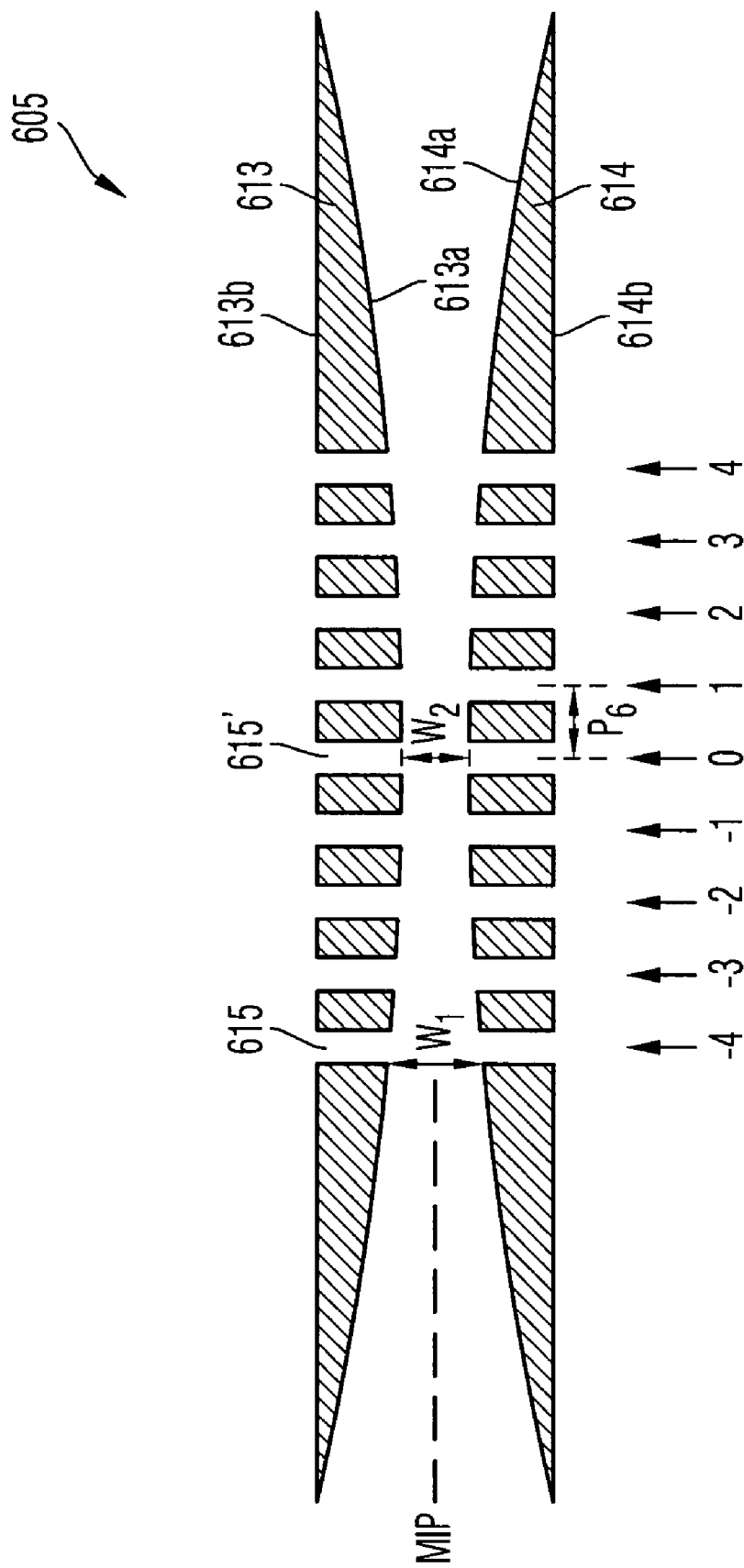
FIG. 6 illustrates an arrangement of the first multi-aperture plate with respect to the second multi-aperture plate in a third embodiment of the particle-optical component of the present invention.

In FIG. 6, a third, preferred embodiment 605 of the particle-optical component of the present invention is depicted. The first multi-aperture plate 613 has a first surface 613a having a convex, aspherical shape and a second surface 613b having a plane (flat) shape. The second multi-aperture plate 614 is substantially identical to the second multi-aperture plate 613. The first and second multi-aperture plates 613, 614 are arranged such as to be mirror-inverted with respect to one another, with a plane of symmetry MIP extending through the gap formed between the first and second multi-aperture plates 613, 614. The first surfaces 613a, 614a of the first and second multi-aperture plates 613, 614 are arranged so that they face each other. The first and second multi-aperture plates 613, 614 have identical aperture patterns comprising respective pluralities of apertures, with each aperture of the first multi-aperture plate 613 being aligned with a corresponding aperture of the second multi-aperture plate 614. Again, the gap formed between the first and second multi-aperture plates 613, 614 has a first width $w_1$ at a location of a first aperture 615, which is located at a periphery of the aperture pattern, and a width $w_2$ at a location of a second aperture 615', which is located in the center of the aperture pattern, with $w_1 > w_2$. A second width may be, in a preferred embodiment about 80 μm, for instance, whereas a first width at an edge of the aperture pattern (which, for ease of illustration, only encompasses 9 apertures in FIG. 6, whereas it would generally comprise a larger number of apertures) may be, for instance, about 290 μm.

If the pattern of apertures of the first and second multi-aperture plates 613, 614 have the same and constant pitch $P_6$, the width of the gap at a location of an N-th aperture could be described for instance by $w_N = 0.08 \text{ mm} + 0.0055 \times 1/\text{mm}^2 \times (P_6 \times |N|)^3$. If the aperture in the centre which would be attributed N=0 has a width $w_2$ of 80 μm, as already mentioned above, the width of the gap at an outermost aperture with N=±70 would be about 290 μm if $P_6$ was 48 μm. The first width $w_1$ at aperture N=−4 as indicated in FIG. 6 would for that pitch $P_6$ still be less than about 81 μm if calculated according to the above formula.

Figure 7:
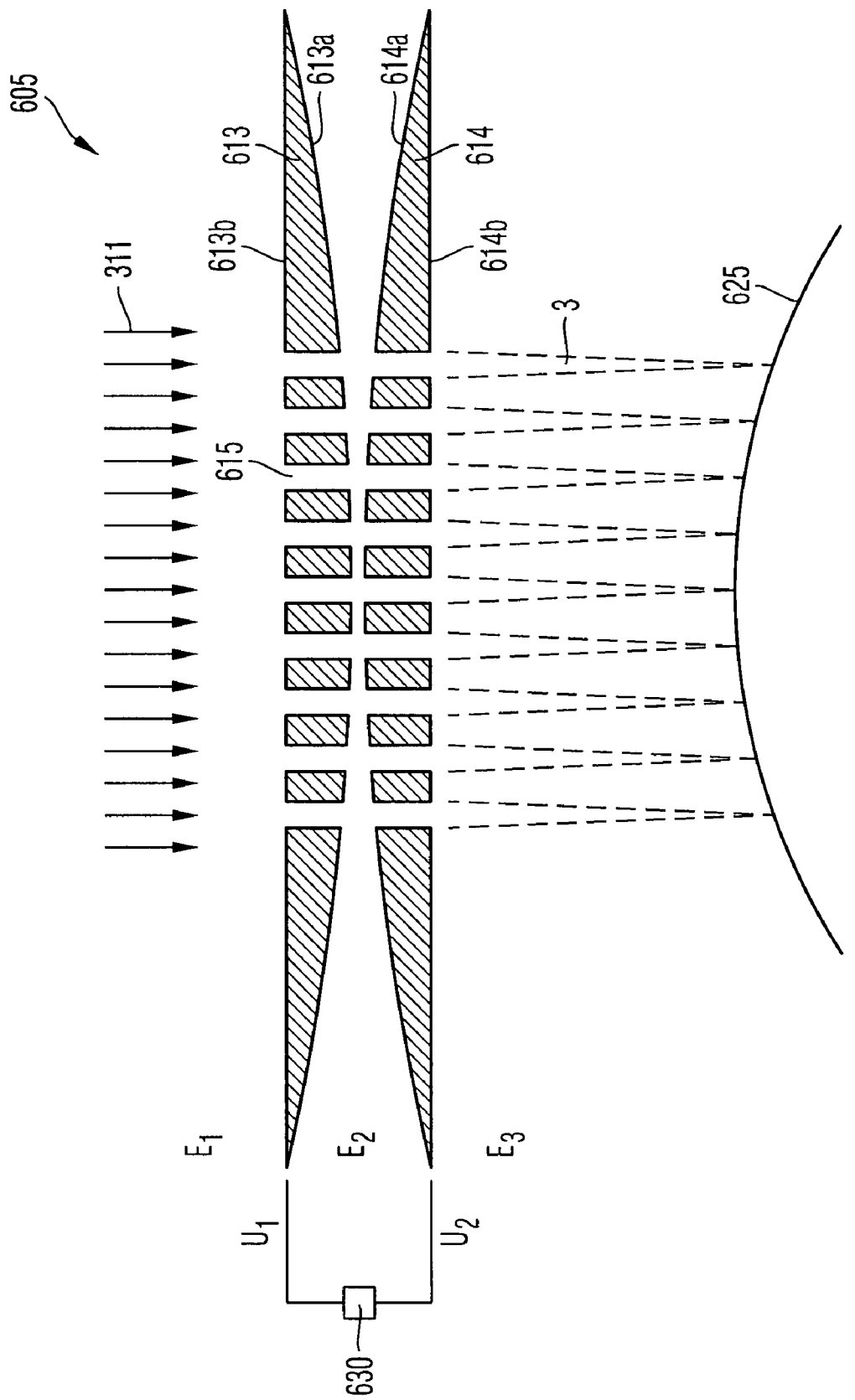
FIG. 7 schematically illustrates a field curvature compensating effect of the third embodiment of a particle-optical component of the present invention.

In FIG. 7, a field curvature correcting or compensating effect of the embodiment of a particle-optical component 605 depicted in FIG. 6 is schematically illustrated. A beam of primary electrons 311 impinges on a second surface 613b of the first multi-aperture plate 613. Those electrons that pass through the apertures 615 formed in the first and second multi-aperture plates 613, 614 form primary electron beamlets 3. Potentials $U_1$, $U_2$ are applied to the first and second multi-aperture plates 613, 614 such that a first electrical field $E_1$ upstream of and in the vicinity of the first multi-aperture plate 613 is substantially zero. The potentials $U_1$, $U_2$ are further chosen such that an electrical field $E_2$ is generated in the gap in between the first and second multi-aperture plates 613, 614. This can, in the depicted embodiment, for instance, be achieved by applying about 500 V ($U_1$) to the first multi-aperture plate 613 and grounding ($U_2$) the second multi-aperture plate 614. Thus, a so-called immersion-type lens is formed between the first and second multi-aperture plates 613, 614. The voltage supply configured to supply suitable potentials is denoted "630" in FIG. 7. In the embodiment depicted in FIG. 7, a third electrical field $E_3$ is provided downstream of the second multi-aperture plate 614 and is configured such that the particle-optical component has a focusing effect on the electrons (charged particles) passing through the apertures of the first and second multi-aperture plates 613, 614 such that the primary electron beamlets are focused in focus region 325. This may be readily achieved by providing a focusing electrical field $E_3$ by means of an electrode in the form of a single aperture plate (not shown) being supplied with a suitable voltage, such as from 20 to 30 kV (relative to the grounded second multi-aperture plate 614), for instance. In this embodiment, the main focusing is achieved by the second multi-aperture plate 614, with the second multi-aperture plate being disposed at an edge of two electrical fields $E_1$ and $E_3$ of different field strengths, whereas a field curvature correcting effect, which is a comparatively small focus influencing effect, is provided by the electrical field $E_2$ generated in the gap between the first and the second multi-aperture plates 613, 614. Thus, a focus region 623 is a curved focus region, with a focal length of a primary electron beamlet 3 passing through the particle-optical component at the center of the aperture pattern being by about 5% shorter as compared to a focal length of a primary electron beamlet 3 passing through an aperture located at a periphery of the aperture pattern. This provides a correction for a field curvature introduced, for instance, by particle-optical elements M downstream of the particle-optical component, as discussed before. In addition, other imaging errors, such as astigmatism or distortion may be corrected by the depicted component.

An imaging error correcting or compensating effect of the particle-optical component of the present invention may be varied by adjusting a width w of the gap or adjusting a potential difference $\Delta U$ between the first and second multi-aperture plates which makes an adjustment possible without the necessity to exchange the particle-optical component for another one. In addition, the particular design of the multi-aperture plates, in particular the shapes of the first surfaces and other factors can be tailor-made for a particular design of particle-optical system. The shape of one or both of the first surfaces will be influenced by a chosen gap width or range of gap widths, respectively, and a compensating effect to be achieved.

In the embodiment depicted in FIGS. 6 and 7, the potential difference $\Delta U$ applied between the first and second multi-aperture plates 613, 614 may be in a range of from 0 to 800 V, for instance, which corresponds to electrical field strengths of less than 10,000 V/mm, which is sufficiently low in a vacuum environment to avoid electrical breakthrough. If a potential difference of zero is applied, there would be no field curvature compensating effect so that embodiments with $\Delta U > 0$ are preferred.

In FIGS. 8a through 8d, a number of configurations of electrical fields in and around an embodiment 605 of the particle-optical component of the present invention are schematically illustrated.

Assuming that a kinetic energy of the charged particles is substantially constant over the cross section of illuminating beam 311 impinging on the second surface 613b of the first multi-aperture plate 613 of the particle-optical component, an electrical field $E_2$, and optionally electrical fields $E_1$ and $E_3$ adjacent to the particle-optical component may be shaped such that the focal length f provided by a respective aperture depends on a position of the aperture across the illuminating beam 311. The shaping of electrical field $E_2$ is achieved by the design of the multi-aperture plates 613, 614, for instance a curvature of opposing surfaces and/or their arrangement to one another and resulting shape and dimension of the gap formed between them, as well as potentials applied to the first and second multi-aperture plates 613, 614. Shaping of the electrical fields $E_1$ and $E_3$ to provide an optional, added particle-optical aberration correcting effect may be achieved by one or plural electrodes, which may preferably take the form of single-aperture plates, positioned at a distance upstream or downstream of the particle-optical component.

Figure 8A:
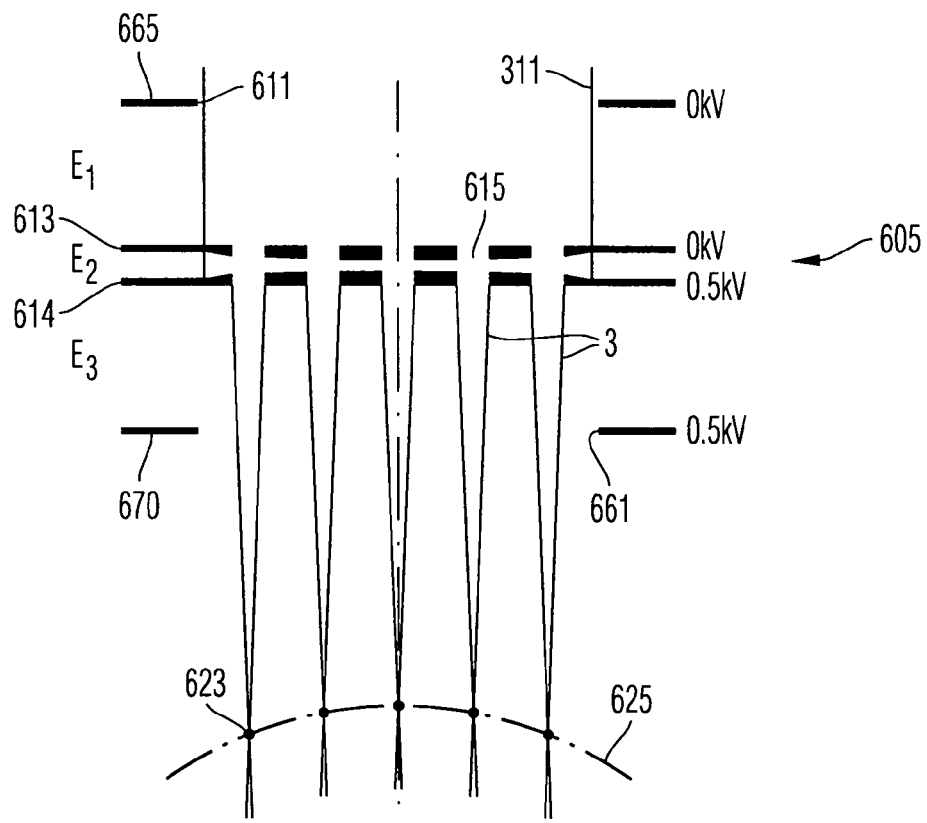
FIG. 8a,
FIG. 8b,
FIG. 8c,
FIG. 8d,
FIG. 8e illustrate embodiments of a particle-optical component of the present invention having at least one of a first, second, third and fourth electrode and different configurations of electrical fields.

In the configuration depicted in FIG. 8a, a first electrode 665 in the shape of a single aperture electrode having an aperture 611 is provided at a distance upstream of the first multi-aperture plate 613 and a second electrode 670, which is also a single aperture plate with an aperture 661 which is substantially identical to that of the first electrode 665 is provided at a distance downstream of the second multi-aperture plate 614. In the depicted configuration, a potential of 500V is applied to the second multi-aperture plate 614 whereas the first multi-aperture plate 613 is grounded, resulting in a potential difference $\Delta U$ of 0.5 kV between the first and second multi-aperture plates 613, 614. A voltage supply configured to supply these potentials is not shown in FIG. 8 for ease of illustration. This embodiment of the particle-optical component 605 is substantially the same as illustrated in FIGS. 6 and 7, i.e. the first and second multi-aperture plates 613, 614 have convex first surfaces opposing each other such that a width of the gap formed there between is smallest in a center of the multi-aperture plates and increases radially outwards. Accordingly, the resulting electrical field $E_2$ within the gap has a highest field strength in the centre which also decreases radially outwards, given that an electrical field strength is given by a ratio of a difference in potentials applied to the respective field-generating electrodes to a distance of the field-generating, electrodes from one another, or the first and second multi-aperture plates, in this case.

In the embodiment shown in FIG. 8a, the first electrode 665 is grounded whereas the second electrode has the same potential of 500 V applied to as the second multi-aperture plate 614 such that electrical fields $E_1$ and $E_3$ upstream and downstream of the particle-optical component 605 are zero. Therefore, the particle-optical component 605 provides only a very weak focusing effect which varies radially around the centre of the apertures for providing a field curvature compensating effect as compared to a case where a strong overall focusing effect is provided by a sufficient difference or gradient, respectively, of electrical fields upstream and/or downstream of the particle-optical component. The weak focusing effect provided by the component therefore may be superimposed onto a main focusing effect provided by a non-illustrated focusing arrangement. Charged particles being directed onto the particle-optical component 605 in the form of a charged particle beam 311 are transmitted through apertures 615 of the first and second multi-aperture plates 613, 614 and form beamlets 3 of charged particles, the number of formed beamlets 3 corresponding to the number of apertures 615 in the first and second multi-aperture plates 613, 614. The beamlets are assumed to be mainly focused by a non-depicted focusing element (providing a comparatively large main focusing effect) and form foci 623 in a focus region 625, the focus region 625 having a curved shape due to beamlets transmitted in a central region of the particle-optical component 605 having been subject to a stronger electrical field $E_2$ than beamlets having been transmitted though a peripheral region of the particle-optical component 605 and having been exposed to a comparatively weaker electrical field $E_2$, such that they are exposed to differing total focussing effects resulting in differing focal lengths and a corresponding curvature of the focus region 625. This curved focus region 625 allows to compensate for a field curvature induced by a particle-optical element further downstream of the particle-optical component 605. Apertures 611 and 661 of the first and second electrodes 665, 670 are dimensioned, such that the beam 311 or beamlets 3, generated by the particle-optical component, respectively, may pass.

In a different configuration, electrical fields $E_1$ and $E_3$ may be chosen to be different from zero. In those cases, if electrical fields $E_1$ and $E_3$ are the same, there will be no main, strong focussing but just the weak focusing effect provided by the electrical field $E_2$ within the particle-optical component to provide the correcting effect of the particle-optical component, if $E_1$ and $E_3$ are different and/or inhomogeneous, an additional focusing effect may thus be provided.

It is to be noted that the position of the focus region 325 as depicted in FIG. 8a, or in any of the other Figures, is just for illustrative purposes. The focus region may be at any other position in the system, for instance further downstream, depending on the kind, position and extent of focusing method used.

Figure 8B:
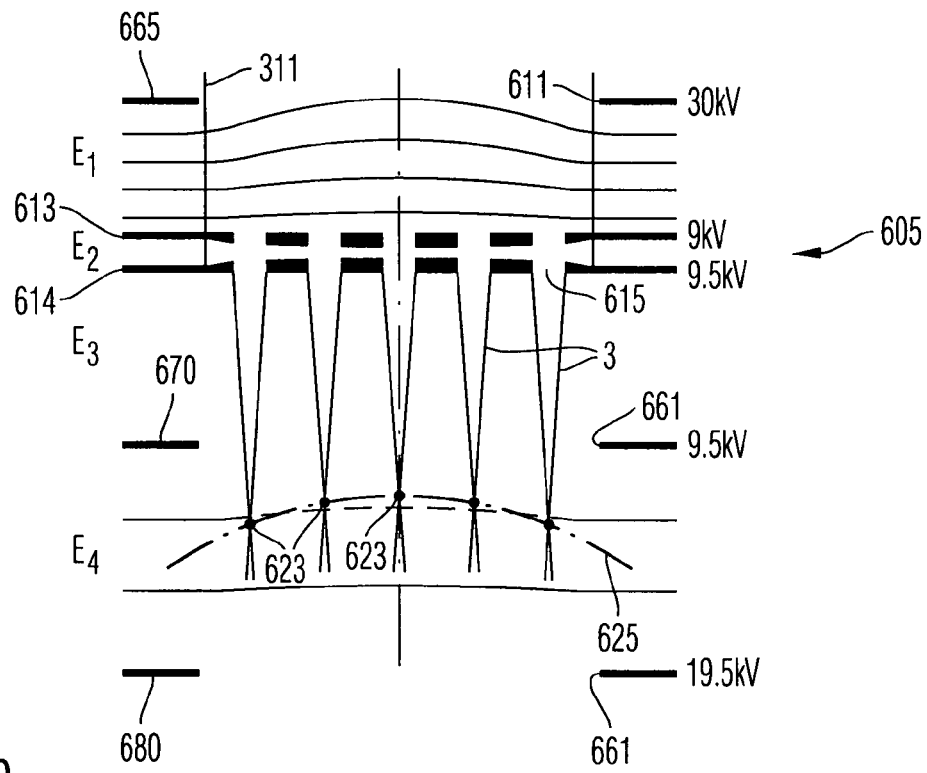

A configuration of electrical fields which provides an added main focusing effect is depicted in the embodiment of FIG. 8b. The arrangement of the particle-optical component and the first and second electrodes 665 and 670 corresponds substantially to that depicted in FIG. 8a with a third electrode, 680, also in the form of a single aperture plate, being positioned at a distance downstream of the second electrode 680. An aperture 661 of the third electrode 680 is, in this embodiment, substantially the same as apertures 611, 661 of the first and second electrodes 665, 670. An electrical field $E_1$ is generated between the first electrode 665 and the particle-optical component 605 by applying a potential of 30 kV to the first electrode and a potential of 9 kV to the first multi-aperture plate 613 of the particle-optical component 605 such that a homogenous electrical field $E_1$ is present in the vicinity and upstream of the first multi-aperture plate 613, as indicated by equipotential lines. Electrical field $E_2$ within the gap between the first and second multi-aperture plates 613, 614 is generated in a similar manner to the embodiment shown in FIG. 8a, with the exception that the potential difference $\Delta U$ of 0.5 kV is applied by applying a potential of 9.5 kV to the second multi-aperture plate 614. The same potential of 9.5 kV is applied to the second electrode 670 downstream of the second multi-aperture plate 614 such that the electrical field $E_3$ there between is zero. Thus, the electrical fields $E_1$ and $E_3$ upstream and downstream of the particle-optical component 605 differ, resulting in a main focusing effect such that charged particles of charged particle beam 311 are focused into focus region 625, which is, in comparison to the embodiment of FIG. 8a, therefore positioned closer to the particle-optical component 605 and, in this embodiment, located in a substantially homogeneous electrical field $E_4$, which is generated by application of a potential of 19.5 kV to the third electrode 680, as indicated by depicted equipotential lines. This embodiment is also exemplary of the method of focusing a plurality of charged particle beamlets according to the seventh aspect of the present invention.

Figure 8C:
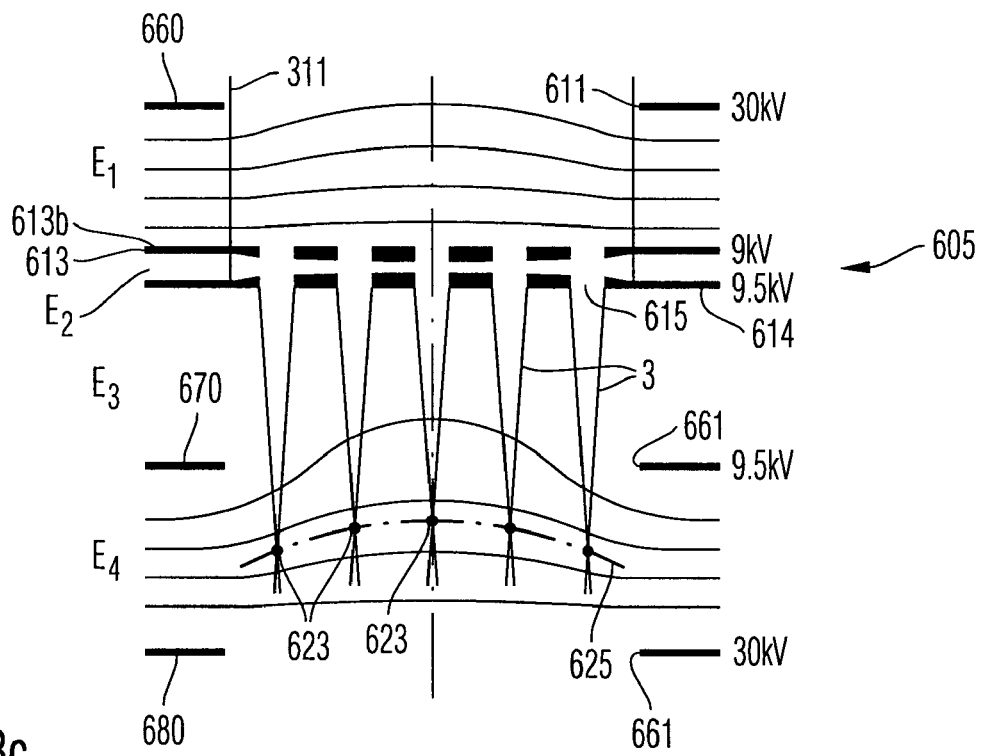

In a further embodiment depicted in FIG. 8c, in addition to a main focusing effect as a result of differing electrical fields $E_1$, $E_3$ upstream and downstream of the particle-optical component 605 and a compensating effect provided by the particle-optical component 605, an additional particle-optical aberration correcting effect may be achieved by shaping an electrical field, in the embodiment of FIG. 8c electrical field $E_4$, such that its field strength varies in a given area, in a plane orthogonal to an optical axis, the field strength may, for instance, show a radial dependence. $E_1$ is substantially constant across the cross-section of illuminating beam 311 at positions close to the first multi-aperture plate 613. An inhomogeneous electrical field $E_3$ results from electrical field $E_4$ penetrating from aperture 661 of the second electrode 670, as indicated by curved equipotential lines penetrating from a space between single-aperture plates 670, 680, into a space between the second multi-aperture plate 614 and single-aperture plate 670. An aperture positioned at a center of the aperture pattern will therefore provide a shorter focal length f than an aperture positioned at a periphery of the aperture pattern, resulting in foci 623 of the beamlets 3 being located on a curved focus region 625, as indicated by the broken line in FIG. 8c. Thus, in addition to the field curvature correcting effect or geometrical aberration compensating effect of the particle-optical component according to the present invention, an arrangement of electrodes downstream of the component and suitable application of potentials thereto contributes to a compensation of field curvature.

In alternative embodiments, a homogeneous electrical field, for instance $E_4$, may be generated by a suitable choice of suitable diameters of apertures in the electrodes, in the case of $E_4$ for example apertures 661. For instance, a diameter of aperture 661 of electrode 680 may be different from a diameter of aperture 661 of electrode 670. In further embodiments, a thickness of electrodes 670 and 680 may be suitably chosen such that a homogenous electrical field $E_4$ may be achieved. One or more of the parameters diameter of an aperture of electrode 670 or 680 and ratios of aperture diameters of the electrodes 670, 680, thicknesses of electrodes 670 and voltages applied to electrode 670 may be suitably adjusted to enable formation of a substantially homogeneous electrical field between them. Similar consideration apply to other pairs of electrodes and electrical fields formed between them, as will be readily apparent to the person skilled in the art.

Figure 8D:
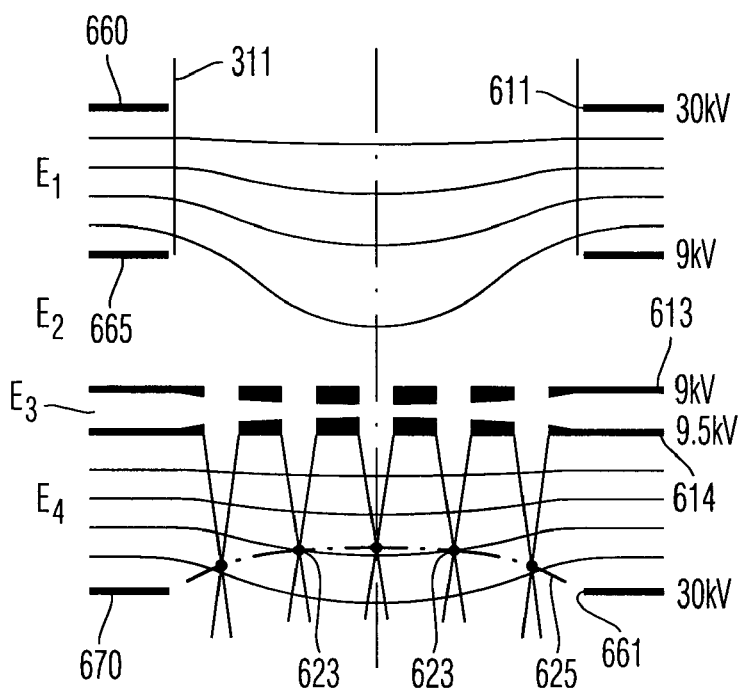

FIG. 8d shows a configuration which is practically the reverse of the one depicted in FIG. 8c. In FIG. 8d, an inhomogeneous electrical field $E_2$ upstream of the first multi-aperture plate 613 is generated by an electrical field $E_1$ between a single aperture plate 660 disposed at a distance upstream of the first electrode 665 and the first electrode 665 and bowing out into a space between the first electrode 665 and the first multi-aperture plate 613. Generation of electrical field $E_3$ within the particle-optical component 605 and configuration of particle-optical component 605 are substantially the same as in the embodiments described in connection with FIGS. 8a to 8c. Downstream of the second multi-aperture plate 614, an electrical field $E_4$ is generated by applying a potential of 30 kV to single-aperture plate 670 relative to a potential of 9.5 kV being applied to the second multi-aperture plate 614. Thus, electrical fields $E_2$ and $E_4$ upstream and downstream of the particle-optical component 605 differ, resulting in a main focusing effect being provided by particle-optical component 605, or a single multi-aperture plate thereof, respectively. In addition, particle-optical component 605 provides a correcting effect by providing a dependency of a focal length on a position of a respective aperture with respect to a centre or central aperture of the multi-aperture plates 613, 614. Furthermore, an additional field curvature correcting effect is provided by having an inhomogeneous electrical field $E_2$ upstream of the particle-optical component 605.

The additional focusing effect due to having an electrical field of a particular shape upstream or downstream, also in connection with virtual foci, of a multi-aperture plate is described in detail in WO 205024881 to the same Assignee, as mentioned before.

Figure 8E:
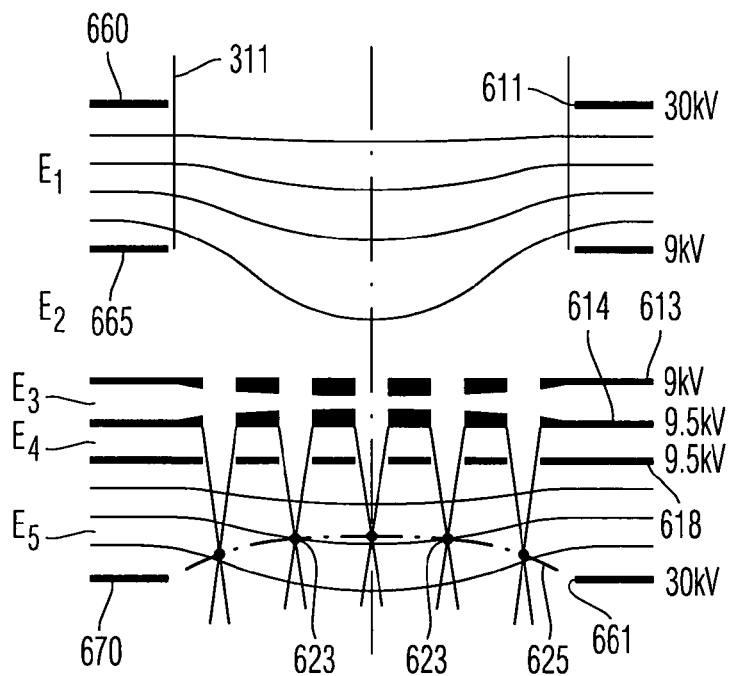

The embodiment depicted in FIG. 8e is practically identical to the one depicted in FIG. 8d, except that an additional multi-aperture plate 618 is provided downstream of the second multi-aperture plate 614, which comprises a pattern of apertures being arranged in the same manner as that of the first and second multi-aperture plates 613, 614. The same electrical potential of 9.5 kV is applied to the additional multi-aperture plate 618, such that there is no electrical field between the second and the additional multi-aperture plates 613, 618. In alternative embodiments, a potential different from that applied to the second multi-aperture plate 614 may be applied to the additional multi-aperture plate 618 and an electrical field $E_4$ generated there between. Preferably, $E_4$ should not be of the same magnitude and opposite orientation (accelerating/decelerating) as compared to $E_3$. The embodiment shown in FIG. 8e is advantageous in particular for practical reasons as experience with current multi-aperture plate manufacturing methods has shown that often, only one surface of a multi-aperture plate is smooth whereas the opposite one has a certain surface roughness. In the embodiment of FIG. 8e, the multi-apertures plates 613, 614 and 618 are advantageously arranged such that their respective smooth surface faces a region where an electrical field is present, $E_3$ and $E_5$ in the illustrated case, which has proven beneficial for the electrical fields and particle-optical properties of the entire system.

Figure 9:
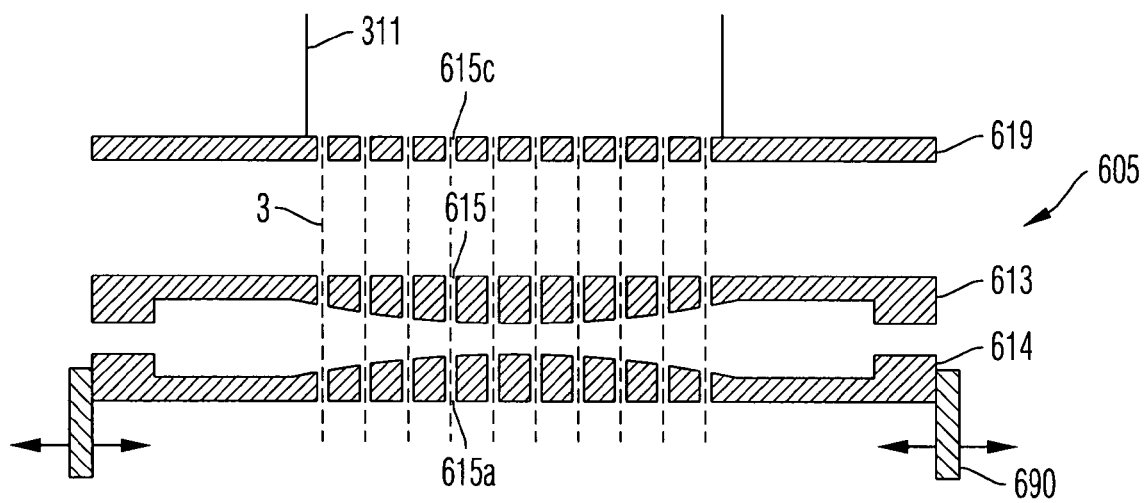
FIG. 9 illustrates an embodiment of the particle-optical component of the present invention with a third multi-aperture plate.

In FIG. 9, an embodiment of the present invention is shown wherein a third multi-aperture plate 619 is disposed upstream of the first multi-aperture plate 613, i.e. such that the first multi-aperture plate 613 is disposed between the third multi-aperture plate 619 and the second multi-aperture plate 614. In the depicted embodiment, the third multi-aperture plate 619 has the same number and pattern of apertures 615c as the first and second multi-aperture plates (with apertures 615, 615a, respectively). Apertures 615c are aligned with corresponding apertures 615 of the first multi-aperture plate 613 and apertures 615a of the second multi-aperture plate 614. As shown in FIG. 9, the apertures 615c of the third multi-aperture plate 619 have a smaller diameter than the corresponding apertures of the first and second multi-aperture plates. This embodiment is advantageous in that the third multi-aperture plate 619, rather than the first multi-aperture plate 613, heats up and collects electrical charge as well as contaminations, i.e. is subject to deterioration, as a result of charged particles of charged particle beam 311 being incident onto a surface of the third multi-aperture plate 619 in between apertures 615c. The third multi-aperture 619 forms beamlets 3 which are substantially completely transmitted through apertures 615, 615a of the first and second multi-aperture plates 613, 614, i.e. there is substantially no loss of charged particles due to charged particles being incident and scattered on a surface. In FIG. 9, a mounting structure 690 for displacing the second multi-aperture plate 614 relative to the first multi-aperture plate 613 is also shown schematically.

Figure 10A:
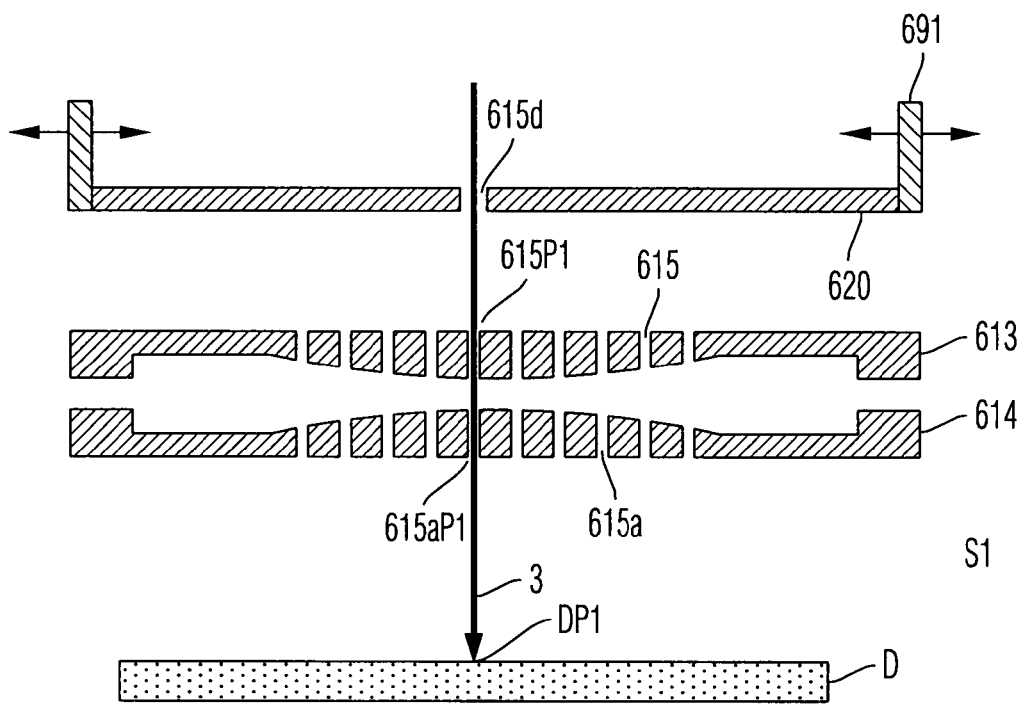
FIG. 10a,
FIG. 10b illustrate an embodiment of the particle-optical component of the present invention comprising a fourth aperture plate and steps of an embodiment of operating a multi-aperture component according to the 2nd aspect of the present invention.
Figure 10B:
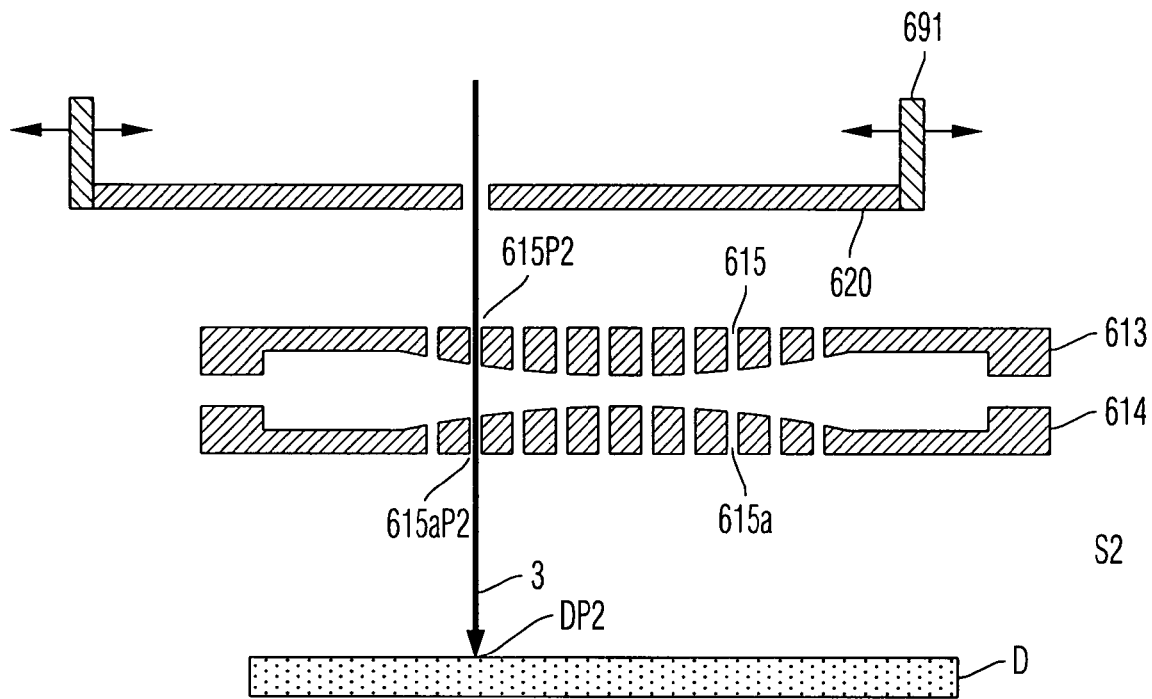

In FIGS. 10a and 10b, a further embodiment of the present invention is shown having a fourth aperture plate 620 disposed upstream of the first multi-aperture plate 613. Fourth aperture plate 620 has a single aperture 615d whose diameter corresponds to a diameter of apertures 615, 615a of the first and second multi-aperture plates in this embodiment. Fourth aperture plate 620 is held by a mounting structure 691 which comprises an actuator (not shown) for displacing the fourth aperture plate 620 relative to the first and second multi-aperture plates 613, 614, in particular in parallel thereto. Such a fourth aperture plate 620 is, for instance, suitable for testing a multi-aperture component. A multi-aperture component may be a single multi-aperture plate, a set of two multi-aperture plates or a particle-optical component according to the present invention, for instance. In this embodiment, the method of operating a multi-aperture component involves testing an alignment of the first and second multi-aperture plates 613, 614 of a particle-optical component according to the present invention. In a first step S1, depicted in FIG. 10a, the fourth aperture plate 620 as a testing aperture plate is positioned in a first position relative to the first and second multi-aperture plates 613 such that the aperture 615d of the testing aperture plate 620 is in alignment, in a direction of a charged particle beam to be transmitted, or in a direction of an optical axis in a charged particle optical system, with a first aperture 615P1 of the first multi-aperture plate 613 and a corresponding aperture 615aP1 of the second multi-aperture plate 614. A beamlet 3 of charged particles is transmitted through the apertures 615d as well as 615P1 and 615aP1, and detected by a detector arrangement D at position DP1 on the detector surface, for instance an intensity of the beamlet 3 may be detected, or its shape or position or all of the same. In a second step S2, the fourth or testing aperture plate 620 is displaced parallel to the first multi-aperture plate 613 and thus positioned in a second position relative thereto such that the aperture 515d of the testing aperture plate 620 is in alignment with a different aperture 615P2 of the first multi-aperture plate 613 as well an aperture 615aP2 of the second multi-aperture plate 614 aligned therewith. Beamlet 3 is then transmitted through apertures 615d, 615P2 and 615aP2 and detected in a second position DP2 of detector D2, in terms of position, shape or intensity, preferably the same parameter or set of parameters as in the first step S1. If an intensity of the beamlet 3 was different for the first and the second position whereas the sizes of apertures the beamlet 3 was transmitted through were the same for both positions, this difference in intensities could indicate a misalignment of the first and second multi-aperture plates, in which case the method could further comprise adjusting a position of the first multi-aperture plate 613 relative to the second multi-aperture plate 614.

Figure 11:
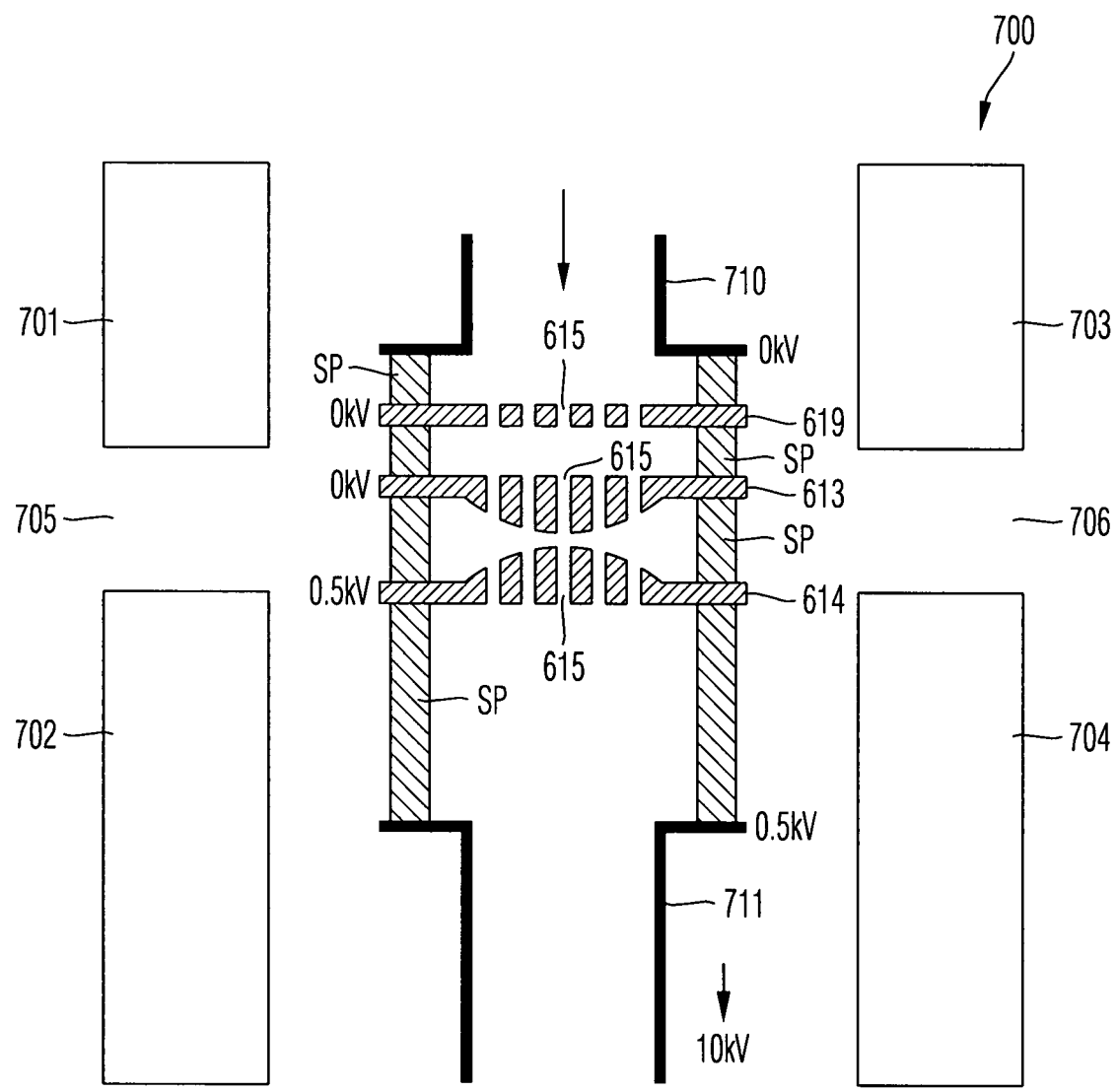
FIG. 11 illustrates an embodiment of a particle-optical component according to the present invention being used in a magnetic lens.

In FIG. 11, an embodiment of a charged-particle component according to the present invention is shown in use in a magnetic lens 700. The magnetic lens comprises four magnetic poles 701-704, wherein two pairs of adjacent magnetic poles 701 & 702, 703 & 704 form respective gaps 705, 706 between them such that magnetic fields penetrating into a space between the pole pairs or gaps 705, 706, respectively, are formed. In the embodiment depicted in FIG. 11, the particle-optical component comprises a first multi-aperture plate 613 having a plurality of apertures 615, a second multi-aperture plate 614 having a plurality of apertures 615 and a third multi-aperture plate 619 disposed upstream of the first multi-aperture plate 613 and having a plurality of apertures 615 formed therein. The three multi-aperture plates 613, 614, 619 are mounted using a number of spacers SP disposed between them and around peripheral ring portions of the respective multi-aperture plates such that the multi-aperture plates are aligned and fixed at a predetermined distance from each other. The spacers SP are made of an insulating material. In addition, an electrode tube 710 is provided upstream of the third multi-aperture plate 619 and a second electrode tube 711 disposed downstream of the second multi-aperture plate 614. The depicted embodiment may be advantageously used to correct for aspherical aberrations, or any other aberrations showing a dependency on a distance from a center of the magnetic lens. In particular, aberrations exhibiting a radial dependency may be advantageously corrected. In order to provide a compensating effect, in one embodiment, 0 kV are applied to electrode tube 710, and 0 kV are equally applied to the third and first multi-aperture plates 613, 619, whereas a small voltage of 0.5 kV is applied to the second multi-aperture plate to create a small focus correcting field between the first and second multi-aperture plates 613, 614. An upper rim of electrode tube 711 is conveniently supplied with 0.5 kV whereas further downstream (not shown, but indicated by an arrow), a potential of 10 kV may be suitably provided.

Although the particle-optical component is shown as being disposed in a region of the gaps 705, 706 in FIG. 10, and therefore in a region of magnetic field, in other embodiments, it may be even more advantageously arranged within the magnetic lens 700 such that it is disposed in a region of zero or only small magnetic flux density.

Figure 12A:
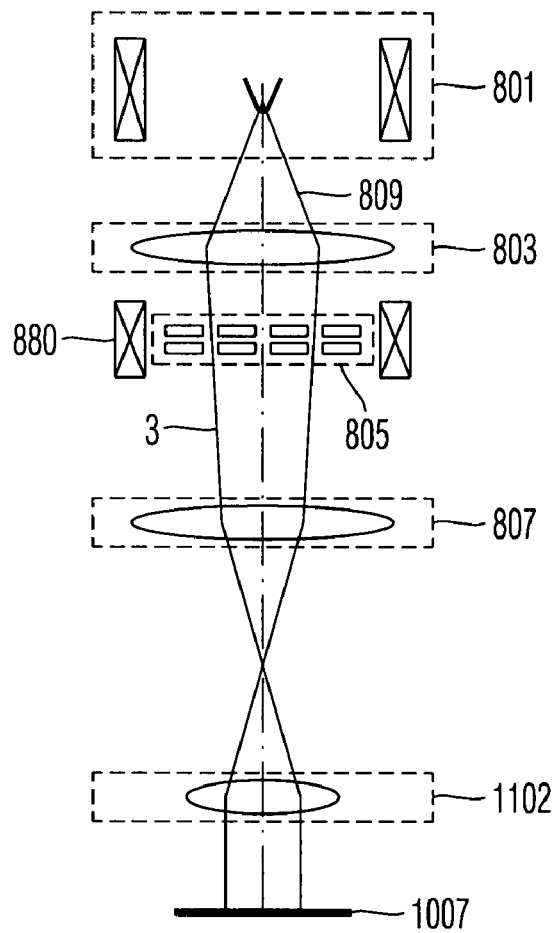
FIG. 12a illustrates an embodiment of a particle-optical component and arrangement according to the present invention comprising a coil arrangement.
Figure 12B:
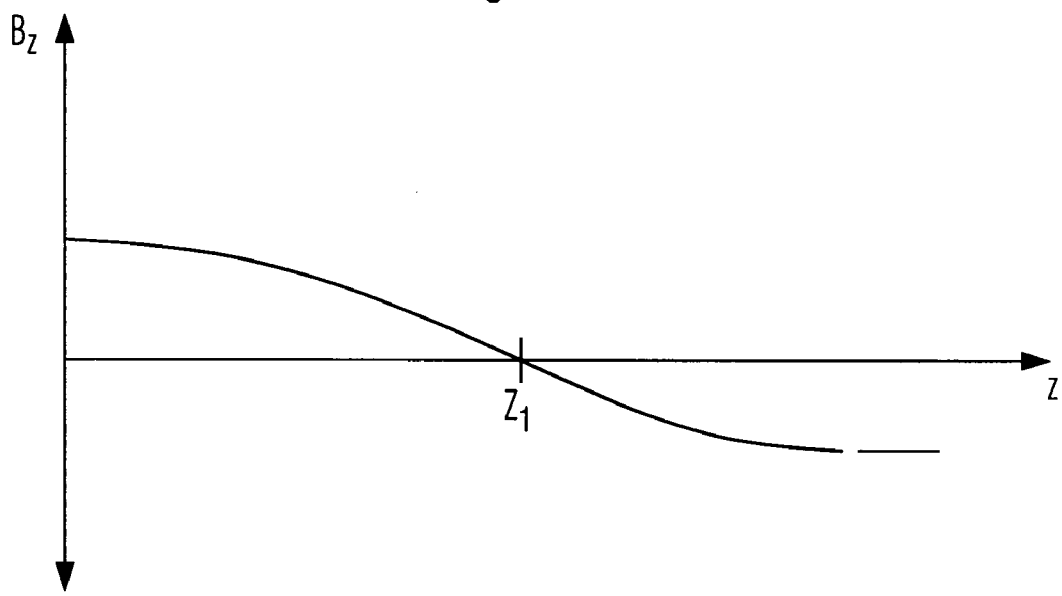

An embodiment of a particle-optical arrangement and system according to the present invention where a magnetic field in the vicinity of the particle-optical component according to the present invention is substantially nullified is illustrated in FIG. 12a, as well as an embodiment of a method of manipulating charged particle beamlets according to a further aspect of the present invention. The particle-optical system of this embodiment comprises charged particle source arrangement 801, a collimating lens 803, a particle-optical component 805 according to the present invention, a field lens 807 and an objective lens 1102 as well as a specimen mount 1007. The functions of these components correspond generally to the ones described in previous embodiments, in particular with reference to FIGS. 1 and 7. At least one of lenses 803, 807 and 1102 in this embodiment is a magnetic lens, for instance collimating lens 803. The particle-optical arrangement in this embodiment further comprises a coil arrangement 880 comprising a coil for generating a magnetic field in a region of the particle-optical component 805 such that a magnetic field generated by one or more of lenses 803, 807 and 1102 is substantially nullified in a vicinity of the particle-optical component 805, in particular in the gap between the first and second multi-aperture plates of the particle-optical component 805. In the embodiment depicted in FIG. 12a, lens 803 is a magnetic lens generating a magnetic field of a given magnetic flux density and orientation. A magnetic flux density on axis z of the embodiment of particle-optical arrangement of FIG. 12a is indicated in FIG. 12b. A magnetic field having a positive magnetic flux density generated by lens 803 is decreased by a second magnetic field generated at least in a region of the particle-optical component 805, a gap between the multi-aperture plates being positioned close to position $z_1$ on axis z as indicated in FIG. 12b. The second magnetic field has an orientation and flux density configured to substantially nullify a magnetic field $B_z$ in position $z_1$. While a magnetic field may not be nullified in a region comprising the entire particle-optical component, it is preferably substantially nullified at a location within the particle-optical component. The flux density and position of the second magnetic field can be determined by a layout and/or position of the coil arrangement 880, a current flowing through the coil thereof and other suitable parameters, as will be readily apparent to the person skilled in the art. In the corresponding embodiment of the method of manipulating charged particle beamlets, a charged particle beam 311 is generated by particle source arrangement 801, collimated by magnetic collimating lens 803, which generates a first magnetic field in a beam path of the charged particle beam 311, and directed onto particle-optical component 805. Charged particles of charged particle beam 311 are transmitted through apertures of the particle-optical component 805 and thus form beamlets 3, which are illustrated as just one beam in FIG. 12a for ease of illustration. A second magnetic field is then generated by coil arrangement 880 which effectively nullifies the first magnetic field generated by collimating lens 803 in a region of the particle-optical component 805.

Figure 13A:
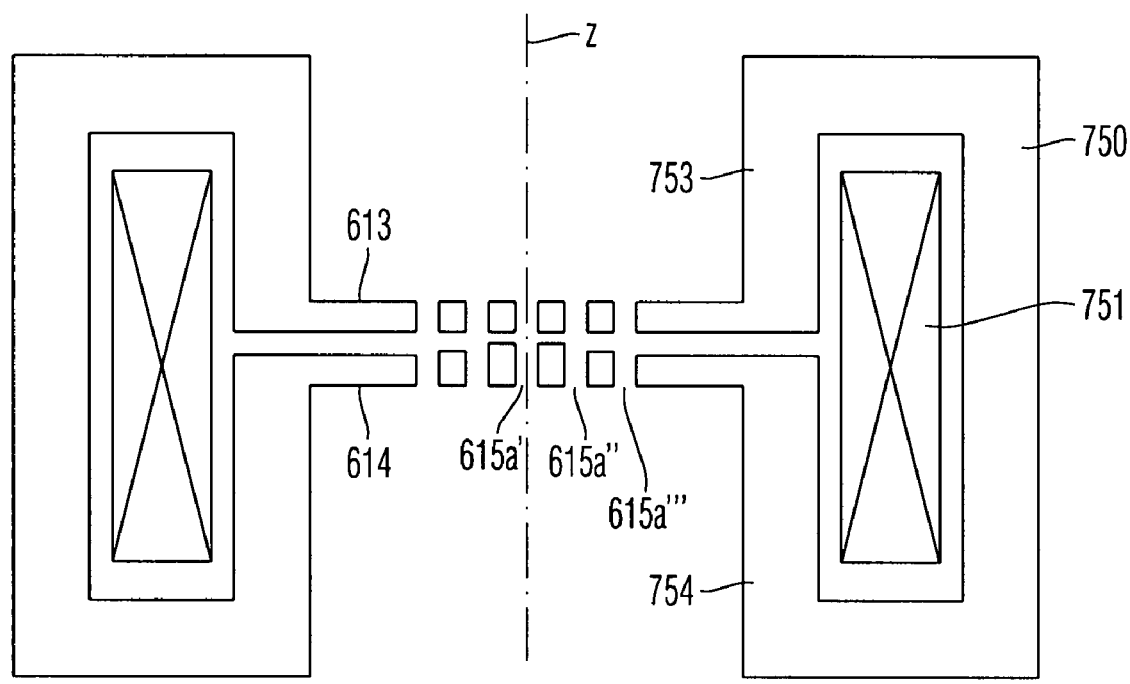
FIG. 13a illustrates a portion of an embodiment of a particle-optical arrangement according to the 10th aspect of the present invention.
Figure 13B:
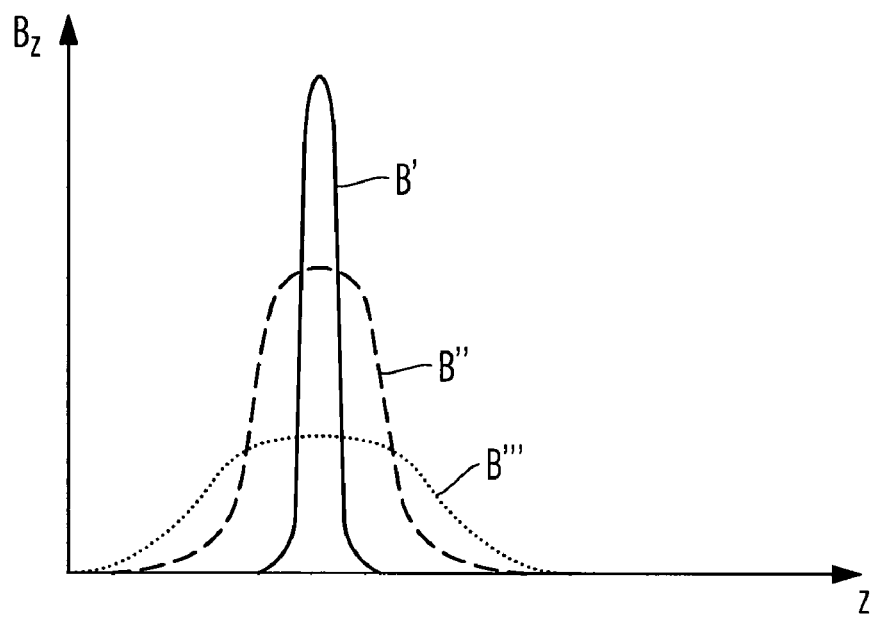

In FIG. 13a, an embodiment of a particle-optical arrangement according to the tenth aspect of the present invention is illustrated wherein a first multi-aperture plate 613 is integrally formed with a first pole piece 753 of a magnetic lens arrangement and a second multi-aperture plate 614 is formed integrally with a second pole piece 754 of the magnetic lens arrangement. As shown in FIG. 13a, the first and second pole pieces 753, 754 are arranged symmetrically about a beam path of charged particles, a direction of which is indicated by axis z. While an inside of the magnetic lens arrangement is shown to take the form of a toroid, other structures of the pole pieces 753, 754, are also conceivable. The first and second multi-aperture plates 613, 614 are disposed to be traversed by the beam path. Upon magnetic flux in the pole pieces 753, 753, generally induced by current flow in coil 751 disposed inside the pole piece arrangement 750 of first and second pole pieces 753, 754, a magnetic field is generated in the gap between the first and second pole pieces 753, 754 on a side facing axis z as well as in the gap between the first and second multi-aperture plates 613, 614. Given the varying width of the gap, a magnetic flux density inside the gap will vary accordingly. Therefore, charged particles traversing an aperture 615a' in a centre of the multi-aperture plates 613, 614 will travel through a stronger magnetic field than particles traversing an aperture located towards a periphery of the multi-aperture plates. Magnetic flux densities $B_z$ in the direction of axis z inside the gap between different pairs of associated aligned apertures 615a' (B'), 615a'' (B''), 615a''' (B''') are schematically depicted in the graph shown in FIG. 13b. As can be seen from the graph, a maximum flux density $B_z$ decreases with increasing distance from the axis as the gap width between the first and second multi-aperture plates 613, 614 increases. This radial dependence of the magnetic flux density and the influence of the radially decreasing magnetic flux density on charged particles is used advantageously to correct or compensate for particle-optical aberrations in a system comprising such an arrangement.

Figure 14:
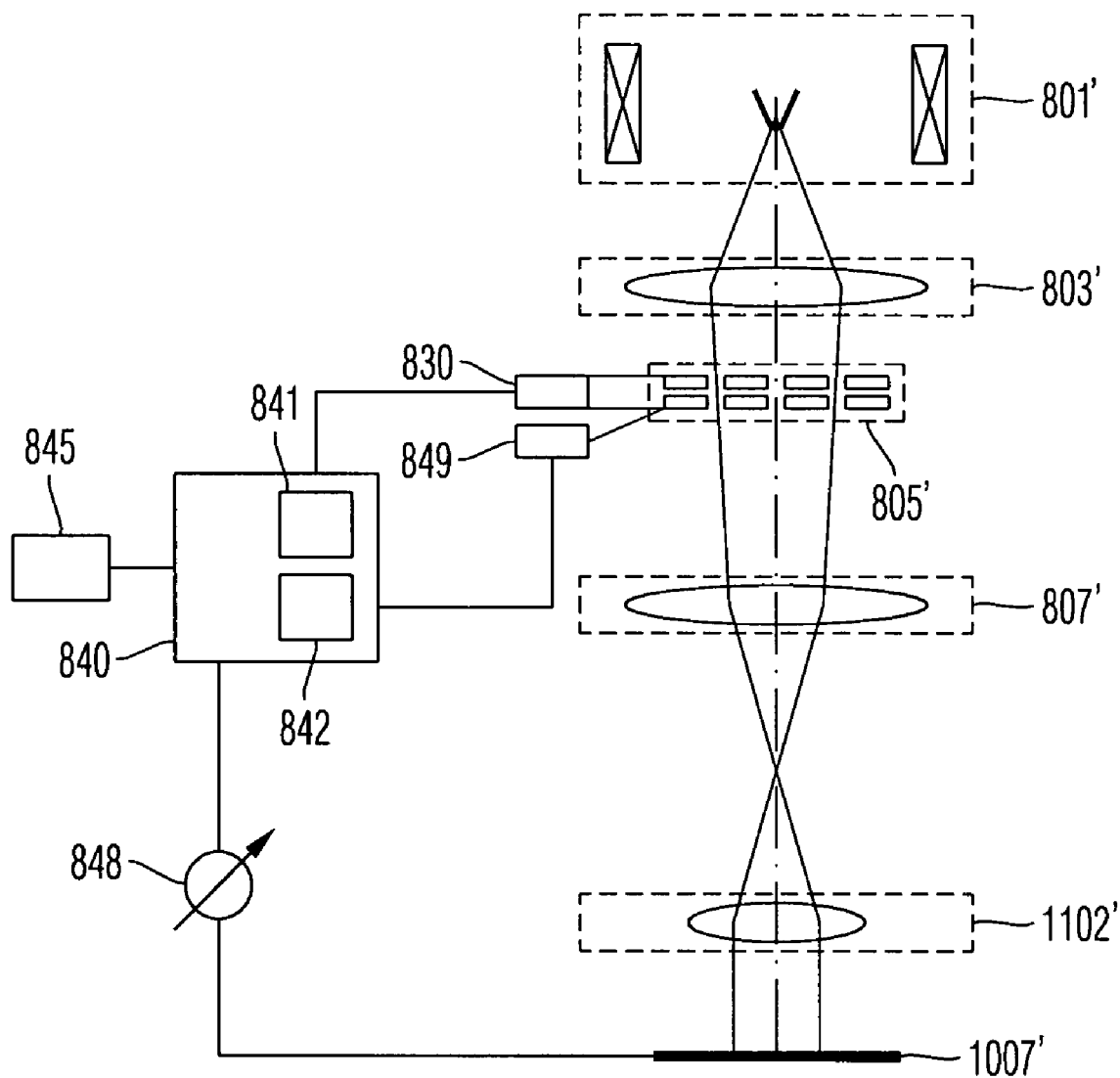
FIG. 14 illustrates a further embodiment of a particle-optical arrangement according to the present invention.

A further embodiment of a particle-optical arrangement or particle-optical system according to the present invention is depicted in FIG. 14. This embodiment comprises, in analogy to the embodiment illustrated in FIG. 12a, charged particle source arrangement 801', a particle-optical component 805' according to the present invention with a voltage supply system 830 which is configured to apply different potentials to the first and second multi-aperture plates of particle-optical component 805'. The particle-optical arrangement in this embodiment further comprises a controller 840 having a first control portion 841 configured to control the voltage supply system 830 based upon a total beam current of a plurality of charged particle beamlets downstream of the particle-optical component 805'. This allows for an adjustment of a correcting effect provided by the particle-optical component in dependence of a total current of charged particles in the system, as an extent of particle-optical aberrations tend to be influenced by Coulomb interactions between the charged particles. Thus, if the charged particle source arrangement 801' is set to emit a higher current of charged particles or multi-aperture plates having a higher number of apertures are used or specimens inspected which produce a higher amount of secondary particles such as electrons, a density of charged particles in the particle beamlets downstream of the particle-optical component 805' is increased and an adjustment to the compensating effect provided by said component desirable. In the embodiment depicted in FIG. 14, the particle-optical arrangement further comprises a current detector 848 for detecting the total beam current of the plurality of charged particles. In the embodiment shown in FIG. 14, the total beam current is determined by measuring a potential difference between the particle source arrangement 801' and the specimen mount 1007' which collects charge in dependence of a total beam current of charged particle beamlets. Particularly in those instances where the second multi-aperture plate comprises deflecting arrangements for effectively opening or closing individual apertures of the multi-aperture plate and thus controlling a total current of the beamlets of charged particles directed onto a specimen mounted onto specimen stage 1007', the controller may also comprise a second control portion 842 for controlling beam currents of the charged particle beamlets. This may be achieved by having the second control portion send a signal to a control unit 849 of deflecting arrangements disposed on the second multi-aperture plate of charged particle component 805'. It is also advantageous if the first control portion 841 is responsive to the setting of the second control portion 842, i.e. if the second control portion 842 is set to increase or decrease currents of charged particle beamlets, the first control portion 841 may respond to a signal by the second control portion 842 indicating the increase or decrease by adjusting the voltage supply system 830 accordingly to account for the change in beam currents. The first and second control portions 841, 842 may also be responsive to other signal inputs from other sources, such as from signal input 845 which may, for instance be connected to charged particle source arrangement 801 for indicating a change in a generated beam current or, in another example, to a secondary electron detector. The system of the embodiment of FIG. 14 further comprises a collimating lens 803', a field lens 807' and an objective lens 1102' as well as a specimen mount 1007'. The functions of these components correspond generally to the ones described in previous embodiments, in particular with reference to FIGS. 1 and 7.

The particle-optical system as shown in FIG. 14, for instance, may be used and configured as a lithography system for writing a pattern on a substrate.

Figure 16:
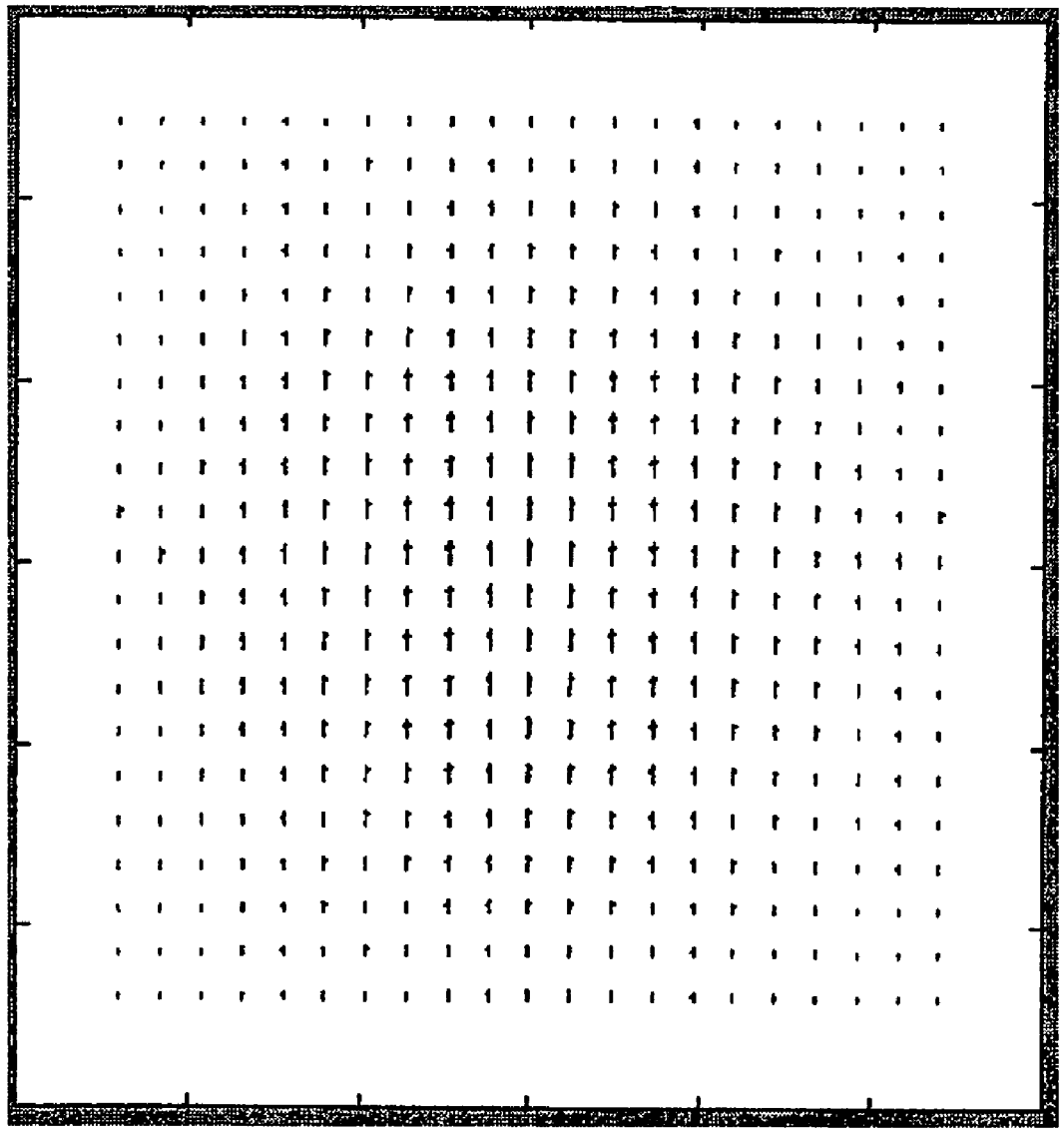

It is generally desirable that the first and second multi-aperture plates are aligned as precisely as possible relative to one another in the particle-optical component according to the present invention. Desirably, an alignment of the two multi-aperture plates, or associated apertures thereof, will be better than 100 nm. A slight misalignment leads to distortion of the resulting spot array of primary electron beams in an image plane. Such a distortion effect is illustrated in FIG. 15a, which shows a shift of the spots 623 of primary electron beams 3 in an focus plane 625 as resulting from the misalignment between the first and second multi-aperture plates 613, 614, which will be translated into a corresponding distortion in an image plane. In particular, a distance between adjacent foci 623 decreases from right to left in FIG. 15a. FIG. 16 shows an elevational view of a spot array pattern of primary electron beam spots in an image plane resulting therefrom.

However, if a slight misalignment of the multi-aperture plates has to be tolerated, it has been found that an error resulting there from, in particular a distortion, may be readily compensated for by use of a tilted illumination mode. FIG. 15b illustrates how a charged particle beam 311 impinging on the first multi-aperture plate 613 at an angle deviating slightly from a right angle (typically in a range of a few mrad), may be used to compensate for a distortion introduced by the misalignment. This effect may be attributed to a deflection of charged particle beams or beamlets, respectively, in dependence of a local strength of the respective electrical field. A stronger electrical field is generated in a center of the depicted multi-aperture plates 613, 614. Accordingly, a deflection is higher in the center than towards a periphery of the multi-aperture plates 613, 614, thus providing a correcting effect compensating for the distortion. Using a tilted illumination mode, as shown in FIG. 15b therefore results in foci of primary electron beamlets 3 being equidistant in a focus plane 625.

Alternatively, for instance in embodiments wherein an additional multi-aperture plate upstream of the first and second multi-aperture plate is used, the additional multi-aperture plate may be positioned with respect to the first and second multi-aperture plates such that centers of the apertures in the additional multi-aperture plate are shifted with respect the centers of the corresponding apertures of the first and second multi-aperture plates in order to achieve a compensation for the misalignment as described above.

Figure 17:
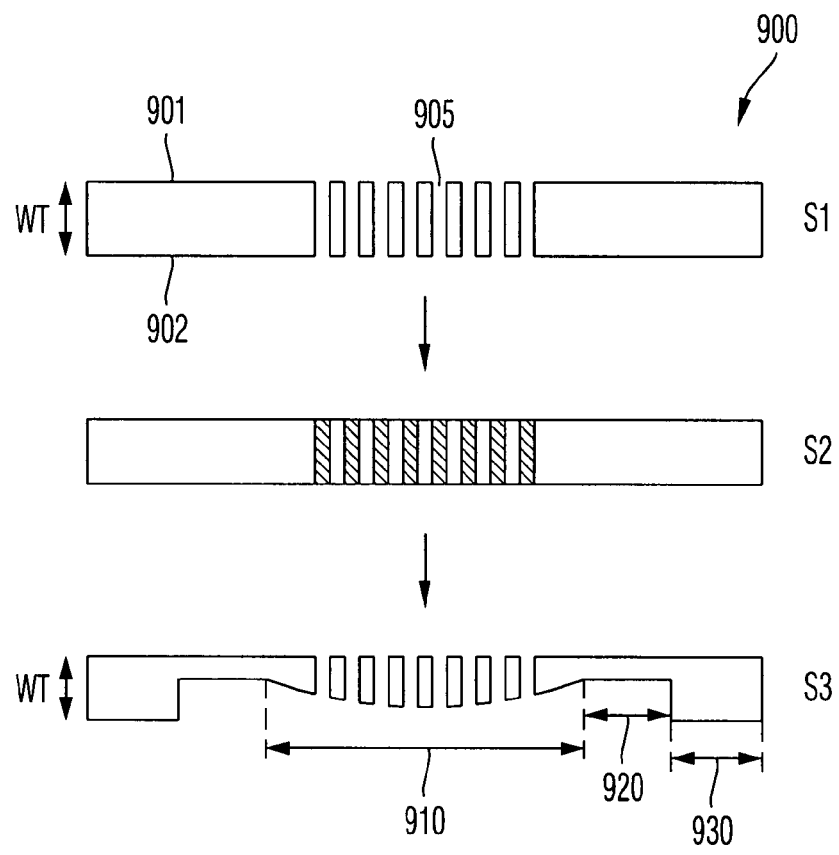
FIG. 17 illustrates an embodiment of the method of manufacturing a shaped multi-aperture plate according to the 15th aspect of the present invention.

In FIG. 17, an embodiment of the method of manufacturing a shaped multi-aperture arrangement according to the 15th aspect of the present invention is illustrated. In a first step S1, apertures 905 are etched into a silicon wafer 900 having a wafer thickness WT. Etching of apertures into silicon wafers is well known in the art of silicon technology. The formation of the apertures 905 may be, for instance, carried out by providing a single crystal silicon wafer 900 having a thin film of silicon oxide formed on top of a silicon surface, a thin metal layer on a silicon oxide surface and a thin layer of photoresist on a metal layer surface disposed on at least one side of the silicon wafer. A desired pattern is generated in the photoresist in a suitable manner by exposure to radiation such that a pattern of exposed photoresist portions is formed. The exposed photoresist portions are removed (or, alternatively, the unexposed part of the photoresist removed would form a negative pattern), and subsequently the underlying, exposed metal layer removed by a suitable etching process. The pattern formed in the photoresist is thus replicated in the metal layer. Apertures 905 are then etched into the silicon wafer 900 by a suitable etching process, such as etching of the silicon oxide and the silicon by deep reactive ion etching, which method is advantageous in that it is suited to achieve high aspect ratio apertures through the entire thickness WT of the wafer. Once the apertures 905 extend through the entire thickness of the wafer WT and are accessible from both sides 901, 902 of the wafer, the apertures are filled with a suitable filler in a second step S2 of the embodiment of the method, such as a suitable glue or resin. In a third step S3, a side (or surface) 902 of the wafer 900 is turned on a lathe and polished using a suitable polishing agent or abrasive, respectively, such as diamond, until a curved surface shape results in a region 910, which region 910 comprises all of the apertures 905. Such turning and polishing is well known from the manufacture of conventional optical lens elements made from glass, fused silica, calcium fluoride or the like. A region 920 adjacent to the shaped surface region 910, which in the case of a center-symmetrical pattern would form a frame around the shaped surface region 910, is processed such that it is substantially flat. A rim 930 on the silicon wafer is left out from the turning and polishing step S3 and thus has substantially the original wafer thickness WT. This rim 930 can be advantageously used to provide bonding surfaces for the purpose of bonding two multi-aperture plates together, for instance by application of a suitable insulating material and subsequent bonding.

Figure 18:
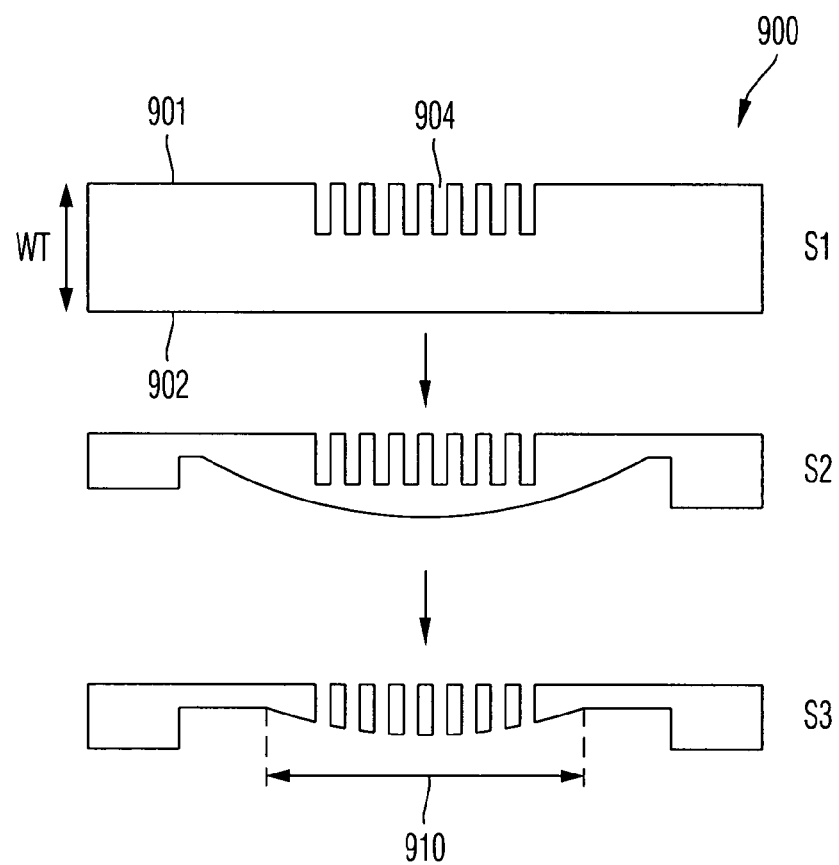
FIG. 18 illustrates an embodiment of the method of manufacturing a shaped multi-aperture plate according to the 13th aspect of the present invention.

In the embodiment of the method of manufacturing a multi-aperture plate having a shaped surface according to the 13th aspect of the present invention, in a first step S1, a pattern of holes 904 is etched into a silicon wafer 900 from a front side 901 thereof, as illustrated in FIG. 18. In contrast to the embodiment shown in FIG. 17, the holes 904 do not extend through the entire wafer thickness WT, but only reach to a depth corresponding to about half the wafer thickness WT, in this particular embodiment. In other embodiments, the holes may extend to a different depth, as long as the holes do not extend through the entire wafer thickness WT. The etching of the holes 904 can be effected by the same methods as the etching of the apertures 905 in the above described embodiment of FIG. 17. In a second step S2, the wafer is processed on its other side 902, i.e. a back side 902 of the silicon wafer 900 opposite the front side 901. In analogy to the method described above, the silicon wafer is diamond-turned, i.e. turned using diamond material as an abrasive, and polished until enough material is removed from the backside 902 of the silicon wafer 900 to give the back side a curved shape. The turning and polishing is carried out such that a surface of the back side 902 of the silicon wafer 900 has a curved area 910 around a center of the aperture pattern. Finally, the back side 902 is etched in a third step S3 in order to open up the holes 904 from the back side 902 and thus form apertures 905 that extend through the entire thickness of the wafer 900. Isotropic etching substantially removes the same amount of material from any location on the backside of the wafer and thus substantially maintains a shape provided by the turning and polishing step. This etching can be achieved by a physical etching method, such as plasma etching. Thus, a multi-aperture plate is formed. The shape of the curved surface can be readily chosen within a fairly wide range by an appropriate setting of the utilized turning and polishing tools and choice of etchant or etching method. In a different embodiment, an etching step could be adjusted to alter the shape given by the turning and polishing step in a desired manner, using a suitable etchant.

Figure 19:
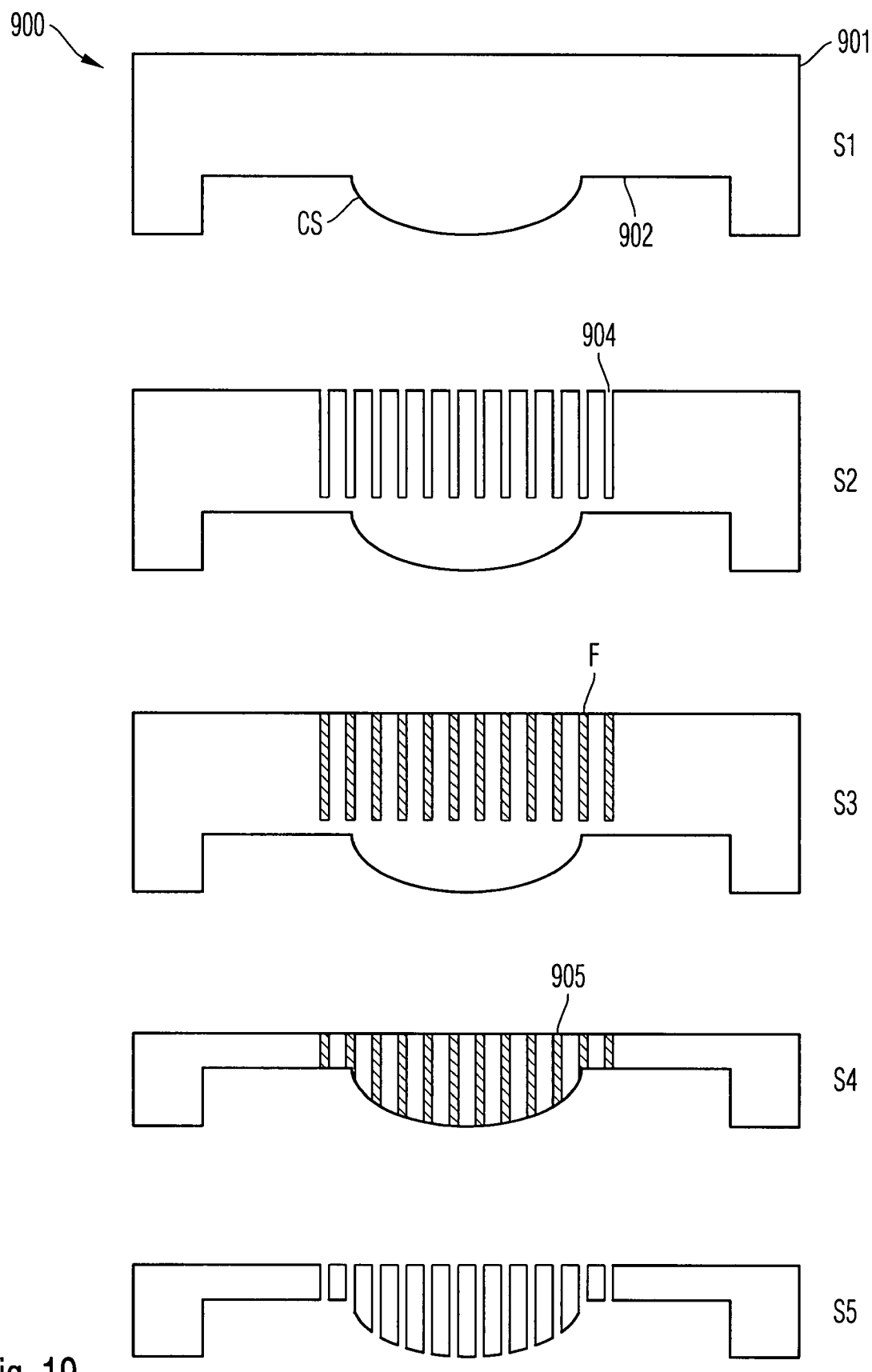
FIG. 19 illustrates an alternative embodiment of the method of manufacturing a shaped multi-aperture plate according to the 13th aspect of the present invention.
Figure 20:
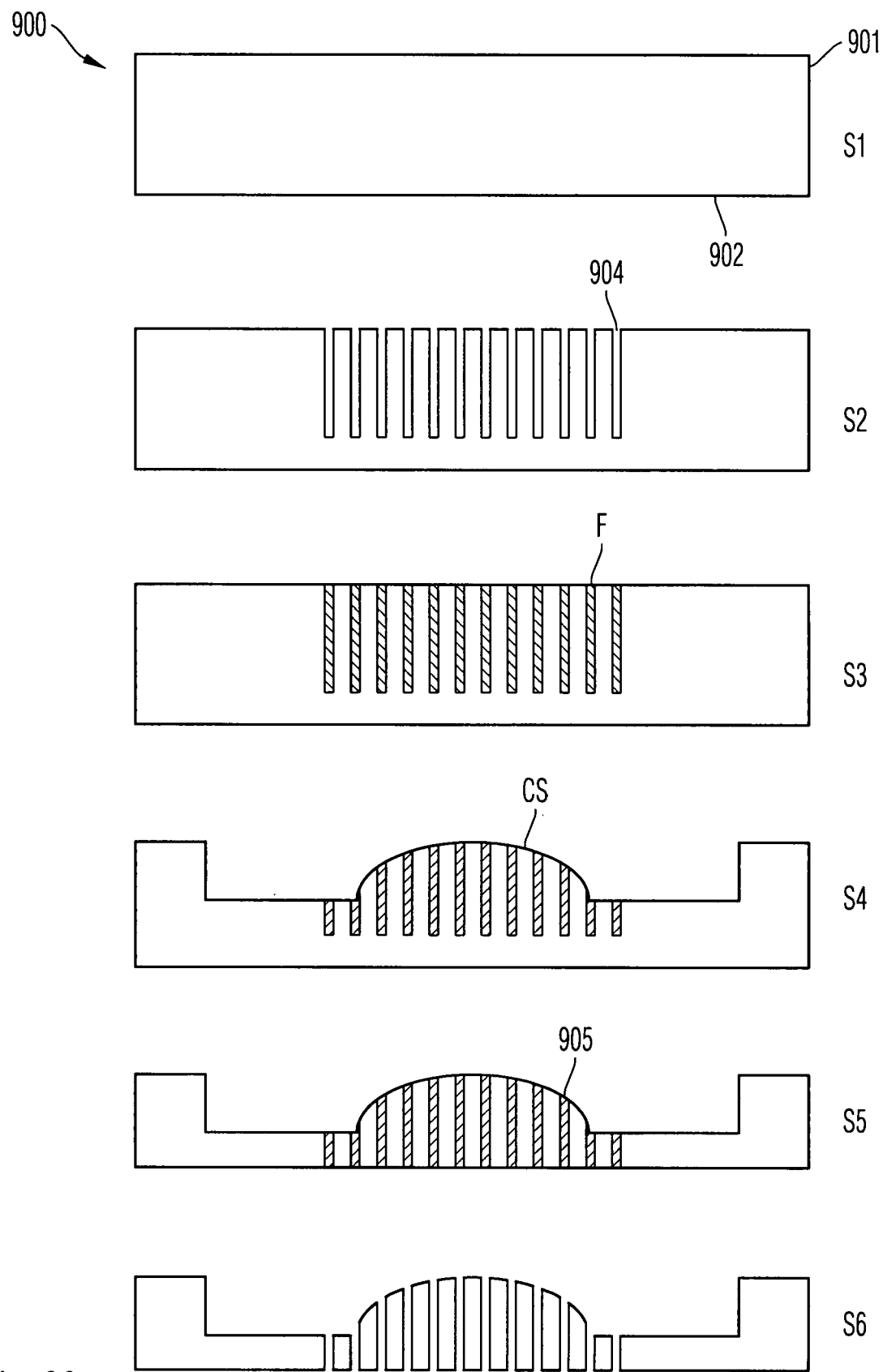
FIG. 20 illustrates an embodiment of the method of manufacturing a shaped multi-aperture plate according to the 14th aspect of the present invention.

In FIG. 19, a further embodiment of the method of manufacturing a multi-aperture plate according to the 13th aspect of the present invention is illustrated, with the steps of producing a curved surface on one side and etching holes into the other side being reversed as compared to the embodiment shown in FIG. 18. Thus, in a first step, a back surface of the silicon, wafer 900 is turned on a lathe using diamond material for polishing and removing material such that the back surface 902 of the silicon wafer 900 has a curved surface CS at least in a predetermined area. In a second step S2, a number of holes 904 is etched into the other side, i.e. the front surface 901 of the silicon wafer 900. In a third step, holes 904, which do not extend through the entire thickness of the wafer and therefore are only open to the front surface 901, are filled with a suitable filling material f. In a fourth step S4, the back side 902 including the curved surface CS is etched by plasma etching such that enough material is removed therefrom to expose the holes 904 and form apertures 905 which are open to both the front and the back surfaces 901, 902, whilst the curvature of the curved shape CS of the back surface 902 is maintained, in the same or similar manner described in connection with FIG. 18. In a fifth step S5, the filler material F is removed from the apertures 905.

In an embodiment of the method of manufacturing a multi-aperture plate according to the 14th aspect of the present invention, a silicon wafer 900 having a front surface 901 and a back surface 902 is provided in a first step S1. In a second step S2, holes 904 are etched into the front surface 801 of the silicon wafer 900. In a subsequent third step S3, the front surface 901 is processed such that a curved surface CS, which is at least partially positioned in an area where holes 904 are located, is generated. In a fourth step S4, the back surface 902 of the silicon wafer 900 is processed by polishing or turning or etching such that holes 904 are opened up on the back surface 902 to form apertures 905. In a final sixth step S6, the filler material F is removed from the apertures 905. Etching and processing steps and filler material are as described above in the other embodiments.

While the invention has been described also with respect to certain specific embodiments thereof, it is evident that many alternatives, modifications and variations will be apparent to those skilled in the art. Accordingly, the preferred embodiments of the invention set forth herein are intended to be illustrative and not limiting in any way. Various changes may be made without departing from the spirit and scope of the present invention as defined in the following claims.

What is claimed is:

1. A charged particle multi-beam system comprising:
   a charged particle source configured to generate at least one beam of charged particles;
   a stage configured to hold a flat substrate to be inspected; and
   a particle-optical component disposed in a beam path of the at least one beam of charged particles downstream of the charged particle source, the particle-optical component comprising:
   a first multi-aperture plate having a plurality of apertures and a second multi-aperture plate having a plurality of apertures, wherein the second multi-aperture plate is spaced apart from the first multi-aperture plate such that a gap is formed therebetween;
   wherein the plurality of apertures of the first multi-aperture plate is arranged such that each aperture of the plurality of apertures of the first multi-aperture plate is aligned with a corresponding aperture of the plurality of apertures of the second multi-aperture plate; and
   wherein a first width of the gap at a location of a first aperture of the plurality of apertures of the first multi-aperture plate is by at least 5% greater than a second width of the gap at a location of a second aperture of the plurality of apertures of the first multi-aperture plate;
   wherein the system further comprises:
   a voltage supply system configured to apply different electric potentials to the first and second multi-aperture plates of the particle-optical component; and
   at least one focusing particle-optical lens disposed in the beam path of the at least one charged particle beam downstream of the particle-optical component and configured to focus charged particle beamlets having traversed the particle-optical component onto the flat substrate.

2. The system according to claim 1, wherein the first multi-aperture plate has a first surface facing towards the second multi-aperture plate, and the second multi-aperture plate has a first surface facing towards the first multi-aperture plate, wherein each first surface has an area comprising plural apertures of the respective plurality of apertures, and wherein at least one of the first surfaces is a planar surface within the area.

3. The system according to claim 2, wherein the at least one first surface is a curved surface within the area.

4. The system according to claim 2, wherein the at least one first surface is a convex surface within the area.

5. The system according to claim 2, wherein the at least one first surface is a concave surface within the area.

6. The system according to claim 1, wherein the first multi-aperture plate has a first surface facing towards the second multi-aperture plate, and the second multi-aperture plate has a first surface facing towards the first multi-aperture plate, and wherein shapes of the first surfaces are symmetric with respect to each other relative to a plane extending between the first and second multi-aperture plates.

7. The system according to claim 1, wherein the first multi-aperture plate has a first surface facing towards the second multi-aperture plate, and the second multi-aperture plate has a first surface facing towards the first multi-aperture plate, and wherein a shape of at least one of the first surfaces is symmetric relative to an axis extending transversely to the first and second multi-aperture plates.

8. The system according to claim 1, wherein the second width is in a range of from about 100% to about 1000% of a diameter of the second aperture.

9. The system according to claim 1, wherein the first width is in a range of from about 150% to about 1500% of a diameter of the first aperture.

10. The system according to claim 1, wherein, for substantially each aperture of the plurality of apertures of the first multi-aperture plate, a diameter of the aperture of the plurality of apertures of the first multi-aperture plate is substantially equal to a diameter of a corresponding aperture of the plurality of apertures of the second multi-aperture plate aligned with the aperture of the first multi-aperture plate.

11. The system according to claim 1, wherein a diameter of the apertures of the pluralities of apertures is in a range of from about 0.5 μm to about 180 μm.

12. The system according to claim 1, wherein a distance between centers of adjacent apertures of the plurality of apertures of the first multi-aperture plate is in a range from about 5 μm to about 200 μm.

13. The system according to claim 1, wherein at least one of the first and second multi-aperture plates is made of silicon.

14. The system according to claim 1, further comprising a mounting structure mounting the first multi-aperture plate relative to the second multi-aperture plate.

15. The system according to claim 14, wherein the mounting structure comprises at least one actuator for adjusting a position of the first multi-aperture plate relative to the second multi-aperture plate.

16. The system according to claim 1, further comprising a third multi-aperture plate having a plurality of apertures and arranged such that the first multi-aperture plate is disposed between the third multi-aperture plate and the second multi-aperture plate, and wherein the plurality of apertures of the third multi-aperture plate is arranged such that each aperture of the plurality of apertures of the third multi-aperture plate is aligned with a corresponding aperture of the plurality of apertures of the first multi-aperture plate.

17. The system according to claim 16, wherein a diameter of an aperture of the third multi-aperture plate is smaller than a diameter of a corresponding aperture of the first multi-aperture plate aligned with the aperture of the third multi-aperture plate.

18. The system according to claim 16, wherein a diameter of an aperture of the third multi-aperture plate is 99% or less of a diameter of a corresponding aperture of the first multi-aperture plate aligned with the aperture of the third multi-aperture plate.

19. The system according to claim 16, further comprising a mounting structure mounting the third multi-aperture plate relative to the first multi-aperture plate.

20. The system according to claim 19, wherein the mounting structure comprises at least one actuator for adjusting a position of the third multi-aperture plate relative to the first multi-aperture plate.

21. The system according to claim 1, wherein the charged particle source is an electron source and the at least one beam of charged particles is at least on beam of electrons.

22. The system according to claim 1, wherein the electric potentials are in a range from 0 to 5000V.

23. The system according to claim 1, further comprising a detector arrangement for detecting at least one of secondary particles and radiation emitted by the specimen as a result of being exposed to the charged particles.

24. The system according to claim 1, wherein the voltage supply system configured to apply the different electric potentials in order to compensate at least one particle-optical aberration of the at least one focusing particle-optical lens.

25. A particle-optical component for manipulating a plurality of beamlets of charged particles, the particle-optical component comprising:
a first multi-aperture plate having a plurality of apertures and a second multi-aperture plate having a plurality of apertures, wherein the second multi-aperture plate is spaced apart from the first multi-aperture plate such that a gap is formed therebetween;
wherein the plurality of apertures of the first multi-aperture plate is arranged such that each aperture of the plurality of apertures of the first multi-aperture plate is aligned with a corresponding aperture of the plurality of apertures of the second multi-aperture plate; and
wherein a first width of the gap at a location of a first aperture of the plurality of apertures of the first multi-aperture plate is by at least 5 greater than a second width of the gap at a location of a second aperture of the plurality of apertures of the first multi-aperture plate;
the particle-optical component further comprising a fourth aperture plate having at least one aperture, the first multi-aperture plate being disposed between the fourth aperture plate and the second multi-aperture plate, and further comprising a mounting structure comprising at least one actuator for displacing the fourth aperture plate relative to the first multi-aperture plate such that in a first position one aperture of the at least one aperture of the fourth aperture plate is in alignment with a first aperture of the first multi-aperture plate and in a second position different from the first position the one aperture is in alignment with a second aperture of the first multi-aperture plate.

26. A method of operating a particle-optical system, comprising:
positioning a testing aperture plate having at least one aperture in a first position relative to a multi-aperture component comprising a plurality of apertures such that in the first position, a first set of apertures of the testing aperture plate is in alignment with a first set of apertures of the multi-aperture component, with the respective sets of apertures comprising at least one aperture each;
transmitting a set of beamlets of charged particles through the first set of apertures of the testing aperture plate and the first set of apertures of the multi-aperture component aligned therewith;
determining at least one of positions, shapes and dimensions of the transmitted beamlets in a predetermined plane and a total intensity or individual intensities of the transmitted beamlets;
positioning the testing aperture plate in a second position relative to the multi-aperture component such that the first set of apertures of the testing aperture plate is in alignment with a second set of apertures of the multi-aperture component;
transmitting a set of beamlets of charged particles through the first set of apertures of the testing aperture plate and the second set of apertures of the multi-aperture component aligned therewith; and
determining at least one of positions, shapes and dimensions of the transmitted beamlets in the predetermined plane and a total intensity or individual intensities of the transmitted beamlets.

27. The method according to claim 26, further comprising at least one of adjusting at least one of an optical property and a position of the multi-aperture component and adjusting an optical property of the particle-optical system, based an the at least one of positions, shapes and dimensions of the transmitted beamlets in the predetermined plane and the total intensity or individual intensities of the transmitted beamlets.

28. A particle-optical arrangement, comprising:
a charged particle source for generating at least one beam of charged particles; and
at least one particle-optical component comprising:
a first multi-aperture plate having a plurality of apertures and a second multi-aperture plate having a plurality of apertures, wherein the second multi-aperture plate is spaced apart from the first multi-aperture plate such that a gap is formed therebetween;

wherein the plurality of apertures of the first multi-aperture plate is arranged such that each aperture of the plurality of apertures of the first multi-aperture plate is aligned with a corresponding aperture of the plurality of apertures of the second multi-aperture plate;

wherein a first width of the gap at a location of a first aperture of the plurality of apertures of the first multi-aperture plate is by at least 5 greater than a second width of the gap at a location of a second aperture of the plurality of apertures of the first multi-aperture plate;

wherein the at least one particle-optical component is arranged such that the second multi-aperture plate is traversed by a beam path of the charged particles downstream of the first multi-aperture plate; and wherein the particle-optical arrangement further comprises a first electrode traversed by the beam path of the charged particles upstream of the first multi-aperture plate;

a second electrode traversed by the beam path of the charged particles downstream of the second multi-aperture plate; and a voltage supply system configured to apply different electric potentials to the first and second multi-aperture plates and the first and second electrodes.

29. The particle-optical arrangement according to claim 28, further comprising a voltage supply system configured to apply different electric potentials to the first and second multi-aperture plates.

30. The particle-optical arrangement according to claim 29, further comprising a controller having a first control portion configured to control the voltage supply system based upon a total beam current of a plurality of charged particle beamlets downstream of the particle-optical component.

31. The particle-optical arrangement according to claim 30, further comprising a current detector for detecting the total beam current of the plurality of charged particle beamlets.

32. The particle-optical arrangement according to claim 30, wherein the controller has a second control portion for adjusting beam currents of the plurality of charged particle beamlets, and wherein the first control portion is responsive to a setting of the second control portion.

33. The particle-optical arrangement according to claim 28, wherein the voltage supply system is configured to apply voltages to the first electrode and the first multi-aperture plate such that an electrical field generated upstream of the first multi-aperture plate in a vicinity thereof is a decelerating field for the charged particles of the beam of charged particles.

34. The particle-optical arrangement according to claim 28, wherein the voltage supply system is configured to apply voltages to the first electrode and the first multi-aperture plate such that an electrical field generated upstream of the first multi-aperture plate in a vicinity thereof is an accelerating field for the charged particles of the beam of charged particles.

35. The particle-optical arrangement according to claim 28, wherein the voltage supply system is configured to apply voltages to the second electrode and the second multi-aperture plate such that an electrical field generated downstream of the second multi-aperture plate in a vicinity thereof is an accelerating field for the charged particles of the beam of charged particles.

36. The particle-optical arrangement according to claim 28, wherein the voltage supply system is configured to apply voltages to the second electrode and the second multi-aperture plate such that an electrical field generated downstream of the second multi-aperture plate in a vicinity thereof is a decelerating field for the charged particles of the beam of charged particles.

37. The particle-optical arrangement according to claim 28, further comprising a third electrode traversed by the beam path of the charged particles between the first electrode and the first multi-aperture plate, wherein the voltage supply system is further configured to apply an electric potential to the third electrode.

38. The particle-optical arrangement according to claim 28, further comprising a fourth electrode traversed by the beam path of the charged particles between the second multi-aperture plate and the second electrode, wherein the voltage supply system is further configured to apply an electric potential to the fourth electrode.

39. The particle-optical arrangement according to claim 28, further comprising at least one focusing particle-optical lens disposed in the beam path of the charged particle beam.

40. The particle-optical arrangement according to claim 39, further comprising a voltage supply system configured to apply different electric potentials to the first and second multi-aperture plates, for compensating at least one particle-optical aberration of the at least one focusing particle-optical lens.

41. The particle-optical arrangement according to claim 40, wherein the at least one particle-optical aberration is at least one of a field curvature and a spherical aberration.

42. The particle-optical arrangement according to claim 28, wherein the voltage supply system is configured to apply electric potentials to the first and second electrodes such that a first electrical field is generated upstream of the first multi-aperture plate and a second electrical field different from the first electrical field is generated downstream of the second multi-aperture plate;

further comprising at least one focusing particle-optical lens disposed downstream of the second multi-aperture plate in the beam path of the charged particles;

wherein the voltage supply system is further configured to apply different electric potentials to the first and second multi-aperture plates, for compensating at least one particle-optical aberration of the at least one focusing particle-optical lens.

43. A method of manipulating charged particle beamlets, the method comprising:

applying a predetermined first electric potential to a first multi-aperture plate and a predetermined second electric potential different from the predetermined first potential to a second multi-aperture plate;

transmitting a plurality of charged particle beamlets through apertures of a first multi-aperture plate having a plurality of apertures and, subsequently, through a second multi-aperture plate having a plurality of apertures, and transmitting the plurality of charged-particle beamlets through at least one focusing particle-optical lens;

wherein the second multi-aperture plate is spaced apart from the first multi-aperture plate such that a gap is formed therebetween;

wherein the plurality of apertures of the first multi-aperture plate is arranged such that each aperture of the plurality of apertures of the first multi-aperture plate is aligned with a corresponding aperture of the plurality of apertures of the second multi-aperture plate;

wherein a first width of the gap at a location of a first aperture of the plurality of apertures of the first multi-aperture plate is by at least 5% greater than a second width of the gap at a location of a second aperture of the plurality of apertures of the first multi-aperture plate; and wherein the applied predetermined electric potentials are chosen such that at least one particle-optical aberration of the at least one focusing particle-optical lens is compensated.

44. The method according to claim 43, wherein the predetermined electric potentials are in a range of from 0 to about 5000 V.

45. A particle-optical arrangement, comprising:
a charged particle source for generating at least one beam of charged particles; at least one magnetic lens configured to generate a first magnetic field in a path of the at least one beam;
at least a first multi-aperture plate having a plurality of apertures, wherein the at least first multi-aperture plate is disposed to be traversed by a beam path of the at least one beam of charged particles;
at least one coil arrangement configured to generate a second magnetic field such that a magnetic flux density at the at least first multi-aperture plate is substantially zero.

46. A particle-optical arrangement according to claim 45, further comprising a second multi-aperture plate having a plurality of apertures, wherein the second multi-aperture plate is spaced apart from the first multi-aperture plate such that a gap is formed therebetween;
wherein the plurality of apertures of the first multi-aperture plate is arranged such that each aperture of the first multi-aperture plate is aligned with a corresponding aperture of the plurality of the apertures of the second multi-aperture plate;
wherein a first width of the gap at a location of a first aperture of the plurality of apertures of the first multi-aperture plate is by at least 5% greater than a second width of the gap at a location of a second aperture of the plurality of apertures of the first multi-aperture plate.

47. The particle-optical arrangement according to claim 46, wherein the first multi-aperture plate has a first surface facing towards the second multi-aperture plate, and the second multi-aperture plate has a first surface facing towards the first multi-aperture plate, wherein each first surface has an area comprising plural apertures of the respective plurality of apertures, and wherein at least one of the first surfaces is a curved surface within the area.

48. A method of manipulating charged particle beamlets, the method comprising:
generating at least one of a charged-particle beam and a plurality of charged-particle beamlets;
transmitting the at least one of the charged-particle beam and the plurality of charged-particle beamlets through at least one magnetic lens generating a first magnetic field;
transmitting the at least one of the charged-particle beam and the plurality of charged-particle beamlets through at least one multi-aperture plate having a plurality of apertures; and
generating a second magnetic field by applying a predetermined electric current to a coil arrangement traversed by the plurality of charged particle beamlets such that the second magnetic field at least partially compensates the first magnetic field and a magnetic flux density at the at least one multi-aperture plate is substantially zero.

49. A method of focusing a plurality of charged particle beamlets, the method comprising:
transmitting at least one of a charged particle beam and a plurality of charged-particle beamlets through a first multi-aperture plate and a second multi-aperture plate, each having a plurality of apertures, with centers of the first and second multi-aperture plates being spaced a distance w0 apart,
applying a first electric potential U1 to the first multi-aperture plate,
applying a second electric potential U2 to the second multi-aperture plate, the second electric potential being different from the first electric potential;
at least one of generating an electrical field traversed by the beam path upstream of the first multi-aperture plate and an electrical field traversed by the beam path downstream of the second multi-aperture plate, such that a first field strength E1 of an electrical field upstream and in the vicinity of the first multi-aperture plate differs from a second field strength E2 of an electrical field downstream and in the vicinity of the second multi-aperture plate by at least about 200 V/mm,
wherein for charged particles having a charge q and having and a kinetic energy Ekin upon traversing the first multi-aperture plate, the following relationship is fulfilled:

$$0.0001 \leq \frac{3}{4} \cdot \frac{q}{w_0 \cdot E_{kin}} \frac{(U_1 - U_2)^2}{E_1 - E_2} \leq 0.2.$$

50. The method according to claim 49, wherein a distance between the first and second multi-aperture plates increases with increasing distance from the center thereof such that a field strength of an electrical field generated by applying the first and second electrical potentials U1 and U2 in between the first and second multi-aperture plates decreases with increasing distance from the center.

51. A particle-optical arrangement, comprising
a first multi-aperture plate having a plurality of apertures and a second multi-aperture plate having a plurality of apertures, wherein the second multi-aperture plate is spaced apart from the first multi-aperture plate such that a gap is formed therebetween; and
a magnetic lens arrangement comprising a first pole piece and a second pole piece and a coil for inducing magnetic flux in the first and second pole pieces;
wherein the first multi-aperture plate is magnetically coupled to or integrally formed with the first pole piece of the magnetic lens arrangement and the second multi-aperture plate is magnetically coupled to or integrally formed with the second pole piece of the magnetic lens arrangement;
wherein the plurality of apertures of the first multi-aperture plate is arranged such that each aperture of the plurality of apertures of the first multi-aperture plate is aligned with a corresponding aperture of the plurality of apertures of the second multi-aperture plate; and
wherein a first width of the gap at a location of a first aperture of the plurality of apertures of the first multi-aperture plate is by at least 5 greater than a second width of the gap at a location of a second aperture of the plurality of apertures of the first multi-aperture plate.

52. A method of focusing a plurality of charged particle beamlets, the method comprising:
generating an electrical field of at most 5000 V/mm between a first multi-aperture plate having a plurality of apertures and a first electrode such that the first multi-aperture plate has a first focusing power F1, wherein the first electrode is spaced a distance of at least 1 mm apart from the first multi-aperture plate;

transmitting at least one of a charged particle beam and a plurality of charged-particle beamlets through the electrical field, the plurality of apertures of the first multi-aperture plate and the first electrode;

transmitting the at least one of the charged particle beam and the plurality of charged-particle beamlets through apertures of a particle-optical component comprising at least a second multi-aperture plate having a plurality of apertures, the particle-optical component being configured and operated so as to provide a second focusing power F2, wherein the second focusing power F2 of the particle-optical component is at least five times smaller than the first focusing power F1.

53. A particle-optical component, comprising a first multi-aperture plate having a plurality of apertures,
a second multi-aperture plate having a plurality of apertures,
a fourth aperture plate having at least one aperture,
a mounting structure comprising at least one actuator for displacing the fourth aperture plate relative to the first multi-aperture plate to a first position and to a second position, which is different from the first position,
wherein the second multi-aperture plate is spaced apart from the first multi-aperture plate such that a gap is formed therebetween;
wherein the plurality of apertures of the first multi-aperture plate is arranged such that each aperture of the plurality of apertures of the first multi-aperture plate is aligned with a corresponding aperture of the plurality of apertures of the second multi-aperture plate; and
wherein the first multi-aperture plate is disposed between the fourth aperture plate and the second multi-aperture plate.

54. The particle-optical component according to claim 53, wherein one aperture of the at least one aperture of the fourth aperture plate is in alignment with a first aperture of the first multi-aperture plate in the first position and the one aperture is in alignment with a second aperture of the first multi-aperture plate in the second position.

55. A particle-optical component, comprising
a first multi-aperture plate having a plurality of apertures;
a third multi-aperture plate having a plurality of apertures,
wherein the plurality of apertures of the third multi-aperture plate is arranged such that each aperture of the plurality of apertures of the third multi-aperture plate is aligned with a corresponding aperture of the plurality of apertures of the first multi-aperture plate, and wherein a diameter of an aperture of the third multi-aperture plate is smaller than a diameter of a corresponding aperture of the first multi-aperture plate aligned with the aperture of the third multi-aperture plate; and
a voltage supply system configured to apply different electric potentials to the first and third multi-aperture plates of the particle-optical component.

56. The particle-optical component according to claim 55, further comprising a second multi-aperture plate having a plurality of apertures, wherein the second multi-aperture plate is spaced apart from the first multi-aperture plate such that a gap is formed therebetween; wherein the plurality of apertures of the first multi-aperture plate is arranged such that each aperture of the plurality of apertures of the first multi-aperture plate is aligned with a corresponding aperture of the plurality of apertures of the second multi-aperture plate; and wherein the third multi aperture plate is arranged such that the first multi-aperture plate is disposed between the third multi-aperture plate and the second multi-aperture plate.

57. The particle-optical component according to claim 55, wherein a diameter of an aperture of the third multi-aperture plate is less than 99% of a diameter of a corresponding aperture of the first multi-aperture plate aligned with the aperture of the third multi-aperture plate.

* * * * *